(12) United States Patent
Ohmaru

(10) Patent No.: US 9,202,567 B2
(45) Date of Patent: Dec. 1, 2015

(54) MEMORY CIRCUIT

(71) Applicant: Semiconductor Energy Laboratory Co., Ltd., Atsugi, Kanagawa-ken (JP)

(72) Inventor: Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/318,841

(22) Filed: Jun. 30, 2014

(65) Prior Publication Data

US 2014/0313827 A1    Oct. 23, 2014

Related U.S. Application Data

(63) Continuation of application No. 13/356,749, filed on Jan. 24, 2012, now Pat. No. 8,773,906.

(30) Foreign Application Priority Data

Jan. 27, 2011 (JP) ................................ 2011-015595
May 14, 2011 (JP) ................................ 2011-108902

(51) Int. Cl.
*G11C 14/00* (2006.01)
*H01L 21/8258* (2006.01)
(Continued)

(52) U.S. Cl.
CPC .............. *G11C 14/0018* (2013.01); *G11C 5/14* (2013.01); *G11C 14/00* (2013.01);
(Continued)

(58) Field of Classification Search
CPC ........ G11C 14/00; G11C 11/34; G11C 11/41; G11C 5/14; H01L 29/788; H01L 29/792

USPC .................. 365/185.08, 184, 149, 154, 63, 72
See application file for complete search history.

(56) References Cited

U.S. PATENT DOCUMENTS 5,218,607 A    6/1993    Saito et al.
5,731,856 A    3/1998    Kim et al.
(Continued)

FOREIGN PATENT DOCUMENTS

EP    0404061 A    12/1990
EP    1737044 A    12/2006
(Continued)

OTHER PUBLICATIONS

Kamiya. T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Toan Le
(74) *Attorney, Agent, or Firm* — Fish & Richardson P.C.

(57) ABSTRACT

The present invention provides a memory circuit in which, while the power is not supplied, a data signal that has been held in a memory section corresponding to a volatile memory can be held in a capacitor in a memory section corresponding to a nonvolatile memory. In the nonvolatile memory section, a transistor whose channel is formed in an oxide semiconductor layer allows a signal to be held in the capacitor for a long period. Thus, the memory circuit can hold a logic state (data signal) even while the power supply is stopped. A potential applied to a gate of the transistor whose channel is formed in an oxide semiconductor layer is raised by a booster circuit provided between a wiring for carrying power supply potential and the gate of the transistor, allowing a data signal to be held even by one power supply potential without malfunction.

16 Claims, 32 Drawing Sheets

(51) Int. Cl.
*H01L 27/06* (2006.01)
*H01L 27/115* (2006.01)
*H01L 27/12* (2006.01)
*G11C 5/14* (2006.01)
*G11C 11/34* (2006.01)
*G11C 11/41* (2006.01)
*H01L 29/788* (2006.01)
*H01L 29/792* (2006.01)

(52) U.S. Cl.
CPC ....... *G11C 14/0063* (2013.01); *H01L 21/8258* (2013.01); *H01L 27/0688* (2013.01); *H01L 27/1156* (2013.01); *H01L 27/1207* (2013.01); *G11C 11/34* (2013.01); *G11C 11/41* (2013.01); *H01L 29/788* (2013.01); *H01L 29/792* (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,004,481 B2 | 8/2011 | Yamazaki et al. |
| 8,154,024 B2 | 4/2012 | Iwasaki |
| 8,559,220 B2 | 10/2013 | Yamazaki et al. |
| 8,773,906 B2 * | 7/2014 | Ohmaru ............... 365/185.08 |
| 8,872,745 B2 | 10/2014 | Umezaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0019460 A1 | 1/2007 | Kang et al. |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0175096 A1 | 7/2009 | Kitazaki et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0156024 A1 | 6/2011 | Koyama et al. |
| 2011/0176348 A1 | 7/2011 | Yamazaki et al. |
| 2011/0176357 A1 | 7/2011 | Koyama et al. |
| 2012/0170355 A1 | 7/2012 | Ohmaru et al. |
| 2012/0182788 A1 | 7/2012 | Kurokawa |
| 2015/0062112 A1 | 3/2015 | Umezaki et al. |

FOREIGN PATENT DOCUMENTS

| | | |
|---|---|---|
| EP | 2226847 A | 9/2010 |
| EP | 2339639 A | 6/2011 |
| EP | 2816607 A | 12/2014 |
| JP | 58-205226 A | 11/1983 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-027419 A | 2/1991 |
| JP | 05-110392 A | 4/1993 |
| JP | 05-251705 A | 9/1993 |
| JP | 08-264794 A | 10/1996 |
| JP | 10-078836 A | 3/1998 |
| JP | 10-334671 A | 12/1998 |
| JP | 11-505377 | 5/1999 |
| JP | 2000-044236 A | 2/2000 |

(56) References Cited

FOREIGN PATENT DOCUMENTS

| | | | |
|---|---|---|---|
| JP | 2000-077982 A | 3/2000 | |
| JP | 2000-150900 A | 5/2000 | |
| JP | 2001-053164 A | 2/2001 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-050208 A | 2/2006 | |
| JP | 2007-096055 A | 4/2007 | |
| JP | 2007-103918 A | 4/2007 | |
| JP | 2007-123861 A | 5/2007 | |
| JP | 2007-125823 A | 5/2007 | |
| JP | 2010-267705 A | 11/2010 | |
| JP | 2011-004393 A | 1/2011 | |
| WO | WO-2004/114391 | 12/2004 | |
| WO | WO-2007/029844 | 3/2007 | |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
Asakuma.N et al., "Crystallization and Reduction of Sol-Gel-Derived Zinc Oxide Films by Irradiation With Ultraviolent Lamp", Journal of Sol-Gel Science and Technology, 2003, vol. 26, pp. 181-184.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A. (Physical Review. A) May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID 2007, vol. 15, No. 1, pp. 17-22.
Hosono.H et al., "Working hypothesis to explore novel wide band gap electrically conducting amorphous oxides and examples", Non-Cryst. Solids (Journal of Non-Crystalline Solids), 1996. vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 ; SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 ; SID International Symposium Digest of Technical Papers, May 20, 2008, Vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 ; SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214TH ECS Meeting, 2008, No. 2317, ECS.
Kimizuka.N et al., "SPINEL,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu, or Zn]at Temperatures over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m = 3, 4, and 5) InGaO3(ZnO)3, and Ga2O3(ZnO)m (m= 7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) GA AMLCD Panel Using IGZO Oxide TFT", SID Digest '08 : SID International Symposium Digest of Technical Papers, May 20, 2008, vol. 39, pp. 625-628.

(56) References Cited

OTHER PUBLICATIONS

Lee.M et al., "15.4:Excellent Performance of Indium—Oxide-Based Thin-Film Transistors by DC sputtering", SID Digest '09 ; SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6TH International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B) Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 ; SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 ; Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39. pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters) Jul. 31, 2000, vol. 85, No. 5, pp. 1012-1015.

\* cited by examiner

FIG. 23A  FIG. 23B
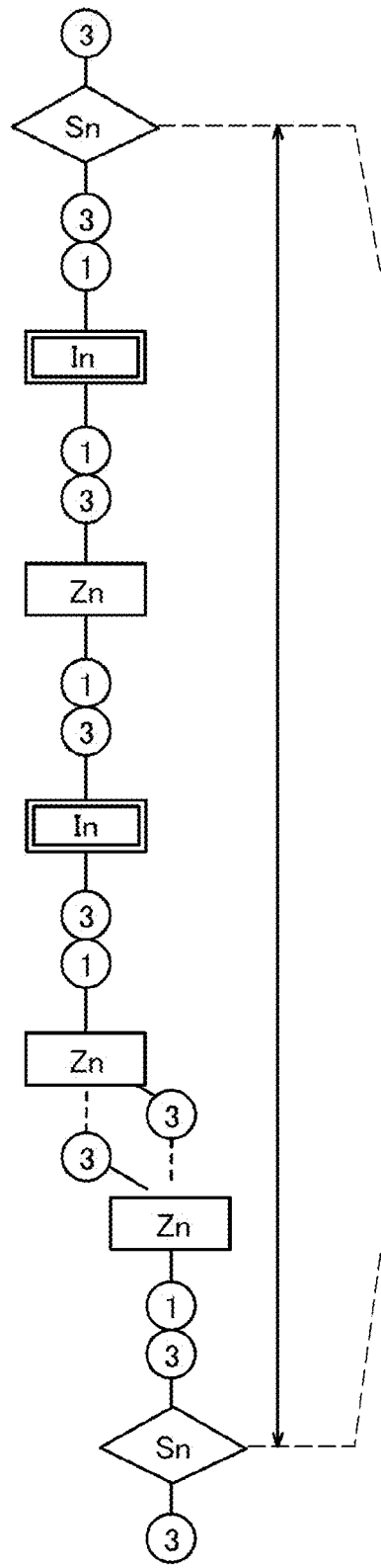
FIG. 23C
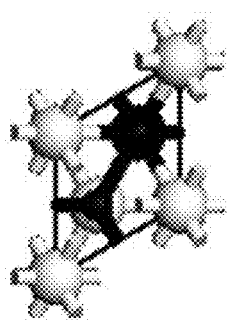
● In
☾ Sn
c Zn
• O

MEMORY CIRCUIT

CROSS-REFERENCE TO RELATED APPLICATIONS

This application is a continuation of U.S. application Ser. No. 13/356,749, filed Jan. 24, 2012, now allowed, which claims the benefit of foreign priority applications filed in Japan as Serial No. 2011-015595 on Jan. 27, 2011 and Serial No. 2011-108902 on May 14, 2011, all of which are incorporated by reference.

BACKGROUND OF THE INVENTION

1. Field of the Invention

The present invention relates to a memory circuit in a signal processing unit, in which the logic state is not erased after the power is turned off 2. Description of the Related Art Signal processing units such as central processing units (CPUs) vary in structure depending on the intended use. A signal processing unit generally has a main memory for storing data or program and other memory circuits such as a register and a cache memory. A register has a function of temporarily holding a data signal for carrying out arithmetic processing, holding a program execution state, or the like. Meanwhile, a cache memory, which is located between an arithmetic unit and a main memory, is provided to reduce low-speed access to the main memory and speed up the arithmetic processing.

In a memory circuit in a signal processing unit, such as a register or a cache memory, input of a data signal needs to be performed at higher speed than in a main memory. For this reason, in general, a flip-flop or the like is used as a register, and a static random access memory (SRAM) or the like is used as a cache memory. In other words, a volatile memory in which a data signal is erased when supply of power is stopped is used for such a register, a cache memory, or the like.

In order to achieve low power consumption, a method in which the supply of power to a signal processing unit is temporarily stopped in a period during which input/output of data signal is not conducted has been suggested (see Patent Document 1, for example). In the method in Patent Document 1, a nonvolatile memory circuit is located in the periphery of a volatile memory circuit such as a register or a cache memory, and the data is temporarily stored in the nonvolatile memory circuit. Thus, the register, the cache memory, or the like hold a data signal even while the supply of power to the signal processing unit is stopped.

In the case where the supply of power to a signal processing unit is stopped for a long time, a data signal in a volatile memory circuit is transferred to an external memory circuit such as a hard disk or a flash memory before the supply of power, so that the data signal can be prevented from being lost.

REFERENCE

Patent Document

[Patent Document 1] Japanese Published Patent Application No. H10-078836

SUMMARY OF THE INVENTION

The method in which a data signal that has been held in a volatile memory circuit is held in a nonvolatile memory circuit located in the periphery of the volatile memory circuit while a supply of power to a signal processing unit is stopped involves a complicated process of manufacturing the signal processing unit because a magnetic element or a ferroelectric is used in the nonvolatile memory circuit in many cases.

With the method in which a data signal that has been held in the volatile memory circuit is held in the external memory circuit while a supply of power to a signal processing unit is stopped, it takes a long time for sending back the data signal from the external memory circuit to the volatile memory circuit. Therefore, backing up a data signal to the external memory circuit is not suitable for the case where the supply of power is stopped for a short time for the purpose of reducing power consumption.

In view of the above-described problems, it is an object of one embodiment of the present invention to provide a signal processing unit which does not involve a complicated manufacturing method and can suppress power consumption, especially to provide a signal processing circuit which can suppress power consumption by stopping the supply of power for a short time.

One embodiment of the present invention is a memory circuit in which, while a supply of power to the memory circuit is stopped, a data signal that has been held in a memory section corresponding to a volatile memory can be held in a capacitor provided in a memory section corresponding to a nonvolatile memory. In the nonvolatile memory section, by using a transistor whose channel is formed in an oxide semiconductor layer, a signal held in the capacitor can be held for a long period of time. Thus, the memory circuit can hold a logic state (data signal) even while the supply of power to the memory circuit is stopped. In addition, a potential to be applied to a gate of the transistor whose channel is formed in an oxide semiconductor layer is raised by a booster circuit provided between a wiring for carrying power supply potential and the gate of the transistor, allowing a data signal to be held even by only one power supply potential without malfunction.

One embodiment of the present invention is a memory circuit of a signal processing unit, the memory circuit including a volatile memory section and a nonvolatile memory section, in which the nonvolatile memory section includes a first transistor whose channel is formed in a semiconductor layer containing an oxide semiconductor, and a second transistor whose gate is electrically connected to one of a source electrode and a drain electrode of the first transistor, in which a data signal output from the volatile memory section is held between the one of the source electrode and the drain electrode of the first transistor and the gate of the second transistor in a period during which an operation of the volatile memory section is stopped, and in which a booster circuit for increasing voltage to be applied to the gate of the first transistor is provided between the gate of the first transistor and a wiring for supplying power supply potential.

One embodiment of the present invention is a memory circuit of a signal processing unit, the memory circuit including a volatile memory section and a nonvolatile memory section, in which the nonvolatile memory section includes a first transistor whose channel is formed in a semiconductor layer containing an oxide semiconductor, a second transistor whose gate is electrically connected to one of a source electrode and a drain electrode of the first transistor, a third transistor that one of source electrode and drain electrode of the third transistor is electrically connected to the other one of the source electrode and the drain electrode of the first transistor and that a conduction state or a non-conduction state is controlled by a write control signal, and a fourth transistor that controls for bringing the gate of the first transistor into an electrically floating state, in which a data signal output from the volatile memory section is held between the one of the source electrode and the drain electrode of the first transistor and the gate of the second transistor in a period during which an operation of the volatile memory section is stopped, and in which a booster circuit for increasing voltage to be applied to the gate of the first transistor is provided between the gate of the first transistor and a wiring for supplying power supply potential.

One embodiment of the present invention is a memory circuit of a signal processing unit, the memory circuit including a volatile memory section and a nonvolatile memory section, in which the nonvolatile memory section includes a first transistor whose channel is formed in a semiconductor layer containing an oxide semiconductor, a second transistor whose gate is electrically connected to one of a source electrode and a drain electrode of the first transistor, a third transistor whose one of source electrode and drain electrode is electrically connected to the other one of the source electrode and the drain electrode of the first transistor and that a conduction state or a non-conduction state is controlled by a write control signal, and a fourth transistor that controls for bringing the gate of the first transistor into an electrically floating state, in which a data signal output from the volatile memory section is held between the one of the source electrode and the drain electrode of the first transistor and the gate of the second transistor in a period during which an operation of the volatile memory section is stopped, in which holding of the data signal is performed through a first phase inverter circuit for inverting a logic state of the data signal, and output of the data signal is performed through a second phase inverter circuit for inverting a logic state of the held data signal, and in which a booster circuit for increasing voltage to be applied to the gate of the first transistor is provided between the gate of the first transistor and a wiring for supplying power supply potential.

In the memory circuit of a signal processing unit according to one embodiment of the present invention, the first phase inverter circuit and the second phase inverter circuit may each include a p-channel transistor and an n-channel transistor.

In the memory circuit of a signal processing unit according to one embodiment of the present invention, the second transistor may be a transistor whose channel is formed in a silicon layer or a silicon substrate.

In the memory circuit of a signal processing unit according to one embodiment of the present invention, the first transistor and the second transistor may be stacked up.

In the memory circuit of a signal processing unit according to one embodiment of the present invention, the booster circuit may include a booster transistor whose gate is electrically connected to whose one of a source and a drain, and may boost a potential by a bootstrapping method in which the gate of the first transistor is brought into an electrically floating state by the booster transistor and the fourth transistor.

One embodiment of the present invention can provide a signal processing unit which does not need a complicated manufacturing process and can suppress power consumption. Especially, one embodiment of the present invention can provide a signal processing unit that can suppress power consumption by stopping supply of power for a short time.

BRIEF DESCRIPTION OF THE DRAWINGS

FIGS. 23A to 23C illustrate an example of an oxide semiconductor.

DETAILED DESCRIPTION OF THE INVENTION

Figure 1A:
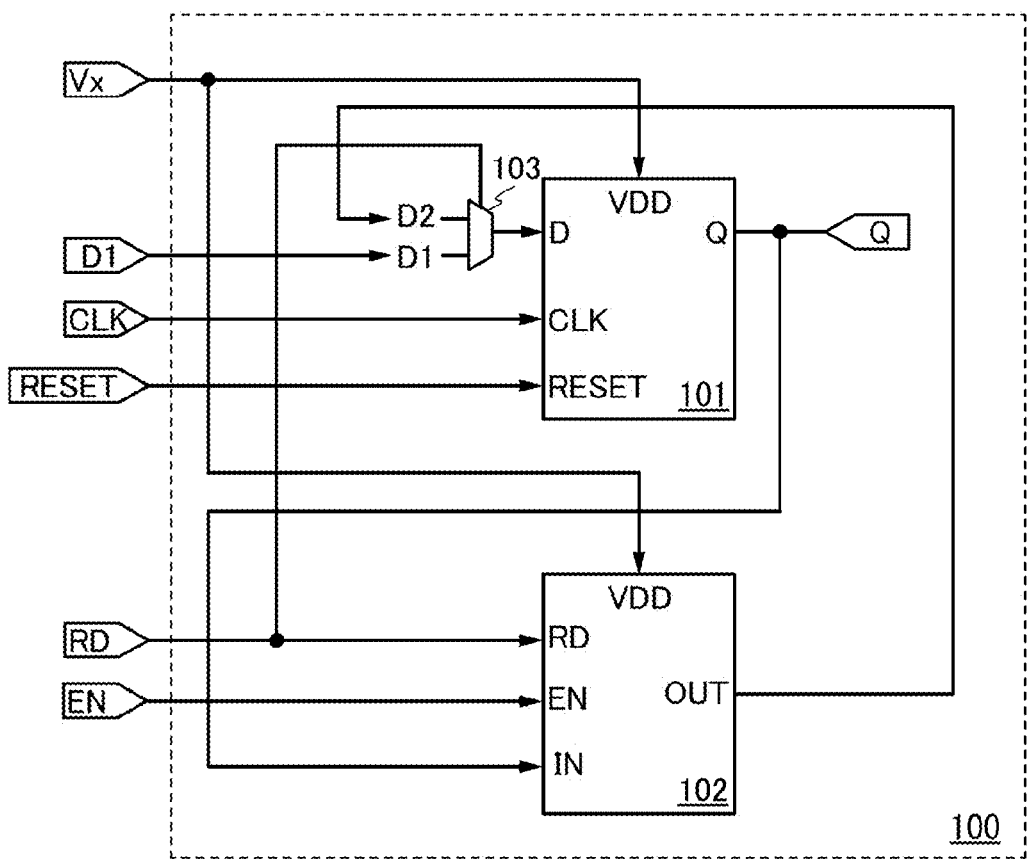
FIGS. 1A and 1B are circuit diagrams of a memory circuit.

Embodiments and an example of the present invention will be described below with reference to the drawings. Note that the components of the present invention can be implemented in various different ways. It will be readily appreciated by those skilled in the art that modes and details of the embodiments can be modified in various ways without departing from the spirit and scope of the present invention. The present invention therefore should not be construed as being limited to the description of the embodiments and the example. Note that in the components of the present invention described below, reference numerals denoting the same portions are used in common in different drawings.

Note that, the size, layer thickness, signal waveform, and region of each object shown in the drawings and the like of the embodiments are exaggerated for simplicity in some cases. Therefore, each object is not necessarily in such scales.

Note that when it is explicitly described that "A and B are connected", the case where A and B are electrically connected; the case where A and B are functionally connected; and the case where A and B are directly connected; are included therein.

Note that, in this specification, the terms "first", "second", "third", to "N-th (N is a natural number)" are used for preventing confusion between components, and thus do not limit numerically.

(Embodiment 1)

A signal processing unit includes a memory circuit. The memory circuit can store a data signal of one-bit or multi-bit by one or more memory circuits provided. This embodiment describes a configuration of the memory circuit in the signal processing unit.

Note that examples of the signal processing unit according to the preset invention include, in its category, large scale integrated circuits (LSIs) such as CPUs, microprocessors, image processing circuits, digital signal processors (DSPs), and field programmable gate arrays (FPGAs).

FIG. 1A shows an example of a block diagram of the memory circuit. A memory circuit 100 shown in FIG. 1A roughly includes a volatile memory section 101 and a nonvolatile memory section 102 and includes a selector circuit 103 at an input terminal side of the volatile memory section 101.

The volatile memory section 101 includes, for example, a reset flip-flop circuit which is a clock synchronization type. Note that the flip-flop circuit included in the volatile memory section 101 may be another type of flip-flop circuit. The volatile memory section 101 stores a data signal only while being powered.

FIG. 1A shows signals input to the volatile memory section 101. FIG. 1A mainly shows, as an example, a power supply potential Vx for supplying a high power supply potential VDD, a data signal D including a first data signal D1 or a second data signal D2, a clock signal CLK, and a reset signal RESET for initializing the storage state of the volatile memory section 101.

FIG. 1A shows signals output from the volatile memory section 101. FIG. 1A shows, as an example, an output signal Q.

Note that in FIG. 1A, although not particularly shown, the volatile memory section 101 is supplied with a ground potential GND serving as a low power supply potential VSS in accordance with the power supply potential Vx for supplying the high power supply potential VDD.

The nonvolatile memory section 102 includes a transistor whose channel is formed in an oxide semiconductor layer. The nonvolatile memory section 102 can hold a data signal even without supply of power, by holding charges with the transistor. Thus, unlike the volatile memory section 101, the nonvolatile memory section 102 can hold a data signal even without supply of power.

FIG. 1A shows signals input to the nonvolatile memory section 102. FIG. 1A mainly shows, as an example, the power supply potential Vx for supplying the high power supply potential VDD, an input signal IN which is the same as the output signal Q of the volatile memory section 101, a first control signal EN for controlling data signal transmission in the nonvolatile memory section 102, and a second control signal RD for control in accordance with whether supply or stop of power.

FIG. 1A shows signals output from the nonvolatile memory section 102. FIG. 1A shows, as an example, an output signal OUT.

Note that in FIG. 1A, although not particularly shown, the nonvolatile memory section 102 is supplied with the ground potential GND serving as the low power supply potential VSS in accordance with the power supply potential Vx serving as the high power supply potential VDD.

The selector circuit 103 selects the first data signal D1 or the second data signal D2 in accordance with the second control signal RD and supplies the selected signal to the volatile memory section 101. Note that while the power is supplied to the memory circuit 100, the second control signal RD is a signal that selects the first data signal D1 and makes the first data signal D1 supplied to the volatile memory section 101. In addition, the second control signal RD is a signal that selects the second data signal D2 and makes the second data signal D2 supplied to the volatile memory section 101 when return to a state where the power is supplied from a state where supply of power is stopped.

Figure 1B:
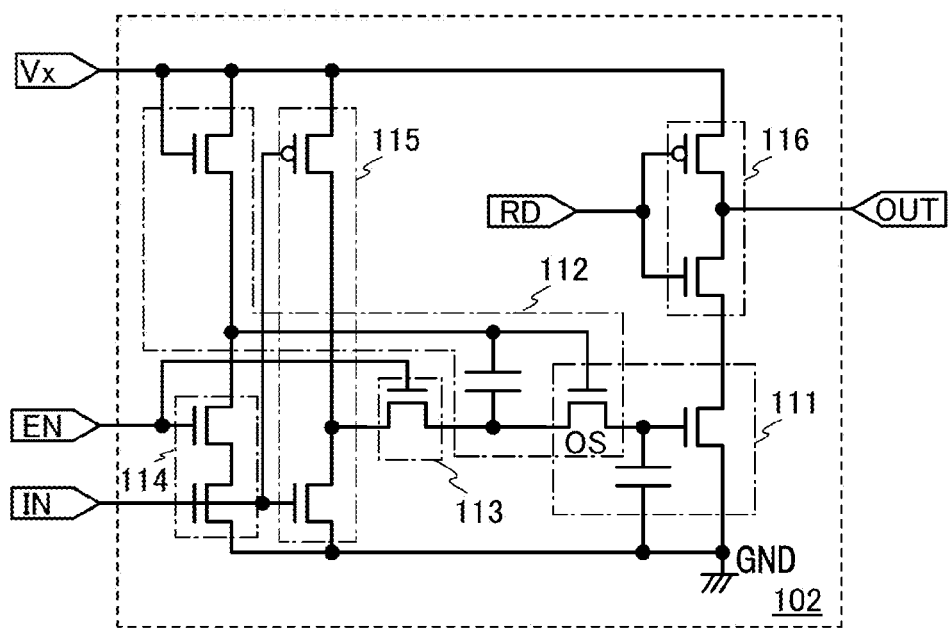

FIG. 1B shows, as an example, the circuit configuration of the nonvolatile memory section 102. The nonvolatile memory section 102 includes a memory circuit 111, a booster circuit 112 (also called a bootstrap circuit), a first switch circuit 113, a second switch circuit 114, a first phase inverter circuit 115, and a second phase inverter circuit 116. The circuits in FIG. 1B are described with reference to FIG. 2.

Figure 2:
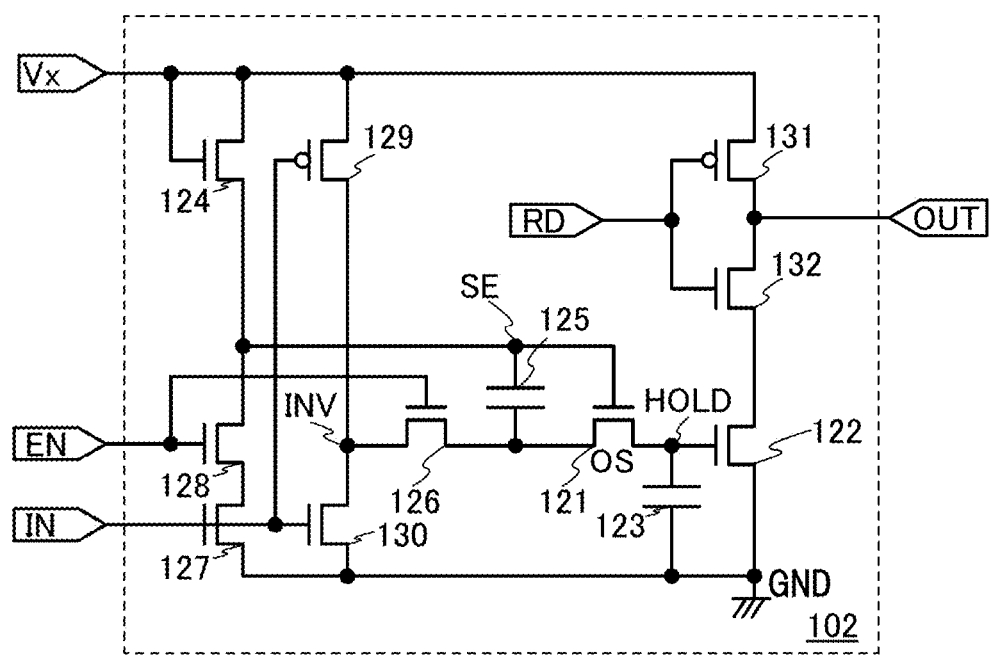
FIG. 2 is a circuit diagram of a nonvolatile memory section.

The memory circuit 111 in FIG. 1B includes a first transistor 121, a second transistor 122, and a first capacitor 123 shown in FIG. 2. One of a source and a drain of the first transistor 121 is connected to a gate of the second transistor 122. One of the source and the drain of the first transistor 121 is connected to one electrode of the first capacitor 123. Note that the node where the first transistor 121, the second transistor 122, and the first capacitor 123 are connected is hereinafter called "HOLD" as shown in FIG. 2.

The first transistor 121 whose channel is formed in an oxide semiconductor layer. Note that the first transistor 121 is labeled as OS in the figure in order to indicate that it is a transistor whose channel is formed in an oxide semiconductor layer.

The second transistor 122 in FIG. 2 is an element functioning as a switch. FIG. 2 shows the case where a transistor of one conductivity type (e.g., an n-channel transistor) is used as the second transistor 122. Here, in a switch, one terminal of the switch corresponds to one of a source and a drain of a transistor, while the other terminal of the switch corresponds to the other one of the source and the drain of the transistor. The switch is turned on or off by the control signal supplied to a gate of the transistor. If the second transistor 122, which is an n-channel transistor, functions as a switch, the second transistor 122 is turned on by a high power supply potential (represented by VDD, an H signal, or H), and turned off by a low power supply potential (represented by VSS, an L signal, or L). Note that the switch may be a combination of an n-channel transistor and a p-channel transistor. In this case, the switch can be an analog switch.

Note that the first capacitor 123 can be omitted by positively using, for example, a capacitor formed by using the gate of the second transistor 122 and the other one of the source and the drain of the first transistor 121.

The booster circuit 112 in FIG. 1B includes the first transistor 121, a diode-connected booster transistor 124, and a second capacitor 125 shown in FIG. 2. A gate and one of a source and a drain of the booster transistor 124 is connected to wiring for carrying the power supply potential Vx. The other one of the source and the drain of the booster transistor 124 is connected to one electrode of the second capacitor 125. The other one of the source and the drain of the booster transistor 124 is connected to a gate of the first transistor 121. Note that the node where the first transistor 121, the booster transistor 124, and the second capacitor 125 is hereinafter called "SE" as shown in FIG. 2.

The booster transistor 124 is a diode-connected transistor whose gate and drain are short-circuited. As Embodiment 1 describes, when the booster transistor 124 is an n-channel transistor, a potential supplied through the booster transistor 124 is reduced by the threshold voltage of the booster transistor 124. Note that the channel width of the booster transistor 124 is preferably set, in advance, larger than the channel width of each transistor included in the second switch circuit 114 in order to increase current supply capability to the node SE.

Note that the second capacitor 125 can be omitted by positively using, for example, the gate capacitance of the first transistor 121.

Note that the node SE can boost a potential supplied from the wiring for carrying the power supply potential Vx by a booster circuit provided between the gate of the first transistor 121 and the wiring for carrying the power supply potential Vx. Specifically, a bootstrapping method, in which the node SE is brought into the floating state and the potential of the other electrode of the second capacitor 125 is raised, is performed. Consequently, capacitive coupling occurs in the second capacitor 125 and the potential of the node SE is boosted.

With the configuration in FIG. 1B, the potential of the node SE can be raised by the booster circuit even when the nonvolatile memory section 102 operates without power supply lines of a plurality of potentials. Consequently, the first transistor 121 can operate in the linear region. Thus, a potential held at the node HOLD in the memory circuit 111 can be high enough to reliably turn on or off the second transistor 122.

The first switch circuit 113 in FIG. 1B includes a third transistor 126 in FIG. 2. One of a source and a drain of the third transistor 126 is connected to the other one of the source and the drain of the first transistor 121. A gate of the third transistor 126 is connected to wiring for carrying the first control signal EN.

The second switch circuit 114 in FIG. 1B includes a fourth transistor 127 and a fifth transistor 128 in FIG. 2. One of a source and a drain of the fourth transistor 127 is connected to one of a source and a drain of the fifth transistor 128. The other one of the source and the drain of the fourth transistor 127 is connected to wiring for carrying the ground potential. A gate of the fourth transistor 127 is connected to wiring for carrying the input signal IN. The other one of the source and the drain of the fifth transistor 128 is connected to the other one of the source and the drain of the booster transistor 124. A gate of the fifth transistor 128 is connected to the wiring for carrying the first control signal EN.

The first phase inverter circuit 115 in FIG. 1B includes a sixth transistor 129 and a seventh transistor 130 in FIG. 2. One of a source and a drain of the sixth transistor 129 is connected to the wiring for carrying the power supply potential Vx. A gate of the sixth transistor 129 is connected to the wiring for carrying the input signal IN. The other one of the source and the drain of the sixth transistor 129 is connected to one of a source and a drain of the seventh transistor 130. A gate of the seventh transistor 130 is connected to the wiring for carrying the input signal IN. The other one of the source and the drain of the seventh transistor 130 is connected to the wiring for carrying the ground potential. Note that the node where the sixth transistor 129 and the seventh transistor 130 are connected is hereinafter called "INV" as shown in FIG. 2.

The sixth transistor 129 in FIG. 2 is an element functioning as a switch. The sixth transistor 129 is, for example, a transistor of one conductivity type (e.g., a p-channel transistor). The seventh transistor 130 in FIG. 2 is an element functioning as a switch. The seventh transistor 130 is, for example, a transistor of one conductivity type (e.g., an n-channel transistor). Note that the sixth transistor 129 and the seventh transistor 130 are of different conductivity types so that they are alternately turned on or off. In other words, the first phase inverter circuit 115 inverts the logic state of an input signal IN and outputs the inverted input signal IN to the node INV.

The second phase inverter circuit 116 in FIG. 1B includes an eighth transistor 131 and a ninth transistor 132 in FIG. 2. One of a source and a drain of the eighth transistor 131 is connected to the wiring for carrying the power supply potential Vx. A gate of the eighth transistor 131 is connected to wiring carrying the second control signal RD. The other one of the source and the drain of the eighth transistor 131 is connected to one of a source and a drain of the ninth transistor 132. A gate of the ninth transistor 132 is connected to the wiring for carrying the second control signal RD. The other one of the source and the drain of the ninth transistor 132 is connected to one of a source and a drain of the second transistor 122. Note that the other one of the source and the drain of the second transistor 122 is connected to the wiring for carrying the ground potential. Note that the output signal OUT of the nonvolatile memory section 102 is output from the node where the eighth transistor 131 and the ninth transistor 132 are connected.

The eighth transistor 131 in FIG. 2 is an element functioning as a switch. The eighth transistor 131 is, for example, a transistor of one conductivity type (e.g., a p-channel transistor). The ninth transistor 132 in FIG. 2 is an element functioning as a switch. The ninth transistor 132 is, for example, a transistor of one conductivity type (e.g., an n-channel transistor). Note that the eighth transistor 131 and the ninth transistor 132 are of different conductivity types so that they are alternately turned on or off. In other words, the second phase inverter circuit 116 inverts the logic state of the node HOLD in accordance with the logic state of the second control signal RD and outputs the inverted value serving as the output signal OUT. Specifically, when the logic state of the second control signal RD is L, the output signal OUT is H regardless of the logic state where the node HOLD holds an H or an L. When the logic state of the second control signal RD is H, the output signal OUT is L if the node HOLD holds an H logic state. When the logic state of the second control signal RD is L, the output signal OUT is H as in the previous state if the node HOLD holds an L logic state.

Note that in the nonvolatile memory section 102, the potential of a signal held in the first capacitor 123 is applied to the gate of the second transistor 122. Consequently, after the memory circuit 100 is powered again, the signal held in the first capacitor 123 can be converted to a conduction state of the ninth transistor 132 and read from the nonvolatile memory section 102. Thus, the original signal can be read with accuracy even if a potential corresponding to a signal held in the first capacitor 123 slightly fluctuates.

The first phase inverter circuit 115 and the second phase inverter circuit 116 in FIG. 1B each can output a phase-inverted signal corresponding to an input signal only while the high power supply potential VDD is used as the power supply potential Vx.

In FIG. 2, among the transistors used in the nonvolatile memory section 102, the transistors other than the first transistor 121 can be transistors whose channel is formed in a layer or a substrate of a semiconductor other than an oxide semiconductor, e.g., transistors whose channel is formed in a silicon layer or a silicon substrate. Alternatively, the nonvolatile memory section 102 may include, in addition to the first transistor 121, a transistor whose channel is formed in an oxide semiconductor layer and the other transistors whose channel is formed in a layer or substrate of a semiconductor other than an oxide semiconductor.

The oxide semiconductor layer includes at least one element selected from the group of In, Ga, Sn, and Zn. Examples of applicable oxide semiconductors are quaternary metal oxides such as In—Sn—Ga—Zn—O-based oxide semiconductors; ternary metal oxides such as In—Ga—Zn—O-based oxide semiconductors, In—Sn—Zn—O-based oxide semiconductors, In—Al—Zn—O-based oxide semiconductors, Sn—Ga—Zn—O-based oxide semiconductors, Al—Ga—Zn—O-based oxide semiconductors, and Sn—Al—Zn—O-based oxide semiconductors; binary metal oxides such as In—Zn—O-based oxide semiconductors, Sn—Zn—O-based oxide semiconductors, Al—Zn—O-based oxide semiconductors, Zn—Mg—O-based oxide semiconductors, Sn—Mg—O-based oxide semiconductors, In—Mg—O-based oxide semiconductors, and In—Ga—O-based materials; and unary metal oxides such as In—O-based oxide semiconductors, Sn—O-based oxide semiconductors, and Zn—O-based oxide semiconductors. Any of these oxide semiconductors may contain an element other than In, Ga, Sn, and Zn, e.g., $SiO_2$.

For example, an In—Ga—Zn—O-based oxide semiconductor refers to an oxide semiconductor containing indium (In), gallium (Ga), and zinc (Zn), and there is no limitation on the composition ratio thereof.

A thin film represented by the chemical formula $InMO_3(ZnO)_m$ (m>0) can be used as the oxide semiconductor layer. Here, M represents one or more metal elements selected from the group of Zn, Ga, Al, Mn, and Co. For example, M can be Ga, Ga and Al, Ga and Mn, or Ga and Co.

In the case where an In—Zn—O-based material is used as the oxide semiconductor, a target used has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), more preferably In:Zn=1.5:1 to 15:1 in an atomic ratio ($In_2O_3$:ZnO=3:4 to 15:2 in a molar ratio). For example, a target used for the formation of an In—Zn—O-based oxide semiconductor has an atomic ratio expressed by the equation Z>1.5X+Y where In:Zn:O=X:Y:Z.

In a transistor whose channel is formed in an oxide semiconductor layer which is highly purified by drastic removal of hydrogen contained in the oxide semiconductor layer, the off-state current density can be 100 zA/μm or less, preferably 10 zA/μm or less, more preferably 1 zA/μm or less. For this reason, the off-state current of the transistor is much lower than that of a transistor including crystalline silicon. Thus, while the first transistor 121 is in the off state, the potential of the node HOLD, that is, the potential of the gate of the second transistor 122 can be held for a long period of time.

Note that in this specification, off-state current refers to current flowing between the source and the drain of a thin film transistor which is in the off state (non-conduction state). In the case of an n-channel thin film transistor (whose threshold voltage is, for example, about 0 to 2 V), off-state current refers to current flowing between the source and the drain when negative voltage is applied between the gate and the source.

Note that a material that can achieve the off-state current characteristics equivalent to those of the oxide semiconductor material, such as a wide gap material like silicon carbide (specifically, for example, a semiconductor material whose energy gap Eg is larger than 3 eV), may be used instead of an oxide semiconductor material.

Figure 3:
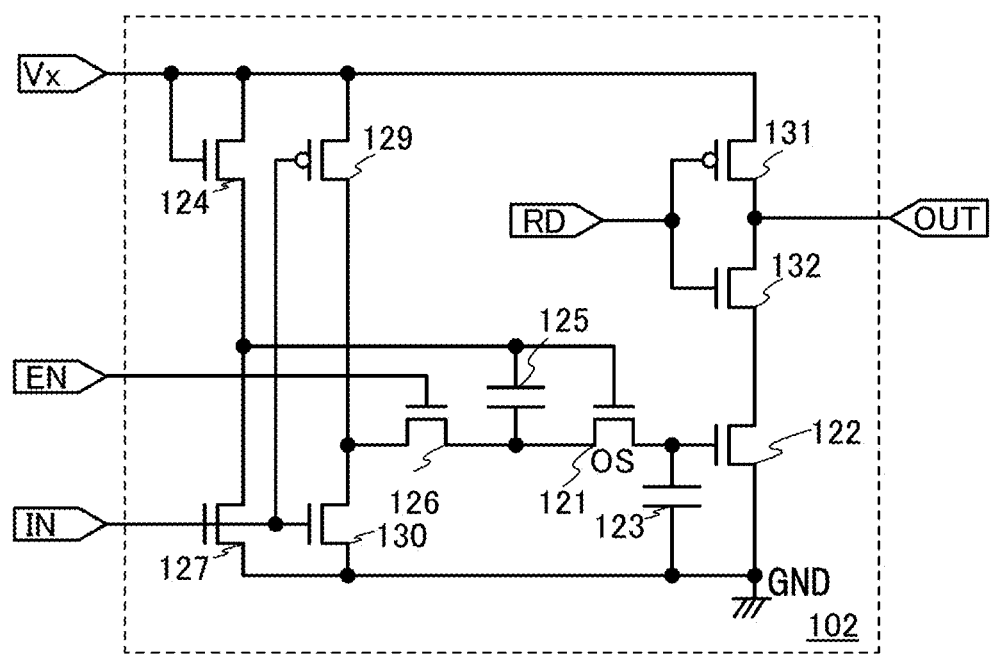
FIG. 3 is a circuit diagram of a nonvolatile memory section.

Note that the fifth transistor 128 included in the second switch circuit 114 in FIG. 2 is provided to reduce power consumption which is increased by current flow between the wiring for carrying the power supply potential Vx and the wiring for carrying the ground potential. Therefore, the fifth transistor 128 can be omitted in the circuit configuration of the nonvolatile memory section 102 in FIG. 2. FIG. 3 shows the circuit configuration of the nonvolatile memory section 102 in which the fifth transistor 128 is omitted.

The foregoing has described the configuration of the memory circuit 100.

Figure 4:
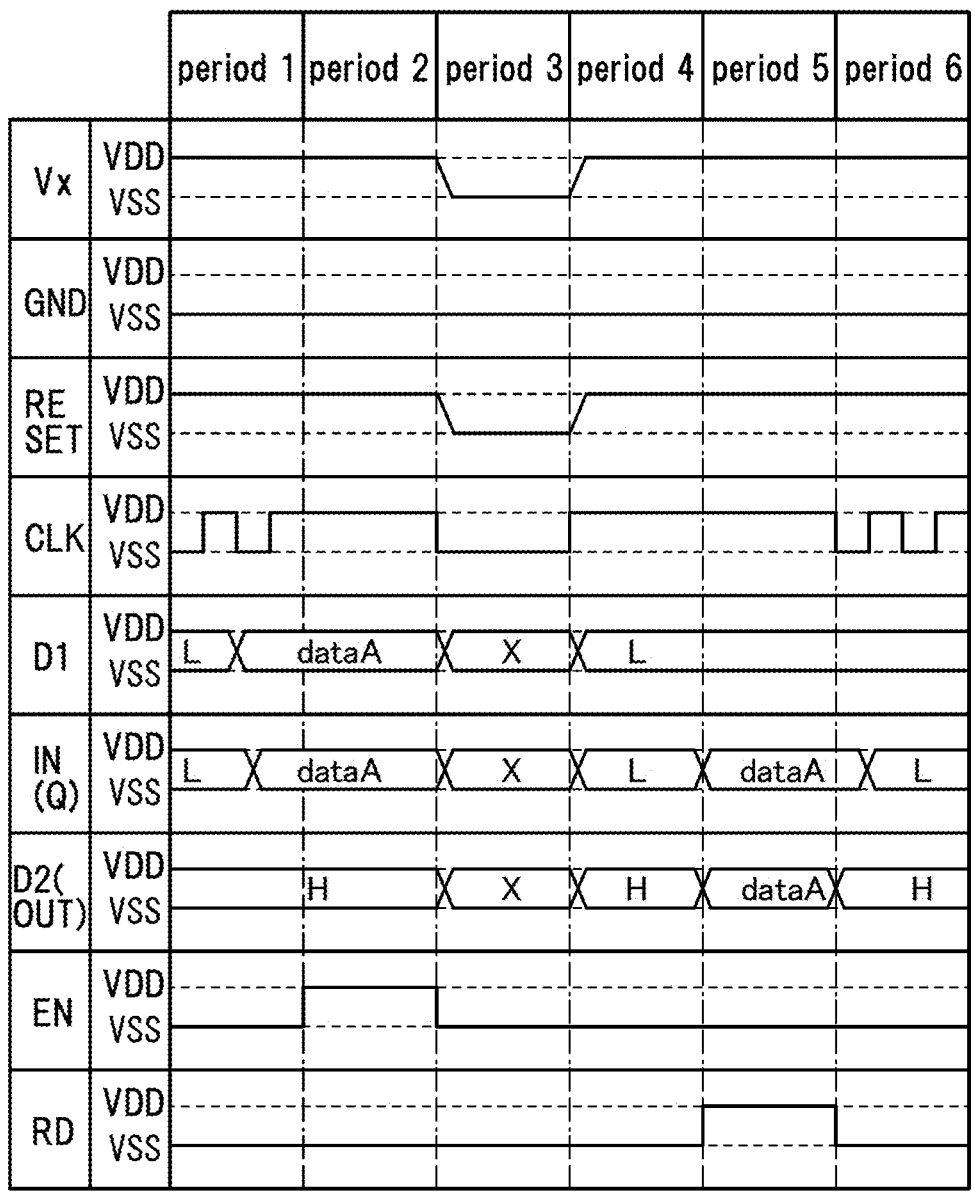
FIG. 4 is a timing diagram showing the operation of the memory circuit.

Next, a method for driving the memory circuit 100 which is employed in the case where, while a data signal is held, the supply of power is stopped and then the power is re-supplied in order to reduce power consumption will be described. FIG. 4 is a timing diagram. The method will be described with reference to this timing diagram. In the timing diagram of FIG. 4, Vx, GND, RESET, CLK, D1, IN(Q), D2(OUT), EN, and RD correspond to the respective input/output signals shown in FIGS. 1A and 1B. In the timing diagram of FIG. 4, for the description of a plurality of states of the memory circuit 100, a plurality of periods (periods 1 to 6) are shown. FIG. 5, FIGS. 6A and 6B, FIGS. 7A and 7B, and FIGS. 8A and 8B are schematic diagrams showing the on/off states of the transistors and the potentials of the input/output signals which are seen in the periods 1 to 6 shown in FIG. 4. The periods 1 to 6 shown in FIG. 4 will be now described with reference to FIG. 5, FIGS. 6A and 6B, FIGS. 7A and 7B, and FIGS. 8A and 8B.

In FIG. 5, FIGS. 6A and 6B, FIGS. 7A and 7B, and FIGS. 8A and 8B, the off state of a transistor is represented by "X", and a current flow generated by turning on a transistor is represented by a dotted arrow. FIG. 5, FIGS. 6A and 6B, FIGS. 7A and 7B, and FIGS. 8A and 8B show the potentials of the node INV, the node SE, and the node HOLD.

Note that in the description of the driving method, the conductivity types of the transistors are the same as those in FIG. 2. Note that the driving method according to the present invention is not limited to this; the conductivity types of the transistors and the potentials of the control signals can be set as appropriate as long as the operation in which a conduction state of each the transistors is the same as in the above-described.

Each input/output signal can be represented by a high power supply potential (represented by VDD, an H signal, and H) or a low power supply potential (represented by VSS, an L signal, and L). VSS can be, for example, the ground potential.

First, the operation in the period 1 shown in FIG. 4 is described. In the period 1, Vx is an H signal and the memory circuit 100 is powered by the high power supply potential from Vx. In the memory circuit 100, when the second control signal RD is an L signal, the volatile memory section 101 holds the first data signal D1. In the period 1 shown in FIG. 4, an L signal serving as a data signal is held, and then dataA is held instead in synchronization with falling edge of the clock signal CLK, and then the held dataA is output in synchronization with rising edge of the clock signal CLK. Note that the falling edge of the clock signal CLK represents the timing of the transition from an H signal to an L signal. The rising edge of the clock signal CLK represents the timing of the transition from an L signal to an H signal. Note that in the description of Embodiment 1, dataA is supposed to be an L signal for the description of an example of the operation.

Figure 5:
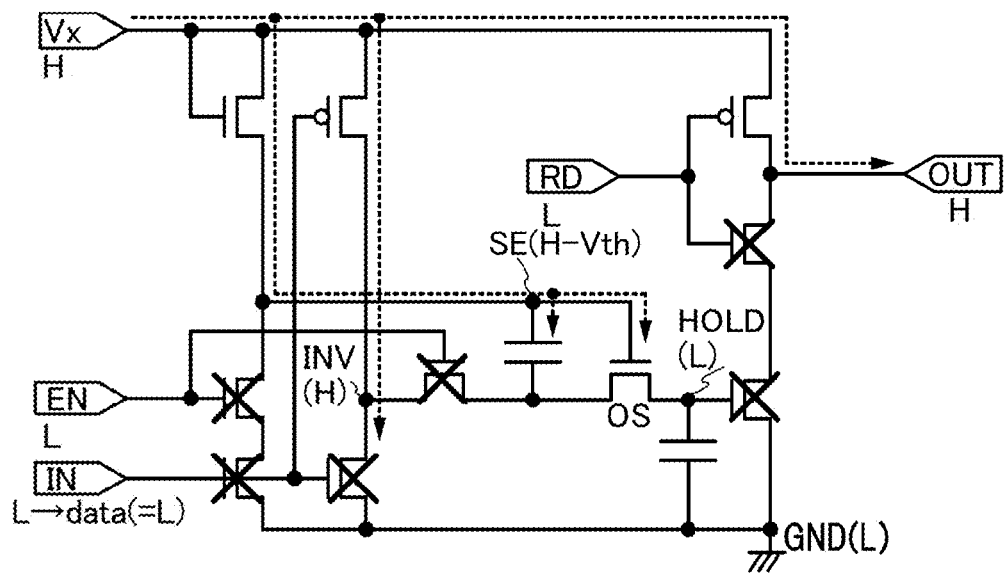
FIG. 5 is a circuit diagram for describing the operation of the nonvolatile memory section.

In the period 1, Vx, the first control signal EN, and the second control signal RD for the nonvolatile memory section 102 are an H signal, an L signal, and an L signal, respectively, and dataA which is an L signal is input to the nonvolatile memory section 102. Further, in the nonvolatile memory section 102, the third transistor 126, the fourth transistor 127, the fifth transistor 128, the seventh transistor 130, and the ninth transistor 132 are off state as shown in FIG. 5. On the other hand, the booster transistor 124, the sixth transistor 129, and the eighth transistor 131 are in the on state as shown in FIG. 5. When the booster transistor 124 is in the on state, the potential of the node SE increases. Then, the potential of the node SE becomes (H-Vth), that is, a value obtained by subtracting the threshold voltage of the booster transistor 124 from the potential of the H signal (potential H). Note that after the potential of the node SE becomes (H-Vth), the booster transistor 124 is turned off. Consequently, the first transistor 121 is turned on. Further, when the sixth transistor 129 is turned on, the potential of the node INV increases to potential H. Note that although the logic signal which differs depending on the previous state is held in the node HOLD, it is supposed that an L signal is held in the description of Embodiment 1. In this case, the second transistor 122 is turned off. Further, when the eighth transistor 131 is turned on, the potential of D2 becomes potential H.

As described above, in the memory circuit 100 in the period 1, the volatile memory section 101 holds a data signal, while the nonvolatile memory section 102 does not participate in the storage of a data signal in the memory circuit 100. The operation in the period 1 is called the normal operation.

Next, the operation in the period 2 shown in FIG. 4 is described. In the period 2, Vx is an H signal and the memory circuit 100 is powered by the high power supply potential from Vx. In the period 2, the second control signal RD is an L signal. In the period 2 shown in FIG. 4, a new data signal is not supplied after the previous data signal, dataA, is supplied. Note that the clock signal CLK is still held in an H signal because a new data signal is neither held nor output.

Figure 6A:
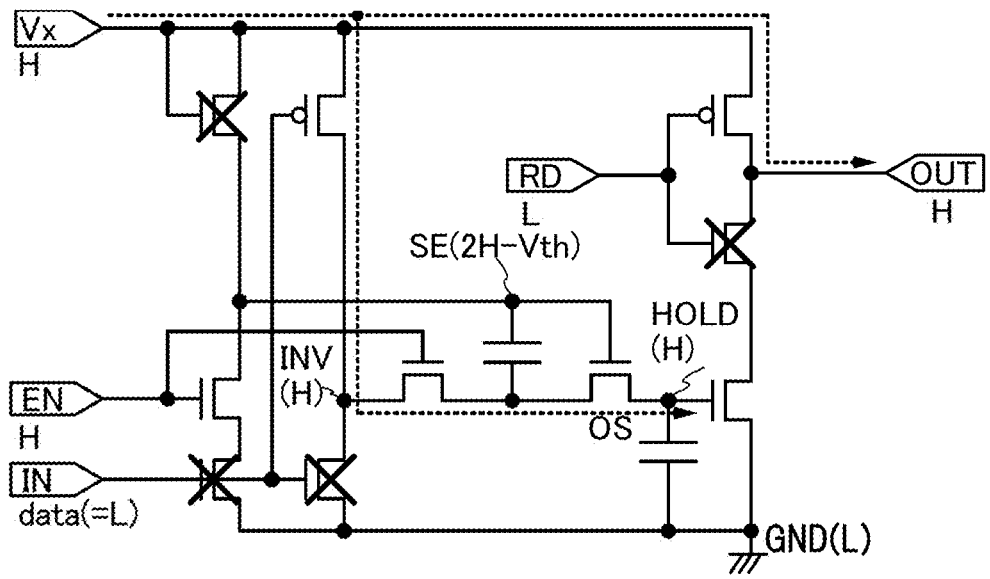
FIGS. 6A and 6B are circuit diagrams for describing the operation of the nonvolatile memory section.

In the period 2, in the nonvolatile memory section 102, Vx, the first control signal EN, and the second control signal RD are an H signal, an H signal, and an L signal, respectively, and dataA which is an L signal is input to the nonvolatile memory section 102. Further, in the nonvolatile memory section 102, as shown in FIG. 6A, the booster transistor 124, the fourth transistor 127, the seventh transistor 130, and the ninth transistor 132 are off state. On the other hand, as shown in FIG. 6A, the third transistor 126, the fifth transistor 128, the sixth transistor 129, and the eighth transistor 131 are in the on state. Since the third transistor 126 is in the on state, the potential of the other electrode of the second capacitor 125 is increased by the potential of the node INV. Note that the potential of the other electrode of the second capacitor 125 becomes a value obtained by subtracting the threshold voltage of the third transistor 126 from the potential of the node INV. However, the threshold voltage of the third transistor 126 is lower than that of the first transistor 121 whose channel is formed in an oxide semiconductor layer. Therefore, the potential of the other electrode of the second capacitor 125 does not so much vary as compared to the potential of the node INV.

When the potential of the other electrode of the second capacitor 125 increases, the node SE is in the floating state because the booster transistor 124 and the fourth transistor 127 are off. Consequently, capacitive coupling using a bootstrapping method occurs in the second capacitor 125 in the booster circuit, so that the potential of the node SE (H-Vth) increases to about (2H-Vth). As a result, the potential of the gate of the first transistor 121 can be high, which allows the first transistor 121 to operate in the linear region. A high potential can be held at the node HOLD even when the nonvolatile memory section 102 operates without power supply lines for of a plurality of potentials.

The threshold voltage of the first transistor 121 whose channel is formed in an oxide semiconductor layer is higher than that of, for example, a transistor whose channel is formed of silicon. For this reason, when potential applied to the gate of the first transistor 121 is low, the adverse effect due to the fact that potential held at the node HOLD is reduced by the threshold voltage is significant. Therefore, making the first transistor 121 operate in the linear region has the advantageous effect that the potential of the gate of the second transistor 122 can be increased, and this advantageous effect where the first transistor 121 is used can be estimated to be more significant than in other transistors. As a result, when the second transistor 122 is turned on or off, the logic state of a data signal held in the nonvolatile memory section 102 can be determined without malfunction. Note that in FIG. 6A, an H signal is held at the node HOLD and the second transistor 122 is in the on state. The eighth transistor 131 is in the on state, so that the potential of D2 is potential H.

Figure 6B:
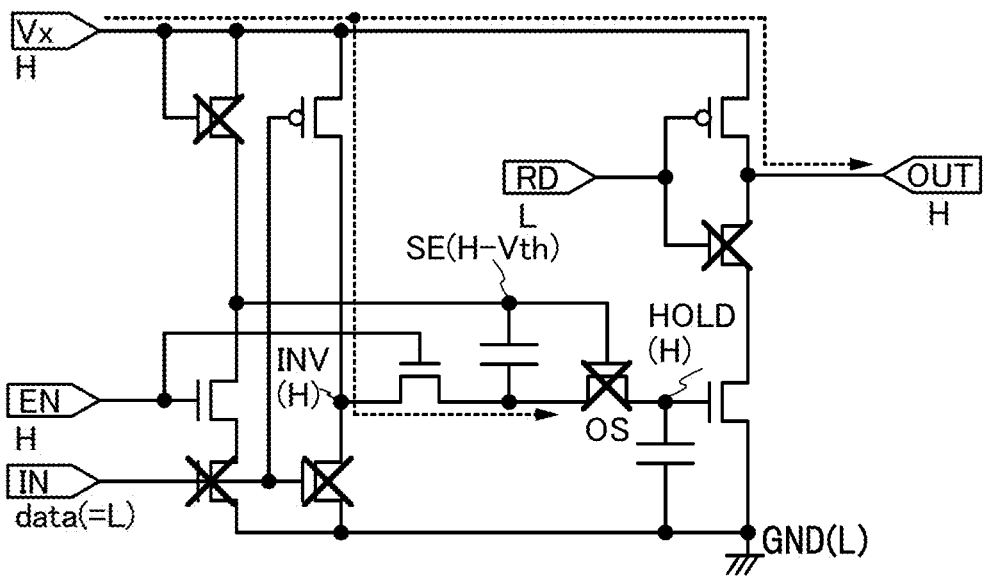

In the period 2, a potential of the node SE is boosted to a potential higher than a power supply potential by the bootstrapping method in the booster circuit, and the node HOLD holds an H signal. At this time, the off-state current of the booster transistor 124 and fourth transistor 127 which are used to maintain the floating state of the node SE is higher than that of the first transistor 121 having an oxide semiconductor layer. Consequently, in the steady state, the potential of the node SE decreases to (H-Vth). Then, as shown in FIG. 6B, the first transistor 121 is turned off while the node HOLD holds an H signal.

As described above, in the period 2, a data signal that has been in the volatile memory section 101 in the memory circuit 100 is held at the node HOLD in the nonvolatile memory section 102. The operation in the period 2 is called the operation preceding stop of the supply of power.

Next, the operation in the period 3 shown in FIG. 4 is described. In the period 3, Vx is an L signal, so that the power is not supplied to the memory circuit 100. In the period 3 in FIG. 4, the power is not supplied to the volatile memory section 101 and thus the input first data signal D1 and second data signal D2 are erased (which are represented by "X" in FIG. 4). Further, the clock signal CLK is fixed to an L signal so that the volatile memory section 101 does not operate.

Figure 7A:
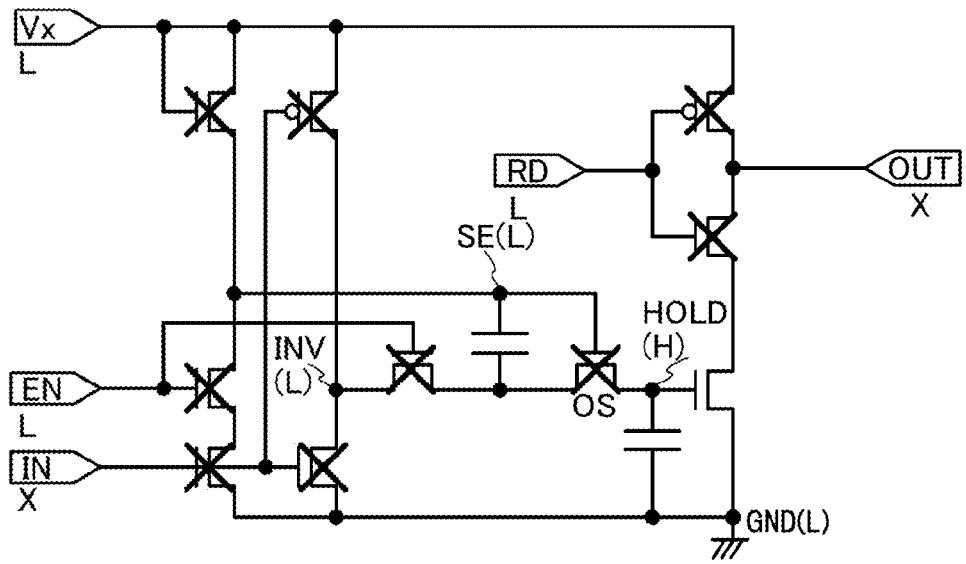
FIGS. 7A and 7B are circuit diagrams for describing the operation of the nonvolatile memory section.

In the period 3, in the nonvolatile memory section 102, Vx, the first control signal EN, and the second control signal RD are L signals, and dataA serving as an input signal IN is erased. In the nonvolatile memory section 102, as shown in FIG. 7A, the second transistor 122 whose gate holds an H signal is in the on state, while the other transistors are off Even after the stop of the supply of power to the memory circuit 100, a data signal (an H signal here) that has been held in the volatile memory section 101 is held at the node HOLD. Here, the first transistor 121 is a transistor whose channel is formed in an oxide semiconductor layer. Because the off-state current of the first transistor 121 is extremely low, a potential can be held in the first capacitor 123 (an H signal can be held at the node HOLD) for a long period of time. Thus, the memory circuit 100 holds a data signal even after the stop of the supply of power. The period 3 corresponds to a period during which supply of power to the memory circuit 100 is stopped.

Next, the operation in the period 4 shown in FIG. 4 is described. In the period 4, Vx is an H signal and the power is supplied to the memory circuit 100 by the high power supply potential from Vx. In the period 4, the second control signal RD is an L signal. In the period 4 shown in FIG. 4, the clock signal CLK is still held in an H signal because a new data signal is neither held nor output. Consequently, even if a data signal is supplied, the data signal is neither held in nor output from the volatile memory section 101.

Figure 7B:
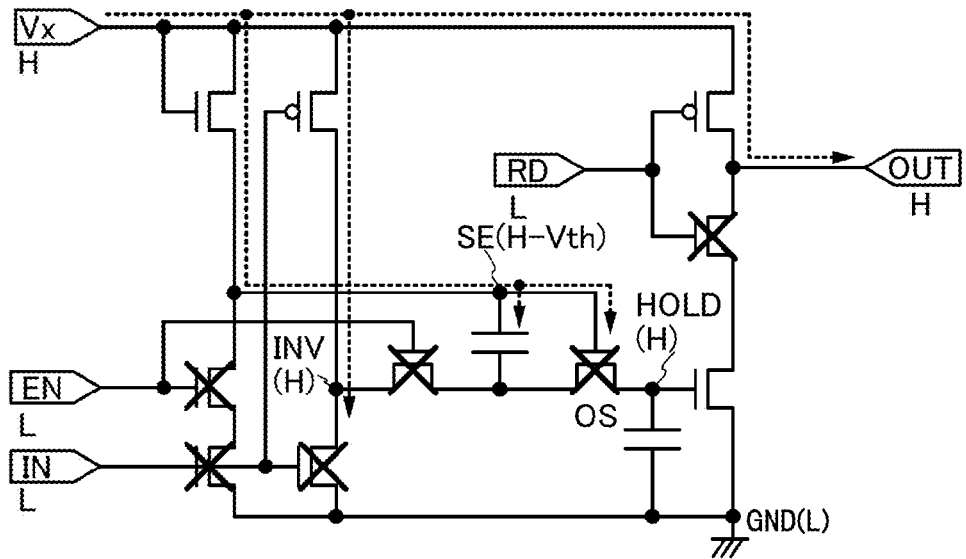

In the period 4, in the nonvolatile memory section 102, Vx, the first control signal EN, and the second control signal RD are an H signal, an L signal, and an L signal, respectively, and an L signal is input to the nonvolatile memory section 102 from the input terminal IN. Further, in the nonvolatile memory section 102, the third transistor 126, the fourth transistor 127, the fifth transistor 128, the seventh transistor 130, and the ninth transistor 132 are off as shown in FIG. 7B. On the other hand, the booster transistor 124, the sixth transistor 129, and the eighth transistor 131 are in the on state as shown in FIG. 7B. When the booster transistor 124 is in the on state, the potential of the node SE increases. The potential of the node SE becomes (H-Vth), that is, a value obtained by subtracting the threshold voltage of the booster transistor 124 from the potential of the H signal (potential H). Note that after the potential of the node SE becomes (H-Vth), the booster transistor 124 is turned off. At this time, if a data signal held at the node HOLD is an H signal, the first transistor 121 is turned off. Further, when the sixth transistor 129 is turned on, the potential of the node INV increases to potential H. Note that in FIG. 7B, an H signal is held at the node HOLD and the second transistor 122 is in the on state. The eighth transistor 131 is in the on state, so that the potential of D2 is potential H.

In the period 4, even after supply of power to the memory circuit 100 is restarted, a data signal (an H signal here) that has been held in the volatile memory section 101 is held at the node HOLD. The first transistor 121 is a transistor whose channel is formed in an oxide semiconductor layer. Since the off-state current of the first transistor 121 is extremely low, a potential can be held in the first capacitor 123 (an H signal can be held at the node HOLD) for a long period of time. The period 4 is a period for precharge of the power supply voltage. By performing this precharge operation, the period required for the volatile memory section 101 to hold original data signal again after the supply of the power is restarted can be shortened.

Next, the operation in the period 5 shown in FIG. 4 is described. In the period 5, Vx is an H signal and the power is supplied to the memory circuit 100 by the high power supply potential from Vx. In the period 5, the second control signal RD is an H signal. In other words, the selector circuit 103 is switched such that the output signal OUT from the nonvolatile memory section 102 is used as a data signal to be held in the volatile memory section 101. In the period 5 shown in FIG. 4, the clock signal CLK is still held in an H signal because a new data signal is neither held nor output. Consequently, even if a data signal is supplied, the data signal is neither held in nor output from the volatile memory section 101.

Figure 8A:
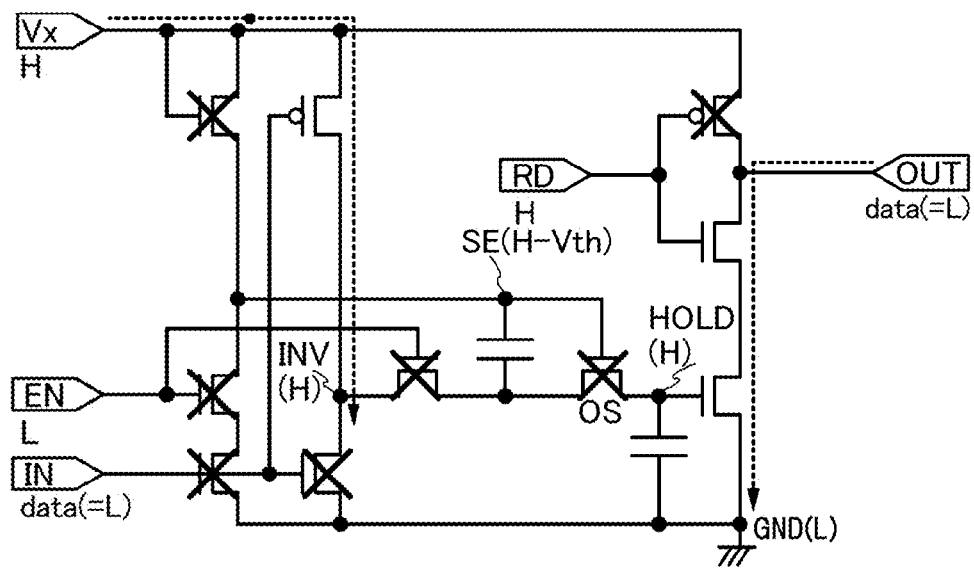
FIGS. 8A and 8B are circuit diagrams for describing the operation of the nonvolatile memory section.
Figure 8B:
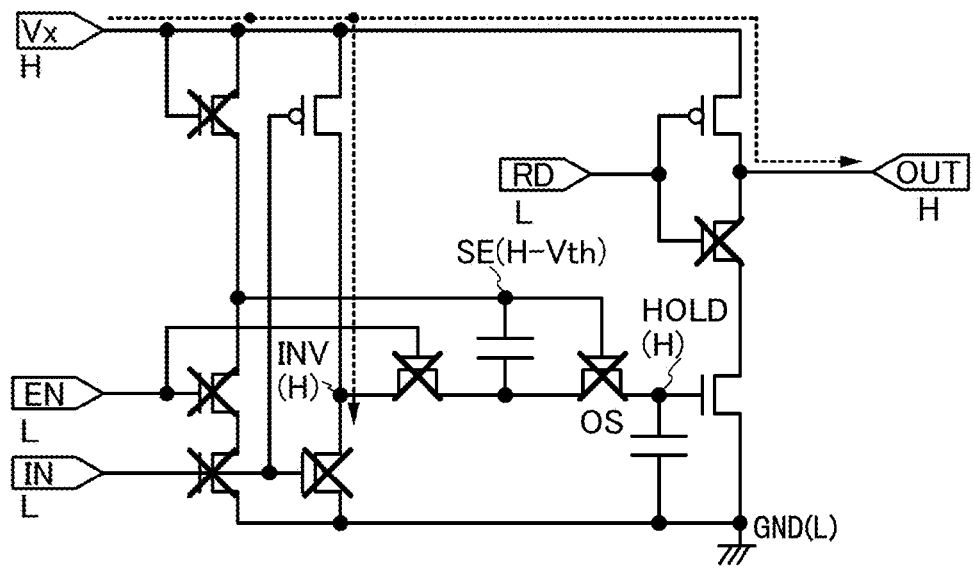

In the period 5, in the nonvolatile memory section 102, Vx, the first control signal EN, and the second control signal RD are an H signal, an L signal, and an H signal, respectively, and an L signal is input to the nonvolatile memory section 102 from the input terminal IN. Consequently, as shown in FIG. 8A, the booster transistor 124, the third transistor 126, the fourth transistor 127, the fifth transistor 128, the seventh transistor 130, and the eighth transistor 131 are off state. On the other hand, the sixth transistor 129 and the ninth transistor 132 are in the on state as shown in FIG. 8A. Note that in FIG. 8A, an H signal is held at the node HOLD and the second transistor 122 is in the on state. When the ninth transistor 132 is also in the on state, the potential of D2 becomes potential L that is the same logic state as that of the data signal held in the period 2.

As described above, in the period 5, a data signal held in the node HOLD in the nonvolatile memory section 102 is recovered to be used as a data signal held in the volatile memory section 101. The operation in the period 5 is called a data signal recovery operation.

Next, the operation in the period 6 shown in FIG. 4 is described. In the period 6, in which the normal operation is performed as in the period 1, Vx is an H signal and the power is supplied to the memory circuit 100 by the high power supply potential from Vx. In the memory circuit 100, when the second control signal RD is an L signal, the volatile memory section 101 holds the first data signal D1. In the period 6 shown in FIG. 4, an L signal serving as a data signal is held, and then dataA is held instead in synchronization with the falling edge of the clock signal CLK, and then the held dataA is output in synchronization with the rising edge of the clock signal CLK.

As described above, in the memory circuit 100 in the period 6, as in the period 1, the volatile memory section 101 holds a data signal, while the nonvolatile memory section 102 does not participate in the storage of a data signal in the memory circuit 100. The operation in the period 6 is called, as the period 1, the normal operation.

The foregoing has described the method for driving the memory circuit.

According to the present invention, while the memory circuit 100 is powered off, a data signal that has been held in the volatile memory section 101 which is a volatile memory can be held in the first capacitor 123 provided in the nonvolatile memory section 102.

A transistor whose channel is formed in an oxide semiconductor layer has extremely low off-state current. For example, the off-state current of a transistor whose channel is formed in an oxide semiconductor layer is much lower than that of a transistor whose channel is formed in crystalline silicon. Therefore, the use of a transistor whose channel is formed in an oxide semiconductor layer as the first transistor 121 allows a signal in the first capacitor 123 to be held for a long period of time even while the memory circuit 100 is powered off. Thus, the memory circuit 100 can hold content (a data signal) even while being powered off.

By using this memory circuit 100 in a memory circuit such as a register or a cache memory included in a signal processing unit, a data signal can be prevented from being lost due to the stop of the supply of power. In addition, after the supply of power is restarted, the memory circuit can return to the same state as before the stop of the supply of power in a short time. Consequently, either the whole signal processing unit or one or more logic circuits in the signal processing unit can be powered off even for a short time. Thus, a signal processing unit that can suppress power consumption and a method for driving this signal processing unit can be provided.

In the structure according to Embodiment 1, in particular, a potential for turning on the first transistor can be boosted by a bootstrapping method in the booster circuit. Consequently, the first transistor can operate in the linear region without power supply lines for carrying a plurality of potentials. As a result, a signal held in the first capacitor 123 can be held in a state of a high potential.

This embodiment can be implemented in appropriate combination with any of the other embodiments.

(Embodiment 2)

This embodiment describes a structure including a plurality of memory circuits each shown in Embodiment 1.

Figure 9A:
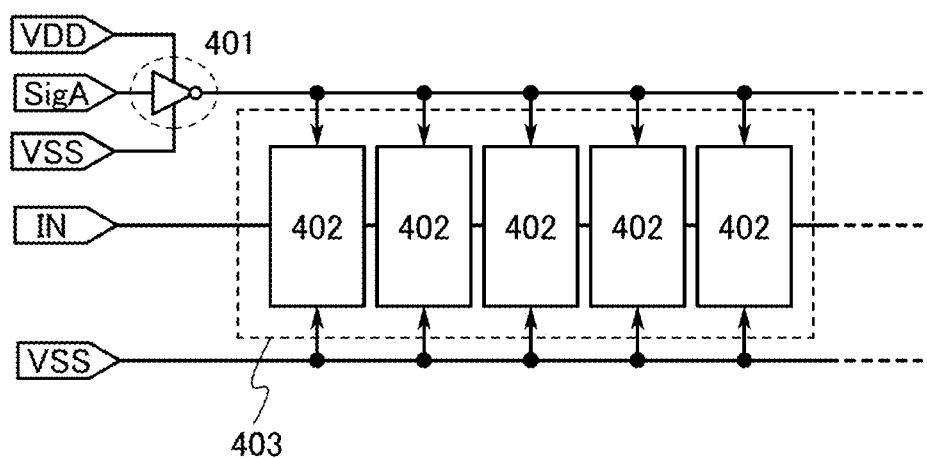
FIGS. 9A and 9B are diagrams showing the structure of the memory circuit.

FIG. 9A shows an example of the structure of a memory circuit according to Embodiment 2. The memory circuit shown in FIG. 9A includes a phase inverter circuit 401 to which the high power supply potential VDD and the low power supply potential VSS are supplied, and a memory circuit group 403 including a plurality of memory circuits 402. Specifically, the memory circuit 100 according to Embodiment 1 can be used as each memory circuit 402. The high power supply potential VDD or the low power supply potential VSS is applied via the phase inverter circuit 401 to each memory circuit 402 included in the memory circuit group 403. In addition, the potential of the signal IN and the low power supply potential VSS are applied to each memory circuit 402 included in the memory circuit group 403.

In FIG. 9A, output of the phase inverter circuit 401 is switched between the high power supply potential VDD and the low power supply potential VSS by a control signal SigA.

Figure 9B:
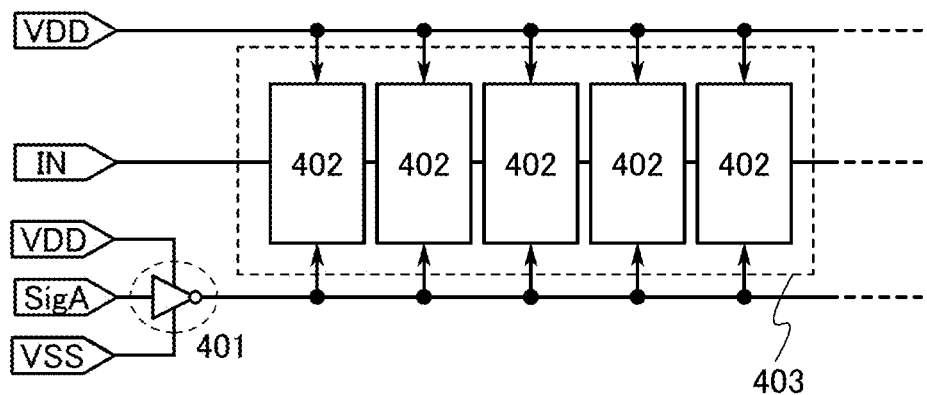

In FIG. 9A, the application of the high power supply potential VDD or the low power supply potential VSS to each memory circuit 402 included in the memory circuit group 403 is controlled on the high power supply potential VDD side by the phase inverter circuit 401. Alternatively, the application of the high power supply potential VDD or the low power supply potential VSS may be controlled on the low power supply potential VSS side through the phase inverter circuit 401. FIG. 9B shows an example of a memory circuit in which each memory circuit 402 included in the memory circuit group 403 is supplied with the high power supply potential VDD or the low power supply potential VSS via the phase inverter circuit 401. The application of the high power supply potential VDD or the low power supply potential VSS can be controlled on the low power supply potential VSS side in each memory circuit 402 included in the memory circuit group 403 by the phase inverter circuit 401.

This embodiment can be implemented in appropriate combination with the above embodiment.

(Embodiment 3)

This embodiment describes a structure of a signal processing unit including a memory circuit described in Embodiment 1 or a memory circuit described in Embodiment 2.

Figure 10:
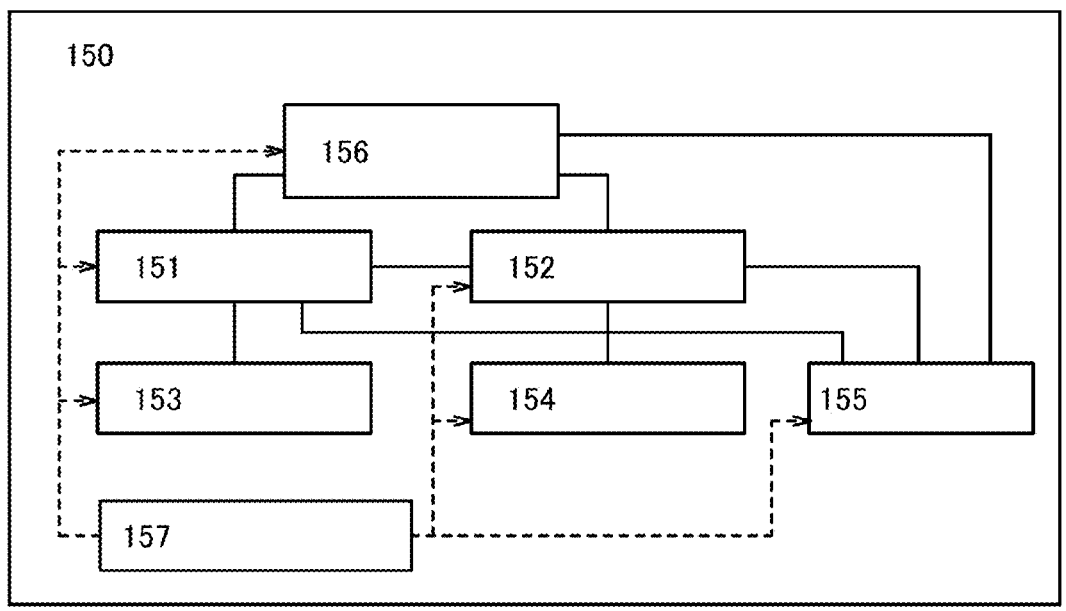
FIG. 10 is a block diagram of a signal processing unit.

FIG. 10 illustrates an example of a signal processing unit according to an embodiment of the present invention. The signal processing unit includes at least one or more arithmetic units and one or more memory circuits. Specifically, a signal processing unit 150 illustrated in FIG. 10 includes an arithmetic unit 151, an arithmetic unit 152, a memory circuit 153, a memory circuit 154, a memory circuit 155, a control unit 156, and a power control circuit 157.

The arithmetic units 151 and 152 each include, as well as a logic circuit which carries out simple logic arithmetic processing, an adder, a multiplier, and various arithmetic units. The memory circuit 153 functions as a register for temporarily holding a data signal when the arithmetic processing is carried out in the arithmetic unit 151. The memory circuit 154 functions as a register for temporarily holding a data signal when the arithmetic processing is carried out in the arithmetic unit 152.

In addition, the memory circuit 155 can be used as a main memory and can store a program executed by the control unit 156 as a data signal or can store a data signal from the arithmetic unit 151 and the arithmetic unit 152.

The control unit 156 is a circuit which collectively controls operations of the arithmetic unit 151, the arithmetic unit 152, the memory circuit 153, the memory circuit 154, and the memory circuit 155 included in the signal processing unit 150. Note that in FIG. 10, a structure in which the control unit 156 is provided in the signal processing unit 150 as a part thereof is illustrated, but the control unit 156 may be provided outside the signal processing unit 150.

By using the memory circuit described in Embodiment 1 or the memory circuit described in Embodiment 2 for the memory circuit 153, the memory circuit 154, and the memory circuit 155, a data signal can be held even when the supply of power to the memory circuit 153, the memory circuit 154, and the memory circuit 155 is stopped. In the above manner, the supply of power to the entire signal processing unit 150 can be stopped, whereby power consumption can be suppressed. Alternatively, the supply of power to one or more of the memory circuit 153, the memory circuit 154, and the memory circuit 155 can is stopped, whereby power consumption of the signal processing unit 150 can be suppressed. After the supply of power is restarted, the memory circuit can return to the state same as that before the supply of power is stopped in a short time.

In addition, as well as the supply of power to the memory circuit is stopped, the supply of power to the control circuit or the arithmetic unit which transmits/receives a data signal to/from the memory circuit may be stopped. For example, when the arithmetic unit 151 and the memory circuit 153 are not operated, the supply of the power to the arithmetic unit 151 and the memory circuit 153 may be stopped.

In addition, the power control circuit 157 controls the level of the power supply voltage supplied to the arithmetic unit 151, the arithmetic unit 152, the memory circuit 153, the memory circuit 154, the memory circuit 155, and the control unit 156 included in the signal processing unit 150. Further, in the case where the supply of power is stopped, the supply of power is stopped either at the power control circuit 157 or at each of the arithmetic unit 151, the arithmetic unit 152, the memory circuit 153, the memory circuit 154, the memory circuit 155, and the control unit 156.

A memory circuit which functions as a cache memory may be provided between the memory circuit 155 that is a main memory and each of the arithmetic unit 151, the arithmetic unit 152, and the control unit 156. By providing the cache memory, low-speed access to the main memory can be reduced and the speed of the signal processing such as arithmetic processing can be higher. By using the above-described memory circuit in the memory circuit functioning as a cache memory, power consumption of the signal processing unit 150 can be suppressed. After the supply of power is restarted, the memory circuit can return to the state same as that before the supply of power is stopped in a short time.

This embodiment can be implemented in appropriate combination with any of the above embodiments.

(Embodiment 4)

This embodiment describes a configuration of a CPU, which is one of signal processing units according to one embodiment of the present invention.

Figure 11:
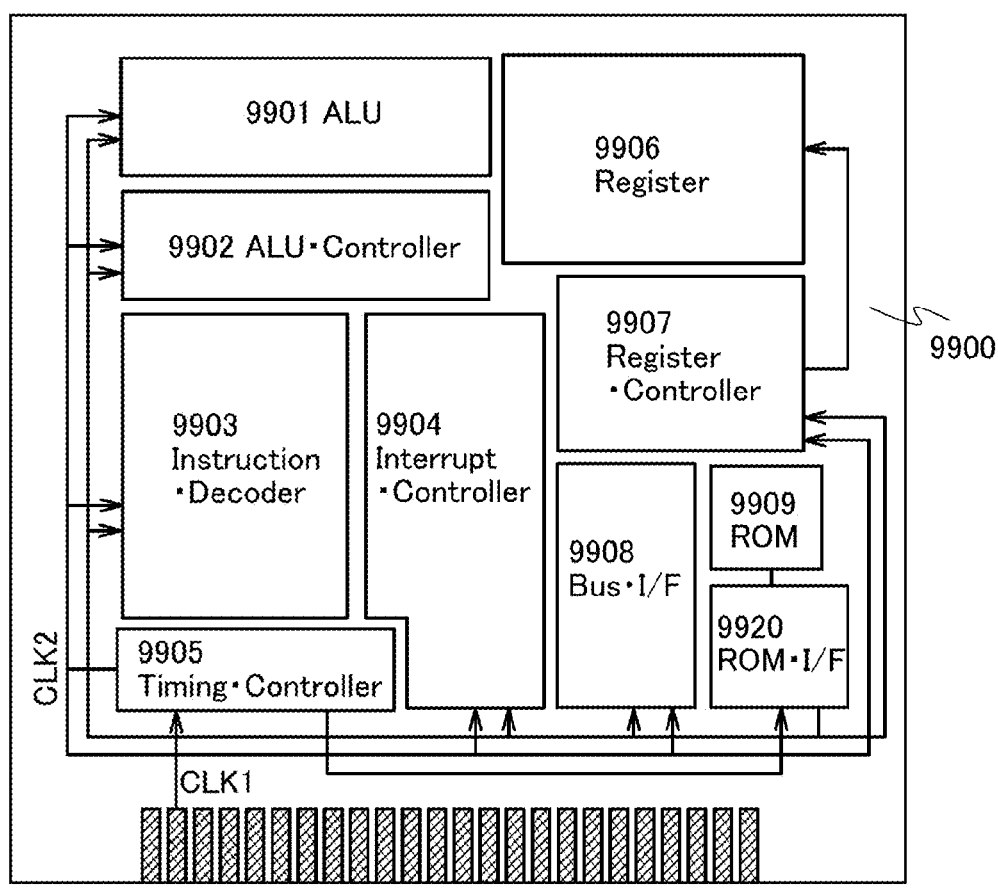
FIG. 11 is a block diagram of a CPU including the memory circuit.

FIG. 11 illustrates a configuration of the CPU in this embodiment. The CPU illustrated in FIG. 11 mainly includes an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920, over a substrate 9900. Further, the ROM 9909 and the ROM I/F 9920 may be provided over different chips. Naturally, the CPU illustrated in FIG. 11 is only an example with a simplified configuration, and an actual CPU may employ a variety of configurations depending on its application.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 conduct control various operations based on the decoded instruction. Specifically, the ALU controller 9902 generates signals for controlling the drive of the ALU 9901. While the CPU is executing a program, the interrupt controller 9904 processes to determine an interrupt request from an external input/output device or a peripheral circuit on the basis of its priority or a mask state, and processes the request. The register controller 9907 generates an address of the register 9906, and reads/writes a data signal from/to the register 9906 depending on the state of the CPU.

The timing controller 9905 generates signals for controlling operation timing of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and supplies the clock signal CLK2 to the above circuits.

In the CPU of this embodiment, a memory circuit having the structure described in any of the above embodiments is provided in the register 9906. The register controller 9907 determines, in response to an instruction from the ALU 9901, whether a data signal is held in the volatile memory section 101 or a date signal is held in the nonvolatile memory section 102 in the memory circuit in the register 9906. When holding date by the volatile memory section 101 is selected, the power is supplied to the memory circuit in the register 9906. When holding date by the nonvolatile memory section 102 is selected, the supply of power to the memory circuit in the register 9906 can be stopped.

In such a manner, even in the case where the operation of the CPU is temporarily stopped and the supply of power is stopped, a data signal can be held and power consumption can be reduced. Specifically, for example, the operation of the CPU can be stopped while an user of a personal computer does not input a data signal to an input device such as a keyboard, so that the power consumption can be reduced.

Although the example of the CPU is described in this embodiment, the signal processing unit of the present invention is not limited to the CPU and can be applied to an LSI such as a microprocessor, an image processing circuit, a digital signal processor (DSP), or a field programmable gate array (FPGA).

This embodiment can be implemented in appropriate combination with any of the above embodiments.

(Embodiment 5)

This embodiment describes a method for manufacturing the memory circuit 100, specifically, the second transistor 122 whose channel is formed in silicon, the first transistor 121 whose channel is formed in an oxide semiconductor layer, and the first capacitor 123 in the nonvolatile memory section 102 in FIG. 2.

Figure 12A:
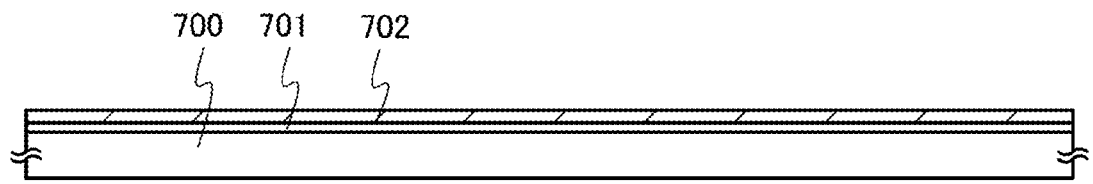
FIGS. 12A to 12D are diagrams showing a process for fabricating the memory circuit.

As illustrated in FIG. 12A, an insulating film 701 and a semiconductor film 702 that has been separated from a single crystal semiconductor substrate are formed over a substrate 700.

Although there is no particular limitation on a material which can be used as the substrate 700, the material needs to have at least heat resistance high enough to withstand the subsequent heat treatment. For example, a glass substrate formed by a fusion process or a float process, a quartz substrate, a semiconductor substrate, a ceramic substrate, or the like can be used as the substrate 700. In the case where the temperature for the subsequent heat treatment is high, a glass substrate whose strain point is greater than or equal to 730° C. is preferably used as the glass substrate.

This embodiment now describes a method for forming the second transistor 122, in which the semiconductor film 702 is supposed to be composed of single crystal silicon. Note that a specific example of a method for forming the single crystal semiconductor film 702 is briefly described. First, an ion beam including ions which are accelerated by an electric field enters a bond substrate which is the single crystal semiconductor substrate and an embrittlement layer which is made fragile by local disorder of the crystal structure is formed in a region at a certain depth from a surface of the bond substrate. The depth at which the embrittlement layer is formed can be adjusted by the acceleration energy of the ion beam and the angle at which the ion beam enters. Then, the bond substrate and the substrate 700 which is provided with the insulating film 701 are attached to each other so that the insulating film 701 is provided therebetween. After the bond substrate and the substrate 700 overlap with each other, a pressure of approximately 1 N/cm$^2$ to 500 N/cm$^2$, preferably 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, so that microvoids that exist in the fragile layer are combined and the microvoids increase in volume. Consequently, a single crystal semiconductor film which is part of the bond substrate is separated from the bond substrate along the embrittlement layer. The heat treatment is performed at temperatures not exceeding the strain point of the substrate 700. Then, the single crystal semiconductor film is processed into a desired shape by etching or the like to form the semiconductor film 702.

In order to control the threshold voltage, an impurity element producing p-type conductivity, such as boron, aluminum, or gallium, or an impurity element producing n-type conductivity, such as phosphorus or arsenic, may be added to the semiconductor film 702. An impurity element for controlling the threshold voltage may be added to the semiconductor film which is not patterned or may be added to the patterned semiconductor film 702. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not patterned or the patterned semiconductor film 702 in order to finely control the threshold voltage.

Although this embodiment describes the case where a single crystal semiconductor film is used, the present invention is not limited to this. For example, a polycrystalline, microcrystalline, or amorphous semiconductor film which is formed over the insulating film 701 by vapor deposition may be used. Alternatively, the semiconductor film may be crystallized by a known technique. Examples of known crystallization technique include laser crystallization using a laser beam, and crystallization with a catalytic element. Alternatively, crystallization with a catalytic element and laser crystallization may be combined. When a heat-resistant substrate such as a quartz substrate is used, crystallization combined with thermal crystallization with an electrically heated oven, lamp annealing crystallization with infrared light, crystallization with a catalytic element, or high-temperature annealing at approximately 950° C., may be used.

Figure 12B:
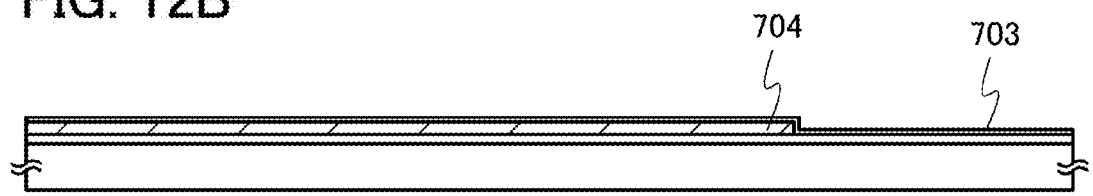

Next, as shown in FIG. 12B, a semiconductor layer 704 is formed based on the semiconductor film 702. Then, a gate insulating film 703 is formed over the semiconductor layer 704.

The gate insulating film 703 can be a single layer or a stack of layers containing silicon oxide, silicon nitride oxide, silicon oxynitride, silicon nitride, hathium oxide, aluminum oxide, tantalum oxide, yttrium oxide, hafnium silicate (Hf-$Si_xO_y$, (x>0, y>0)), hathium silicate (HfSi$_x$O$_y$, (x>0, y>0)) to which nitrogen is added, hathium aluminate (HfAl$_x$O$_y$, (x>0, y>0)) to which nitrogen is added, or the like by, for example, plasma CVD or sputtering.

Note that, in this specification, an oxynitride refers to a material containing a larger amount of oxygen than that of nitrogen, and a nitride oxide compound refers to a material containing a larger amount of nitrogen than that of oxygen.

The thickness of the gate insulating film 703 can be, for example, greater than or equal to 1 nm and less than or equal to 100 nm, preferably greater than or equal to 10 nm and less than or equal to 50 nm. In this embodiment, a single-layer insulating film containing silicon oxide is used as the gate insulating film 703 by plasma CVD.

Figure 12C:
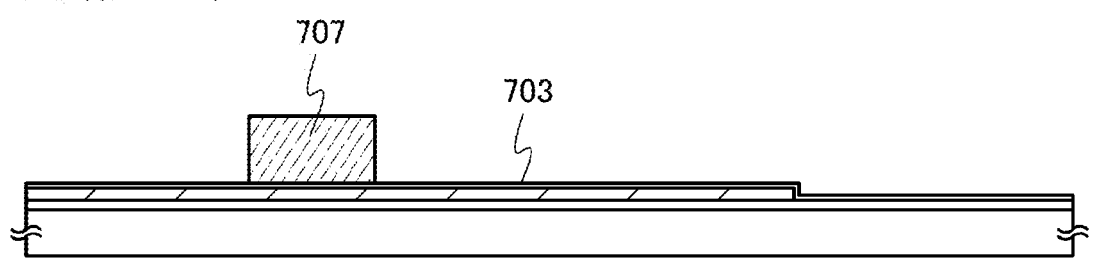

Then, a gate electrode 707 is formed as shown in FIG. 12C.

To form the gate electrode 707, a conductive film is formed and then is processed (patterned) into a predetermined shape. The conductive film can be formed by CVD, sputtering, vapor deposition, spin coating, or the like. The conductive film is composed of tantalum (Ta), tungsten (W), titanium (Ti), molybdenum (Mo), aluminum (Al), copper (Cu), chromium (Cr), niobium (Nb), or the like. Alternatively, the conductive film may be composed of an alloy mainly of any of these metals, or a compound of any of these metals. Alternatively, the conductive film may be composed of a semiconductor such as polycrystalline silicon doped with an impurity element such as phosphorus which imparts conductivity to the semiconductor film.

Although the gate electrode 707 and the conductive film 708 are composed of a single-layer conductive film in this embodiment, this embodiment is not limited to this structure. The gate electrode 707 and the conductive film 708 may be a stack of a plurality of conductive films.

An example of the combination of two conductive films is a stack of a tantalum nitride or tantalum layer overlaid by a tungsten layer. Other examples of the combination include the combination of tungsten nitride and tungsten, the combination of molybdenum nitride and molybdenum, the combination of aluminum and tantalum, and the combination of aluminum and titanium. Since tungsten and tantalum nitride have high heat resistance, a heat treatment aimed at thermal activation can be performed in the subsequent steps after forming the two conductive films. Other examples of the combination of the two conductive films include the combination of nickel silicide and silicon doped with an impurity element producing n-type conductivity, and the combination of tungsten silicide and silicon doped with an impurity element producing n-type conductivity.

In the case where a stack of three conductive films is used, the stack is preferably composed of a molybdenum film, an aluminum film, and a molybdenum film.

The gate electrode 707 can be a light-transmitting oxide conductive film of indium oxide, an alloy of indium oxide and tin oxide, an alloy of indium oxide and zinc oxide, zinc oxide, zinc aluminum oxide, zinc aluminum oxynitride, zinc gallium oxide, or the like.

Alternatively, the gate electrode 707 may be selectively formed by a droplet discharge method without a mask. A droplet discharge method refers to a method for forming a predetermined pattern by discharge or ejection of a droplet containing a predetermined composition from an orifice, and includes an inkjet method in its category.

In addition, the gate electrode 707 may be formed by the following process. A conductive film is formed and then is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to be tapered in a desired shape. The taper angle and the like can be adjusted also by the shape of a mask. Note that the etching gas can be, as appropriate, a chlorine-based gas such as chlorine, boron chloride, silicon chloride, or carbon tetrachloride; a fluorine-based gas such as carbon tetrafluoride, sulfur fluoride, or nitrogen fluoride; or oxygen.

Figure 12D:
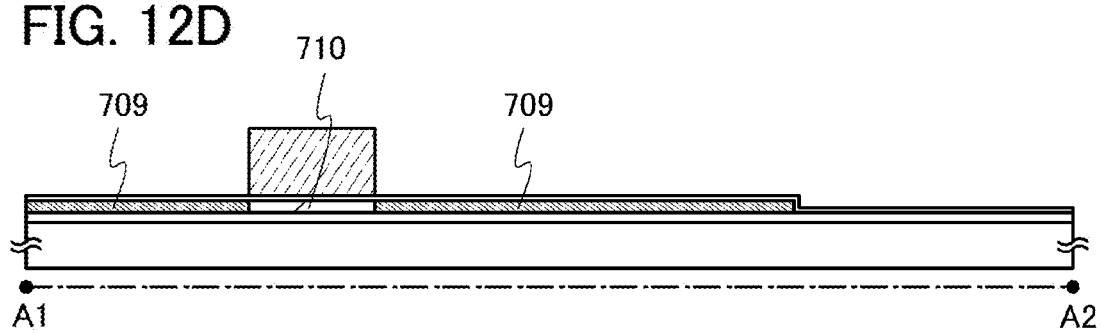

Next, as illustrated in FIG. 12D, by adding an impurity element producing one conductivity to the semiconductor film 702 with the gate electrode 707 used as a mask, a channel formation region 710 overlapping with the gate electrode 707, and a pair of impurity regions 709 between which the channel formation region 710 is provided are formed in the semiconductor film 702.

This embodiment takes the case where an impurity element producing p-type conductivity (e.g., boron) is added to the semiconductor film 702, as an example.

Figure 13A:
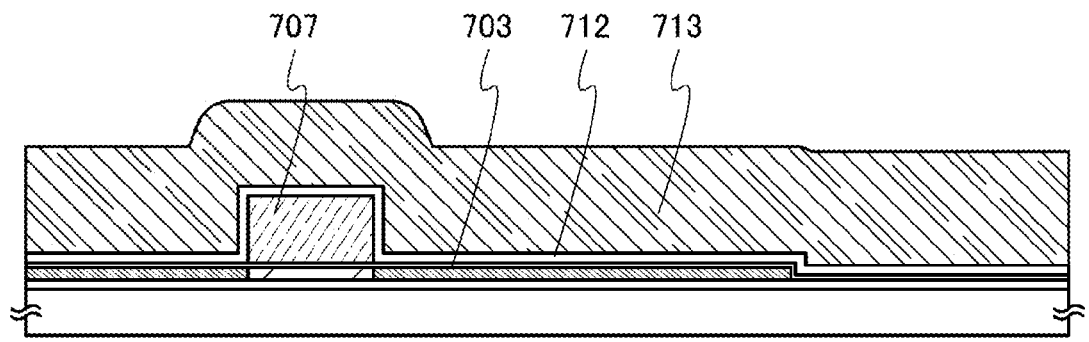
FIGS. 13A to 13C are diagrams showing the process for fabricating the memory circuit.

Next, as illustrated in FIG. 13A, insulating films 712 and 713 are formed so as to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. The insulating films 712 and 713 are preferably composed of a low dielectric constant (low-k) material to sufficiently reduce capacitance due to overlapping electrodes or wires. Note that a porous insulating film containing such a material may be used as the insulating films 712 and 713. Because the porous insulating film has lower dielectric constant than a dense insulating layer, parasitic capacitance due to electrodes or wires can be further reduced.

This embodiment describes the case where silicon oxynitride is used for the insulating film 712 and silicon nitride oxide is used for the insulating film 713, as an example. Although this embodiment describes the case where the insulating films 712 and 713 are formed over the gate electrode 707 and the conductive film 708 as an example, in one embodiment of the present invention, either a single insulating film or a stack of three or more insulating films may be formed over the gate electrode 707 and the conductive film 708.

Figure 13B:
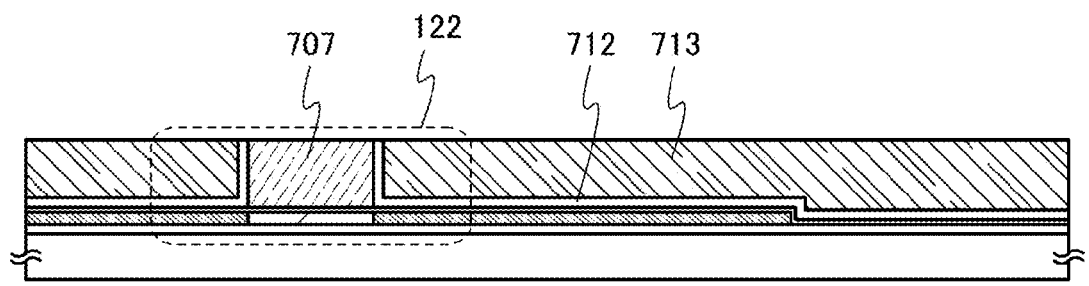

Next, as illustrated in FIG. 13B, the insulating film 713 is subjected to CMP (chemical mechanical polishing) or etching to planarize the exposed upper surfaces of the gate electrode 707 and the conductive film 708. Note that in order to improve the characteristics of a first transistor 121 subsequently formed, surfaces of the insulating films 712 and 713 are preferably made as flat as possible.

The transistor 122 can be formed by the above process.

Figure 13C:
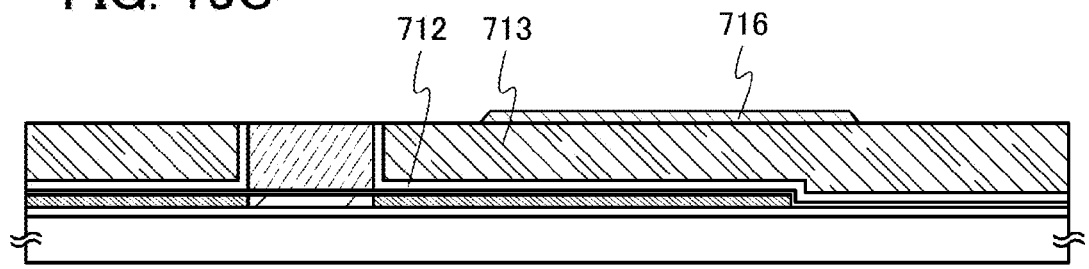

Next, a method for manufacturing the first transistor 121 is described. First, as illustrated in FIG. 13C, an oxide semiconductor layer 716 is formed over the insulating film 712 or the insulating film 713.

The oxide semiconductor layer 716 can be formed by processing an oxide semiconductor film formed over the insulating film 713 into a desired shape. The thickness of the oxide semiconductor film is greater than or equal to 2 nm and less than or equal to 200 nm, preferably greater than or equal to 3 nm and less than or equal to 50 nm, more preferably greater than or equal to 3 nm and less than or equal to 20 nm. The oxide semiconductor film is deposited by sputtering with an oxide semiconductor target. The oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust attached to the surface of the insulating film 713 is preferably removed by reverse sputtering in which an argon gas is introduced and plasma is generated. The reverse sputtering refers to a method in which a voltage is applied to a substrate by using an RF power source in an argon atmosphere to generate plasma in the vicinity of the substrate to modify a surface without application of voltage to a target. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

Examples of the material for the oxide semiconductor film include, as described above, quaternary metal oxides such as an In—Sn—Ga—Zn—O-based oxide semiconductors; ternary metal oxides such as In—Ga—Zn—O-based oxide semiconductors, In—Sn—Zn—O-based oxide semiconductors, In—Al—Zn—O-based oxide semiconductors, Sn—Ga—Zn—O-based oxide semiconductors, Al—Ga—Zn—O-based oxide semiconductors, and Sn—Al—Zn—O-based oxide semiconductors; binary metal oxides such as In—Zn—O-based oxide semiconductors, Sn—Zn—O-based oxide semiconductors, Al—Zn—O-based oxide semiconductors, Zn—Mg—O-based oxide semiconductors, Sn—Mg—O-based oxide semiconductors, In—Mg—O-based oxide semiconductors, and In—Ga—O-based oxide semiconductors; In—O-based oxide semiconductors; Sn—O-based oxide semiconductors; and Zn—O-based oxide semiconductors.

In this embodiment, as the oxide semiconductor film, an In—Ga—Zn—O-based oxide semiconductor thin film with a thickness of 30 nm, which is obtained by sputtering using a target including indium (In), gallium (Ga), and zinc (Zn), is used. The target has a composition ratio, for example, of In:Ga:Zn=1:1:0.5, In:Ga:Zn=1:1:1, or In:Ga:Zn=1:1:2. The filling rate of the target including In, Ga, and Zn ranges from 90% to 100%, preferably from 95% to 100%. The target with high filling rate enables the deposited oxide semiconductor film to be dense.

In this embodiment, the oxide semiconductor film is formed in such a manner that the substrate is held in a treatment chamber kept at reduced pressure, a sputtering gas from which hydrogen and moisture are removed is introduced into the treatment chamber while remaining moisture therein is removed, and the above target is used. The substrate temperature may range from 100° C. to 600° C., preferably from 200° C. to 400° C. for the deposition. By depositing the oxide semiconductor film while heating the substrate, the concentration of impurities contained in the deposited oxide semiconductor film can be reduced. In addition, damage by sputtering can be reduced. In order to remove residual moisture in the treatment chamber, an entrapment vacuum pump is preferably used. A cryopump, an ion pump, or a titanium sublimation pump, for example, is preferably used. The evacuation unit may be a turbo pump provided with a cold trap. In the treatment chamber which is evacuated with the cryopump, for example, a hydrogen atom, a compound containing a hydrogen atom, such as water ($H_2O$), (preferably, also a compound containing a carbon atom), and the like are removed, so that the concentration of impurities contained in the oxide semiconductor film deposited in the treatment chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power supply is preferable because dust generated in deposition can be reduced and the film thickness can be made uniform.

Moreover, when the leakage rate of the treatment chamber of the sputtering apparatus is set to lower than or equal to $1 \times 10^{-10}$ Pa·m³/second, entry of impurities such as an alkali metal or hydride into the oxide semiconductor film that is being formed by sputtering can be reduced. Further, with the use of an entrapment vacuum pump as an exhaustion system, counter flow of impurities, such as alkali metal, hydrogen atoms, hydrogen molecules, water, a hydroxyl group, or hydride, from the exhaustion system can be reduced.

When the purity of the target is set to 99.99% or higher, alkali metal, hydrogen atoms, hydrogen molecules, water, a hydroxyl group, hydride, or the like mixed to the oxide semiconductor film can be reduced. In addition, when the target is used, the concentration of alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature for the preheating is higher than or equal to 100° C. and lower than or equal to 400° C., preferably higher than or equal to 150° C. and lower than or equal to 300° C. As an evacuation means, a cryopump is preferably provided in the preheating chamber. Note that this preheating treatment can be omitted. This preheating may be similarly performed on the substrate 700 over which conductive films 719 and 720 are formed before the deposition of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

A resist mask used for forming the oxide semiconductor layer 716 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that attaches onto surfaces of the oxide semiconductor layer 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms donor levels and thus serves as an impurity in the oxide semiconductor. In one embodiment of the present invention, in order to reduce impurities such as moisture or hydrogen in the oxide semiconductor film (dehydration or dehydrogenation), the oxide semiconductor layer 716 is preferably subjected to heat treatment in a reduced pressure atmosphere, an inert gas atmosphere of nitrogen, a rare gas, or the like, an oxygen gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) method).

By subjection the island-shaped oxide semiconductor layer 716 to heat treatment, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for approximately three minutes to six minutes. When RTA is used for the heat treatment, dehydration or dehydrogenation can be performed in a short time; thus, treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Note that it has been pointed out that an oxide semiconductor is insensitive to impurities, there is no problem when a considerable amount of metal impurities is contained in the film, and therefore, soda-lime glass which contains a large amount of alkali metal such as sodium and is inexpensive can also be used (Kamiya, Nomura, and Hosono, "Engineering application of solid state physics: Carrier transport properties and electronic structures of amorphous oxide semiconductors: the present status", *KOTAI BUTSURI* (*SOLID STATE PHYSICS*), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes $Na^+$ when an insulating film in contact with the oxide semiconductor layer is an oxide and Na diffuses into the insulating layer. In addition, in the oxide semiconductor layer, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor layer is very low. Therefore, when the hydrogen concentration in the oxide semiconductor layer is less than or equal to $1 \times 10^{18}$ atoms/cm$^3$, preferably less than or equal to $1 \times 10^{17}$ atoms/cm$^3$, the concentration of the above impurity is preferably reduced. Specifically, a measurement value of a Na concentration by secondary ion mass spectrometry is preferably less than or equal to $5 \times 10^{16}$ atoms/cm$^3$, more preferably less than or equal to $1 \times 10^{16}$ atoms/cm$^3$, still more preferably less than or equal to $1 \times 10^{15}$ atoms/cm$^3$. In a similar manner, a measurement value of a Li concentration is preferably less than or equal to $5 \times 10^{15}$ atoms/cm$^3$, more preferably less than or equal to $1 \times 10^{15}$ atoms/cm$^3$. In a similar manner, a measurement value of a K concentration is preferably less than or equal to $5 \times 10^{15}$ atoms/cm$^3$, more preferably less than or equal to $1 \times 10^{15}$ atoms/cm$^3$.

Through the above steps, the concentration of hydrogen in the oxide semiconductor layer can be reduced and the oxide semiconductor layer can be purified. Thus, the oxide semiconductor layer can be stabilized. In addition, the heat treatment at a temperature of lower than or equal to the glass transition temperature makes it possible to form an oxide semiconductor layer with a wide bandgap and a very low carrier density due to hydrogen. Therefore, the transistor can be manufactured using a large-sized substrate, so that the productivity can be increased. In addition, with the purified oxide semiconductor layer in which the hydrogen concentration is reduced, a transistor with high withstand voltage and a very low off-state current can be manufactured. The above heat treatment can be performed at any time after the oxide semiconductor layer is formed.

Note that the oxide semiconductor layer may be either amorphous or crystalline. The crystalline oxide semiconductor layer is preferably composed of an oxide semiconductor having c-axis alignment (also called c-axis aligned crystalline oxide semiconductor (CAAC-OS)) to offer the advantage of high reliability of the transistor.

Specifically, a CAAC-OS is a non-single-crystal semiconductor that has atoms arranged to form a triangular, hexagonal, equilateral triangular, or regular hexagonal shape when seen from a direction perpendicular to an a-b plane. Moreover, the CAAC-OS has a phase in which metal atoms are layered in the c-axis direction or a phase in which metal atoms and oxygen atoms are layered in the c-axis direction.

In a CAAC-OS, metal atoms and oxygen atoms are bonded in an orderly manner in comparison with an amorphous oxide semiconductor. That is to say, in the case where an oxide semiconductor is amorphous, the coordination numbers might vary between various metal atoms, but the coordination numbers of metal atoms are almost the same as each other in the CAAC-OS. Therefore, microscopic defects of oxygen can be reduced and instability and moving of charge that are due to attachment and detachment of hydrogen atoms (including hydrogen ions) or alkali metal atoms can be reduced.

For this reason, a transistor composed of an oxide semiconductor film composed of a CAAC-OS, so that the amount of shift of the threshold voltage of the transistor, which occurs after light irradiation and a bias-temperature (BT) stress test are performed on the transistor, can be reduced. Consequently, a transistor having stable electric characteristics can be formed.

An oxide semiconductor film composed of a CAAC-OS can also be formed by Sputtering. In order to obtain a CAAC-OS by sputtering, it is important that hexagonal crystals be formed in the initial stage of deposition of an oxide semiconductor film and other crystals grow on the hexagonal crystals serving as seed crystals. To achieve this, it is preferable that the distance between the target and the substrate be long (e.g., 150 mm to 200 mm) and the substrate heating temperature be 100° C. to 500° C., more preferably 200° C. to 400° C., still more preferably 250° C. to 300° C.

The proportion of oxygen gas in atmosphere is preferably set high when an oxide semiconductor film composed of a CAAC-OS is deposited by sputtering. For sputtering in an argon-oxygen gas mixture, for example, the proportion of oxygen gas is preferably set 30% or more, more preferably 40% or more. This is because supply of oxygen from atmosphere promotes the crystallization of the CAAC-OS.

When an oxide semiconductor film composed of a CAAC-OS is deposited by sputtering, a substrate over which the oxide semiconductor film is deposited is heated preferably to 150° C. or more, more preferably to 170° C. or more. This is because the higher the substrate temperature, the more the crystallization of the CAAC-OS is promoted.

After being subjected to heat treatment in a nitrogen atmosphere or in vacuum, the oxide semiconductor film composed of a CAAC-OS is preferably subjected to heat treatment in an oxygen atmosphere or a gas mixture of oxygen and another gas. This is because oxygen deficiency due to the former heat treatment can be corrected by supply of oxygen from atmosphere in the latter heat treatment.

A film surface on which the oxide semiconductor film composed of a CAAC-OS (deposition surface) is deposited is preferably flat. This is because irregularity of the deposition surface provides grain boundaries in the oxide semiconductor film composed of a CAAC-OS because the c-axis approximately perpendicular to the deposition surface exists in the oxide semiconductor film composed of a CAAC-OS. For this reason, the deposition surface is preferably subjected to planarization such as chemical mechanical polishing (CMP) before the oxide semiconductor film composed of a CAAC-OS is formed. The average roughness of the deposition surface is preferably 0.5 nm or less, more preferably 0.3 nm or less.

Figure 14A:
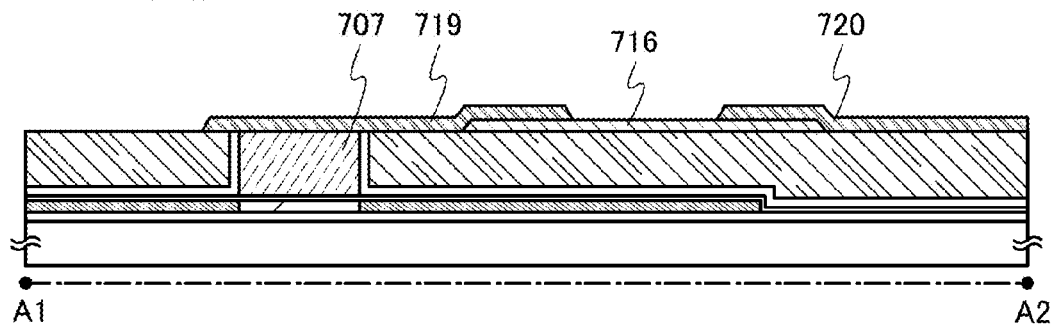
FIGS. 14A to 14C are diagrams showing the process for fabricating the memory circuit.

Then, as illustrated in FIG. 14A, the conductive film 719 which is in contact with the gate electrode 707 and the oxide semiconductor layer 716, and the conductive film 720 which is in contact with the oxide semiconductor layer 716 are formed. The conductive films 719 and 720 function as a source and drain electrodes.

Specifically, the conductive films 719 and 720 can be formed in such a manner that a conductive film is formed so as to cover the gate electrode 707 and the insulating film 713 by sputtering or a vacuum vapor deposition method and then is processed (patterned) into a predetermined shape.

As the conductive film which serves as the conductive films 719 and 720, any of the following materials can be used: an element selected from aluminum, chromium, copper, tantalum, titanium, molybdenum, or tungsten; an alloy including any of these elements; an alloy film containing the above elements in combination; and the like. Alternatively, a structure may be employed in which a film of a refractory metal such as chromium, tantalum, titanium, molybdenum, or tungsten is stacked over or below a metal film of aluminum or copper. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesiveness with an oxide film. Therefore, for the conductive films 719 and 720, a layered structure is employed in which a conductive film containing a Cu—Mg—Al alloy, a Mo—Ti alloy, Ti, or Mo is used for the lower layer and a conductive film containing Cu is used for the upper layer; thus, the adhesiveness between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, an alloy of indium oxide and tin oxide, an alloy of indium oxide and zinc oxide, or the conductive metal oxide material containing silicon or silicon oxide can be used.

In the case where heat treatment is performed after formation of the conductive film, the conductive film preferably has heat resistance enough to withstand the heat treatment.

Note that each material and etching conditions are adjusted as appropriate so that the oxide semiconductor layer 716 is not removed as much as possible at the time of etching the conductive film. Depending on the etching conditions, an exposed portion of the oxide semiconductor layer 716 is partly etched, so that a groove (a depression portion) is formed in some cases.

In this embodiment, a titanium film is used for the conductive film. Therefore, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing chlorine (Cl$_2$), boron chloride (BCl$_3$), or the like.

In order to reduce the number of photomasks and steps in a photolithography step, etching may be performed with the use of a resist mask composed of a multi-tone mask which is a light-exposure mask through which light is transmitted so as to have a plurality of intensities. A resist mask composed of a multi-tone mask has a plurality of thicknesses and can be changed in shape by etching; thus, the resist mask can be used in a plurality of etching processes for processing films into different patterns. Therefore, a resist mask corresponding to at least two kinds or more of different patterns can be formed by one multi-tone mask. Thus, the number of light-exposure masks can be reduced and the number of corresponding photolithography steps can be also reduced, so that simplification of a process can be realized.

Further, an oxide conductive film functioning as a source region and a drain region may be provided between the oxide semiconductor layer 716 and the conductive films 719 and 720 functioning as source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the conductive films 719 and 720 may be performed concurrently.

With provision of the oxide conductive film functioning as a source region and a drain region, resistance between the oxide semiconductor layer 716 and the conductive films 719 and 720 can be lowered, so that the transistor can operate at high speed. In addition, with provision of the oxide conductive film functioning as a source region and a drain region, the withstand voltage of the transistor can be increased.

Next, plasma treatment may be performed using a gas such as N$_2$O, N$_2$, or Ar. By this plasma treatment, water or the like adhering to an exposed surface of the oxide semiconductor layer is removed. Plasma treatment may be performed using a mixture gas of oxygen and argon as well.

Figure 14B:
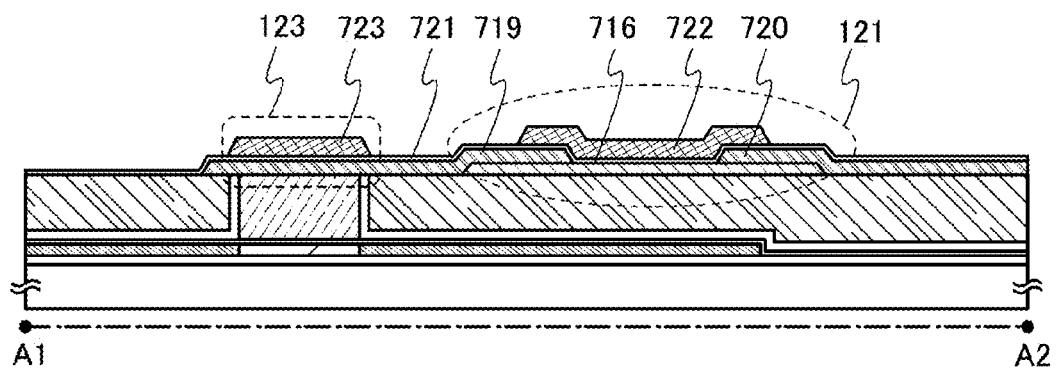

After the plasma treatment, as illustrated in FIG. 14B, the gate insulating film 721 is formed so as to cover the conductive films 719 and 720 and the oxide semiconductor layer 716. Then, a gate electrode 722 is formed over the gate insulating film 721 so as to overlap with the oxide semiconductor layer 716, and a conductive film 723 is formed over the conductive film 719 so as to overlap with the conductive film 719.

The gate insulating film 721 can be composed of a material and a layered structure which are similar to those of the gate insulating film 703. Note that the gate insulating film 721 preferably includes impurities such as moisture or hydrogen as little as possible, and the gate insulating film 721 may be composed of a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, so that the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen such as a silicon oxide film or a silicon oxynitride film is formed on a side which is closer to the oxide semiconductor layer 716 than the insulating film having a high barrier property. Then, the insulating film having a high barrier property is formed so as to overlap with the conductive films 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a silicon nitride film with a thickness of 100 nm formed by sputtering is stacked over a silicon oxide film with a thickness of 200 nm formed by sputtering is formed. The substrate temperature at deposition may be higher than or equal to room temperature and lower than or equal to 300° C. and in this embodiment, is 100° C.

After the gate insulating film 721 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. It is preferable that the water content in the gas be 20 ppm or less, preferably 1 ppm or less, further preferably 10 ppb or less. In this embodiment, for example, heat treatment is performed at 250° C. in a nitrogen atmosphere for one hour. Alternatively, RTA treatment for a short time at a high temperature may be performed before the formation of the conductive films 719 and 720 in a manner similar to that of the heat treatment performed on the oxide semiconductor film for reduction of moisture or hydrogen. Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric composition can be satisfied. As a result, the oxide semiconductor layer 716 can be substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment at the time of formation of a resin film or heat treatment for lowering the resistance of a transparent conductive film), the oxide semiconductor layer 716 can be made to be substantially intrinsic without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed, for example, at a temperature higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. Alternatively, the purity of the oxygen gas which is introduced into the heat treatment apparatus is preferably greater than or equal to 6N (99.9999%) or more, further preferably greater than or equal to 7N (99.99999%) (that is, the impurity concentration in the oxygen gas is less than or equal to 1 ppm, preferably less than or equal to 0.1 ppm).

Alternatively, oxygen may be added to the oxide semiconductor layer 716 by an ion implantation method, an ion doping method, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in such a manner that a conductive film is formed over the gate insulating film 721 and then is patterned. The gate electrode 722 and the conductive film 723 can be composed of the same material as that of the gate electrode 707 and the conductive films 719 and 720 and have the same layered structure as that of the gate electrode 707 and the conductive films 719 and 720.

The thickness of each of the gate electrode 722 and the conductive film 723 is 10 nm to 400 nm, preferably 100 nm to 200 nm. In this embodiment, after a conductive film with a thickness of 150 nm for the gate electrode is formed by a sputtering using a tungsten target, the conductive film is processed (patterned) into a desired shape by etching, so that the gate electrode 722 and the conductive film 723 are formed. Note that a resist mask may be formed by an inkjet method. Formation of the resist mask by an inkjet method needs no photomask; thus, manufacturing cost can be reduced.

Through the above steps, the first transistor 121 is formed.

Note that a portion where the conductive film 719 and the conductive film 723 overlap with each other with the gate insulating film 721 provided therebetween corresponds to a first capacitor 123.

Although the first transistor 121 is described as a single-gate transistor, a multi-gate transistor including a plurality of channel formation regions can be formed when a plurality of gate electrodes which are electrically connected are included when needed.

Note that an insulating film which is in contact with the oxide semiconductor layer 716 (in this embodiment, corresponding to the gate insulating film 721) may be composed of an insulating material containing an element that belongs to Group 13 and oxygen. By using such an insulating material containing a Group 13 element for the insulating film in contact with the oxide semiconductor layer, an interface with the oxide semiconductor layer can keep a favorable state.

An insulating material containing a Group 13 element refers to an insulating material containing one or more elements that belong to Group 13. As the insulating material containing a Group 13 element, a gallium oxide, an aluminum oxide, an aluminum gallium oxide, a gallium aluminum oxide, and the like are given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, in the case of forming an insulating film in contact with an oxide semiconductor layer containing gallium, a material including gallium oxide may be used as an insulating film, so that favorable characteristics can be kept at the interface between the oxide semiconductor layer and the insulating film. When the oxide semiconductor layer and the insulating film containing gallium oxide are provided in contact with each other, pileup of hydrogen at the interface between the oxide semiconductor layer and the insulating film can be reduced, for example. Note that a similar effect can be obtained in the case where an element in the same group as a constituent element of the oxide semiconductor is used in an insulating film. For example, it is effective to form an insulating film with the use of a material including aluminum oxide. Note that aluminum oxide has a property of not easily transmitting water. Thus, it is preferable to use a material including aluminum oxide in terms of preventing entry of water to the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is composed of gallium oxide, the composition of gallium oxide can be set to be $Ga_2O_X$ (X=3+a, 0<a<1) by heat treatment in an oxygen atmosphere or oxygen doping.

In the case where the insulating film which is in contact with the oxide semiconductor layer 716 is composed of aluminum oxide, the composition of aluminum oxide can be set to be $Al_2O_X$ (X=3+a, 0<a<1) by heat treatment in an oxygen atmosphere or oxygen doping.

In the case where the insulating film which is in contact with the oxide semiconductor layer 716 is composed of gallium aluminum oxide (aluminum gallium oxide), the composition of gallium aluminum oxide (aluminum gallium oxide) can be set to be $Ga_XAl_{2-X}O_{3+a}$ (0<X<2, 0<a<1) by heat treatment in an oxygen atmosphere or oxygen doping.

By oxygen doping, an insulating film which includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be formed to an intrinsic or substantially intrinsic oxide semiconductor.

The insulating film including a region where the proportion of oxygen is higher than that in the stoichiometric composition may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films which are in contact with the oxide semiconductor layer 716. The above effect can be enhanced with a structure where the oxide semiconductor layer 716 is provided between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both composed of gallium oxide whose composition is $Ga_2O_x$ (x=3+a, 0<a<1). Alternatively, one of the insulating films on the upper side and the lower side may be composed of $Ga_2O_x$ (x=3+a, 0<a<1) and the other may be composed of aluminum oxide whose composition is $Al_2O_x$ (x=3+a, 0<a<1).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ (X=3+a, 0<a<1) is formed and gallium aluminum oxide (aluminum gallium oxide) whose composition is $Ga_xAl_{2-x}O_{3+a}$ (0<X<2, 0<a<1) may be formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 14C:
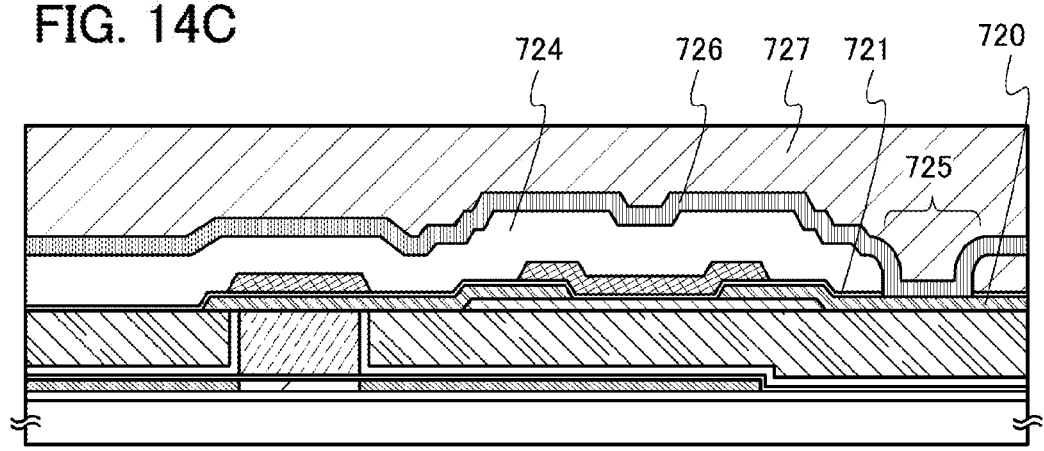

Next, as illustrated in FIG. 14C, an insulating film 724 is formed so as to cover the gate insulating film 721, and the gate electrode 722. The insulating film 724 can be formed by PVD, CVD, or the like. The insulating film 724 can be composed of a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by PVD or CVD and then is patterned, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film (with a thickness of about 5 nm) is formed in a region including the opening of the insulating film 724 by a PVD method and then, an aluminum film is formed so as to be embedded in the opening 725. Here, the titanium film formed by a PVD method has a function of reducing an oxide film (e.g., a native oxide film) formed on a surface over which the titanium film is formed, to decrease the contact resistance with the lower electrode or the like (here, the conductive film 720). In addition, hillock of aluminum film can be prevented. A copper film may be formed by a plating method after the formation of the barrier film of titanium, titanium nitride, or the like.

The conductive film 720 is made in contact with the wiring 726 in the following process. After the conductive film 720 is formed, an opening is formed in the gate insulating film 721 and the insulating film 724. Then, the wiring 726 is formed.

Next, an insulating film 727 is formed so as to cover the wiring 726. Through the series of steps, the memory circuit can be manufactured.

Note that in the manufacturing method, the conductive films 719 and 720 functioning as source and drain electrodes are formed after the formation of the oxide semiconductor layer 716. Thus, as illustrated in FIG. 14B, in the first transistor 121 obtained by the manufacturing method, the conductive films 719 and 720 are formed over the oxide semiconductor layer 716. However, in the first transistor 121, the conductive films functioning as source and drain electrodes may be formed below the oxide semiconductor layer 716, that is, between the oxide semiconductor layer 716 and the insulating films 712 and 713.

Figure 15:
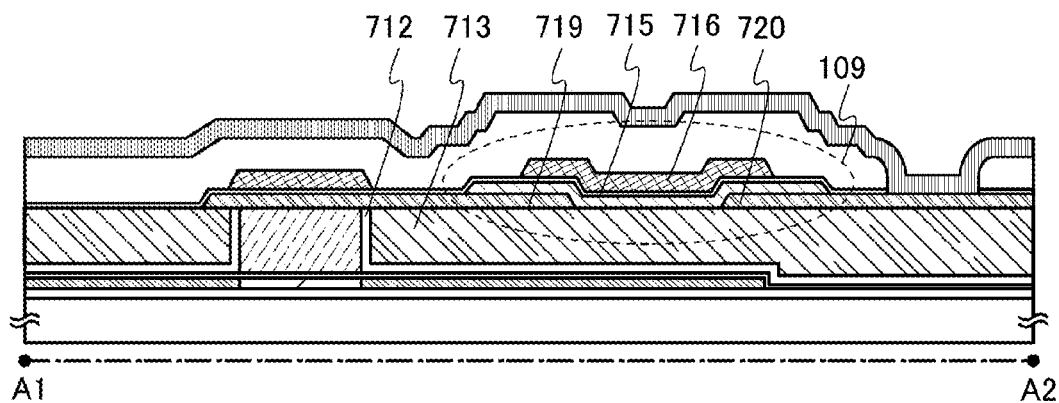
FIG. 15 is a cross-sectional view of the memory circuit.

FIG. 15 illustrates a cross-sectional view of a memory cell at the time when the conductive films 719 and 720 functioning as source and drain electrodes are provided between the oxide semiconductor layer 716 and the insulating films 712 and 713. The first transistor 121 illustrated in FIG. 15 can be obtained in such a manner that the conductive films 719 and 720 are formed after the formation of the insulating film 713, and then, the oxide semiconductor layer 716 is formed.

This embodiment can be implemented in appropriate combination with any of the above embodiments.

This embodiment describes a transistor that includes an oxide semiconductor layer and has a different structure from the transistors according to Embodiment 5.

Figure 16A:
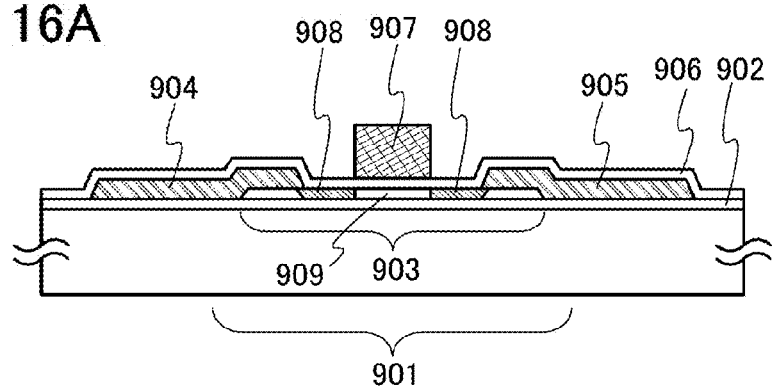
FIGS. 16A to 16D are cross-sectional views of transistors whose channel is formed in an oxide semiconductor layer.

A transistor 901 shown in FIG. 16A includes an oxide semiconductor layer 903 that serves as an active layer and is formed over an insulating film 902; a source electrode 904 and a drain electrode 905 formed over the oxide semiconductor layer 903; a gate insulating film 906 over the oxide semiconductor layer 903, the source electrode 904, and the drain electrode 905; and a gate electrode 907 that is over the gate insulating film 906 and overlaps with the oxide semiconductor layer 903.

The transistor 901 shown in FIG. 16A has a top-gate structure where the gate electrode 907 is formed over the oxide semiconductor layer 903 and has a top-contact structure where the source electrode 904 and the drain electrode 905 are formed over the oxide semiconductor layer 903. In the transistor 901, the source electrode 904 and the drain electrode 905 do not overlap with the gate electrode 907. In other words, there is a space, which is larger than the thickness of the gate insulating film 906, between the source electrode 904 and the gate electrode 907 and between the drain electrode 905 and the gate electrode 907. Thus, the transistor 901 has low parasitic capacitance between the source electrode 904 and the gate electrode 907 and between the drain electrode 905 and the gate electrode 907, thereby achieving high-speed operation.

The oxide semiconductor layer 903 includes a pair of heavily-doped regions 908 obtained by adding a dopant producing n-type conductivity to the oxide semiconductor layer 903 after the gate electrode 907 is formed. A region of the oxide semiconductor layer 903 which overlaps with the gate electrode 907 with the gate insulating film 906 interposed therebetween is a channel formation region 909. In the oxide semiconductor layer 903, the channel formation region 909 is formed between the pair of heavily-doped regions 908. The dopant is added to the heavily-doped regions 908 by ion implantation. The dopant is, for example, a rare gas such as helium, argon, or xenon, or a group 15 element such as nitrogen, phosphorus, arsenic, or antimony.

For example, in the case where nitrogen is used as the dopant, the concentration of nitrogen atoms in the high-concentration regions 908 is preferably higher than or equal to $5\times10^{19}/cm^3$ and lower than or equal to $1\times10^{22}/cm^3$.

The high-concentration regions 908 to which the dopant producing n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be decreased.

In the case where an In—Ga—Zn—O-based oxide semiconductor is used for the oxide semiconductor layer 903, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source electrode 904 and the drain electrode 905 can be decreased. Note that in order to effectively decrease the resistance between the source electrode 904 and the drain electrode 905 by forming an oxide semiconductor having a wurtzite crystal structure, in the case of using nitrogen as the dopant, the concentration of nitrogen atoms in the high-concentration regions 908 is preferably higher than or equal to $1\times10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 903 may be composed of a CAAC-OS. The oxide semiconductor layer 903 composed of a CAAC-OS has a higher conductivity than that of an amorphous oxide semiconductor layer; thus, the resistance between the source electrode 904 and the drain electrode 905 can be decreased.

By decreasing the resistance between the source electrode 904 and the drain electrode 905, high on-state current and high-speed operation can be ensured even when the transistor 901 is miniaturized. With the miniaturization of the transistor 901, the area occupied by the memory circuit including the transistor can be reduced and the storage capacity per unit area can be increased.

Figure 16B:
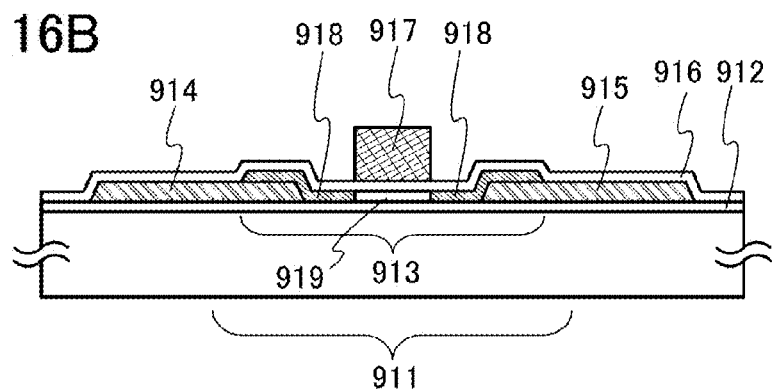

A transistor 911 illustrated in FIG. 16B includes a source electrode 914 and a drain electrode 915 formed over an insulating film 912; an oxide semiconductor layer 913 which is formed over the source electrode 914 and the drain electrode 915 and functions as an active layer; a gate insulating film 916 over the oxide semiconductor layer 913, and the source electrode 914 and the drain electrode 915; and a gate electrode 917 which is provided over the gate insulating film 916 so as to overlap with the oxide semiconductor layer 913.

The transistor 911 illustrated in FIG. 16B is of a top-gate type where the gate electrode 917 is formed over the oxide semiconductor layer 913, and is also of a bottom-contact type where the source electrode 914 and the drain electrode 915 are formed below the oxide semiconductor layer 913. In the transistor 911, the source electrode 914 and the drain electrode 915 do not overlap with the gate electrode 917 as in the transistor 901; thus, the parasitic capacitance generated between the gate electrode 917 and each of the source electrode 914 and the drain electrode 915 can be small, so that high speed operation can be achieved.

The oxide semiconductor layer 913 includes a pair of high-concentration regions 918 which are obtained by addition of dopant producing n-type conductivity to the oxide semiconductor layer 913 after formation of the gate electrode 917. Further, the oxide semiconductor layer 913 includes a channel formation region 919 which overlaps with the gate electrode 917 with the gate insulating film 916 interposed therebetween. In the oxide semiconductor layer 913, the channel formation region 919 is provided between the pair of high-concentration regions 918.

Like the above-described high-concentration regions 908 included in the transistor 901, the high-concentration regions 918 can be formed by an ion implantation method. Examples of the kinds of a dopant used to form the high-concentration regions 908 are the same as those of the kinds of a dopant used to form the high-concentration regions 918.

For example, in the case where nitrogen is used as the dopant, the concentration of nitrogen atoms in the high-concentration regions 918 is preferably higher than or equal to $5\times10^{19}/cm^3$ and lower than or equal to $1\times10^{22}/cm^3$.

The high-concentration regions 918 to which the dopant producing n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

In the case where an In—Ga—Zn—O-based oxide semiconductor is used for the oxide semiconductor layer 913, heat treatment is performed at a temperature higher than or equal to 300° C. and lower than or equal to 600° C. after nitrogen is added. Consequently, the oxide semiconductor in the high-concentration regions 918 has a wurtzite crystal structure. Since the oxide semiconductor in the high-concentration regions 918 has a wurtzite crystal structure, the conductivity of the high-concentration regions 918 can be further increased and the resistance between the source electrode 914 and the drain electrode 915 can be decreased. Note that in order to effectively decrease the resistance between the source electrode 914 and the drain electrode 915 by forming an oxide semiconductor having a wurtzite crystal structure, in the case of using nitrogen as the dopant, the concentration of nitrogen atoms in the high-concentration regions 918 is preferably higher than or equal to $1\times10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 913 may be composed of a CAAC-OS. The oxide semiconductor layer 913 composed of a CAAC-OS has a higher conductivity than that of an amorphous oxide semiconductor layer; thus, the resistance between the source electrode 914 and the drain electrode 915 can be decreased.

By decreasing the resistance between the source electrode 914 and the drain electrode 915, high on-state current and high-speed operation can be ensured even when the transistor 911 is miniaturized. With the miniaturization of the transistor 911, the area occupied by the memory circuit including the transistor can be reduced and the storage capacity per unit area can be increased.

Figure 16C:
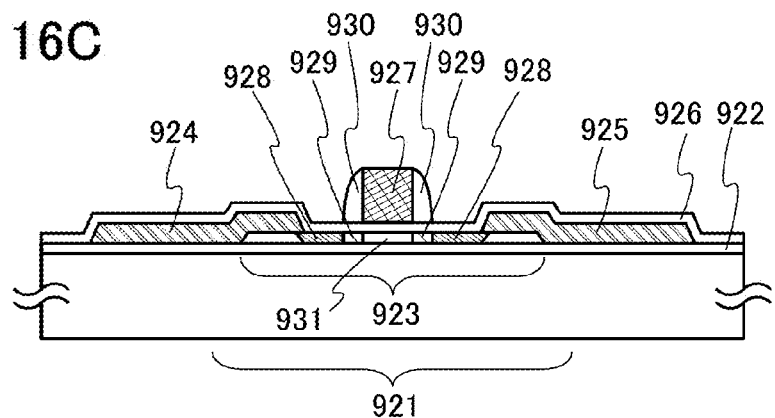

A transistor 921 illustrated in FIG. 16C includes an oxide semiconductor layer 923 which is formed over an insulating film 922 and functions as an active layer; a source electrode 924 and a drain electrode 925 formed over the oxide semiconductor layer 923; a gate insulating film 926 over the oxide semiconductor layer 923, and the source electrode 924 and the drain electrode 925; and a gate electrode 927 which is provided over the gate insulating film 926 so as to overlap with the oxide semiconductor layer 923. In addition, the transistor 921 includes a sidewall 930 which is composed of an insulating film and is provided on a side surface of the gate electrode 927.

The transistor 921 illustrated in FIG. 16C is of a top-gate type where the gate electrode 927 is formed over the oxide semiconductor layer 923, and is also of a top-contact type where the source electrode 924 and the drain electrode 925 are formed over the oxide semiconductor layer 923. In the transistor 921, the source electrode 924 and the drain electrode 925 do not overlap with the gate electrode 927 as in the transistor 901; thus, the parasitic capacitance generated between the gate electrode 927 and each of the source electrode 924 and the drain electrode 925 can be small, so that high speed operation can be achieved.

The oxide semiconductor layer 923 includes a pair of high-concentration regions 928 and a pair of low-concentration regions 929 which are obtained by addition of dopant producing n-type conductivity to the oxide semiconductor layer 923 after formation of the gate electrode 927. Further, the oxide semiconductor layer 923 includes a channel formation region 931 which overlaps with the gate electrode 927 with the gate insulating film 926 interposed therebetween. In the oxide semiconductor layer 923, the channel formation region 931 is provided between the pair of low-concentration regions 929 which are provided between the pair of high-concentration regions 928. The pair of low-concentration regions 929 is provided in a region which is in the oxide semiconductor layer 923 and overlaps with the sidewall 930 with the gate insulating film 926 interposed therebetween.

Like the above-described high-concentration regions 908 included in the transistor 901, the high-concentration regions 928 and the low-concentration regions 929 can be formed by an ion implantation method. Examples of the kinds of a dopant used to form the high-concentration regions 908 are the same as those of the kinds of a dopant used to form the high-concentration regions 928.

For example, in the case where nitrogen is used as the dopant, the concentration of nitrogen atoms in the high-concentration regions 928 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 929 is preferably higher than or equal to $5 \times 10^{18}/cm^3$ and lower than $5 \times 10^{19}/cm^3$.

The high-concentration regions 928 to which the dopant producing n-type conductivity is added have higher conductivity than the other regions in the oxide semiconductor layer 923. Therefore, by providing the high-concentration regions 928 in the oxide semiconductor layer 923, the resistance between the source electrode 924 and the drain electrode 925 can be decreased. The low-concentration regions 929 are provided between the channel formation region 931 and the high-concentration regions 928, so that a negative shift of the threshold voltage due to a short-channel effect can be reduced.

In the case where an In—Ga—Zn—O-based oxide semiconductor is used for the oxide semiconductor layer 923, heat treatment is performed at a temperature higher than or equal to 300° C. and lower than or equal to 600° C. after nitrogen is added. Consequently, the oxide semiconductor in the high-concentration regions 928 has a wurtzite crystal structure. Further, depending on the nitrogen concentration, the low-concentration regions 929 also have a wurtzite crystal structure due to the heat treatment. Since the oxide semiconductor in the high-concentration regions 928 has a wurtzite crystal structure, the conductivity of the high-concentration regions 928 can be further increased and the resistance between the source electrode 924 and the drain electrode 925 can be decreased. Note that in order to effectively decrease the resistance between the source electrode 924 and the drain electrode 925 by forming an oxide semiconductor having a wurtzite crystal structure, in the case of using nitrogen as the dopant, the concentration of nitrogen atoms in the high-concentration regions 928 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 923 may be composed of a CAAC-OS. The oxide semiconductor layer 923 composed of a CAAC-OS has a higher conductivity than that of an amorphous oxide semiconductor layer; thus, the resistance between the source electrode 924 and the drain electrode 925 can be decreased.

By decreasing the resistance between the source electrode 924 and the drain electrode 925, high on-state current and high-speed operation can be ensured even when the transistor 921 is miniaturized. With the miniaturization of the transistor 921, the area occupied by a memory circuit including the transistor can be reduced and the storage capacity per unit area of can be increased.

Figure 16D:
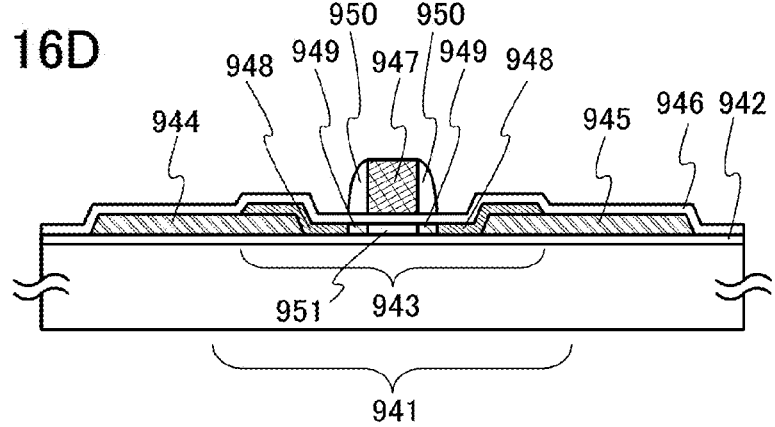

A transistor 941 illustrated in FIG. 16D includes a source electrode 944 and a drain electrode 945 formed over an insulating film 942; an oxide semiconductor layer 943 which is formed over the source electrode 944 and the drain electrode 945 and functions as an active layer; a gate insulating film 946 over the oxide semiconductor layer 943, and the source electrode 944 and the drain electrode 945; and a gate electrode 947 which is provided over the gate insulating film 946 so as to overlap with the oxide semiconductor layer 943. In addition, the transistor 941 includes a sidewall 950 which is composed of an insulating film and is provided on a side surface of the gate electrode 947.

The transistor 941 illustrated in FIG. 16D is of a top-gate type where the gate electrode 947 is formed over the oxide semiconductor layer 943, and is also of a bottom-contact type where the source electrode 944 and the drain electrode 945 are formed below the oxide semiconductor layer 943. In the transistor 941, the source electrode 944 and the drain electrode 945 do not overlap with the gate electrode 947 as in the transistor 901. Therefore, the parasitic capacitance generated between the gate electrode 947 and each of the source electrode 944 and the drain electrode 945 can be small, so that the transistor 941 can operate at high speed.

The oxide semiconductor layer 943 includes a pair of high-concentration regions 948 and a pair of low-concentration regions 949 which are obtained by addition of dopant producing n-type conductivity to the oxide semiconductor layer 943 after formation of the gate electrode 947. Further, the oxide semiconductor layer 943 includes a channel formation region 951 which overlaps with the gate electrode 947 with the gate insulating film 946 interposed therebetween. In the oxide semiconductor layer 943, the channel formation region 951 is provided between the pair of low-concentration regions 949 which are provided between the pair of high-concentration regions 948. The pair of low-concentration regions 949 is provided in a region which is in the oxide semiconductor layer 943 and overlaps with the sidewall 950 with the gate insulating film 946 interposed therebetween.

Like the above-described high-concentration regions 908 included in the transistor 901, the high-concentration regions 948 and the low-concentration regions 949 can be formed by an ion implantation method. Examples of the kinds of a dopant used to form the high-concentration regions 908 are the same as those of the kinds of a dopant used to form the high-concentration regions 948.

For example, in the case where nitrogen is used as the dopant, the concentration of nitrogen atoms in the high-concentration regions 948 is preferably higher than or equal to $5 \times 10^{19}/cm^3$ and lower than or equal to $1 \times 10^{22}/cm^3$. Further, for example, in the case where nitrogen is used as the dopant, the concentration of nitrogen atoms in the low-concentration regions 949 is preferably higher than or equal to $5 \times 10^{18}/cm^3$ and lower than $5 \times 10^{19}/cm^3$.

The high-concentration regions 948 to which the dopant producing n-type conductivity is added have higher conductivity than the other regions in the oxide semiconductor layer 943. Therefore, by providing the high-concentration regions 948 in the oxide semiconductor layer 943, the resistance between the source electrode 944 and the drain electrode 945 can be decreased. The low-concentration regions 949 are provided between the channel formation region 951 and the high-concentration regions 948, so that a negative shift of the threshold voltage due to a short-channel effect can be reduced.

In the case where an In—Ga—Zn—O-based oxide semiconductor is used for the oxide semiconductor layer 943, heat treatment is performed at a temperature higher than or equal to 300° C. and lower than or equal to 600° C. after nitrogen is added. Consequently, the oxide semiconductor in the high-concentration regions 948 has a wurtzite crystal structure. Further, depending on the nitrogen concentration, the low-concentration regions 949 also have a wurtzite crystal structure due to the heat treatment. Since the oxide semiconductor in the high-concentration regions 948 has a wurtzite crystal structure, the conductivity of the high-concentration regions 948 can be further increased and the resistance between the source electrode 944 and the drain electrode 945 can be decreased. Note that in order to effectively decrease the resistance between the source electrode 944 and the drain electrode 945 by forming an oxide semiconductor having a wurtzite crystal structure, in the case of using nitrogen as the dopant, the concentration of nitrogen atoms in the high-concentration regions 948 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 943 may be composed of a CAAC-OS. The oxide semiconductor layer 943 composed of a CAAC-OS has a higher conductivity than that of an amorphous oxide semiconductor layer; thus, the resistance between the source electrode 944 and the drain electrode 945 can be decreased.

By decreasing the resistance between the source electrode 944 and the drain electrode 945, high on-state current and high-speed operation can be ensured even when the transistor 941 is miniaturized. With the miniaturization of the transistor 941, the area occupied by the memory circuit including the transistor can be reduced and the storage capacity per unit area can be increased.

Note that as a method for forming high-concentration regions functioning as a source region and a drain region in a self-aligning process in a transistor including an oxide semiconductor, disclosed is a method in which a surface of an oxide semiconductor layer is exposed and argon plasma treatment is performed so that the resistivity of a region which is exposed to plasma in the oxide semiconductor layer is decreased (S. Jeon et al., "180 nm Gate Length Amorphous InGaZnO Thin Film Transistor for High Density Image Sensor Applications", *IEDM Tech. Dig.*, p. 504-507, 2010).

However, in the above manufacturing method, after a gate insulating film is formed, the gate insulating film needs to be partially removed so that a portion which is to be the source region and the drain region is exposed. Therefore, at the time of removing the gate insulating film, the oxide semiconductor layer which is below the gate insulating film is partially over-etched; thus, the thickness of the portion which is to be the source region and the drain region becomes small. As a result, the resistance of the source region and the drain region is increased, and defects of transistor characteristics due to overetching easily occur.

In order to promote miniaturization of a transistor, a dry etching method with which high processing accuracy can be provided needs to be employed. However, the overetching easily occurs remarkably in the case where a dry etching method with which the selectivity of a gate insulating film to an oxide semiconductor layer is not sufficiently obtained is employed.

For example, the overetching does not become a problem as long as the oxide semiconductor layer has an enough thickness; however, when the channel length is 200 nm or shorter, the thickness of the oxide semiconductor layer in a region which is to be a channel formation region needs to be 20 nm or shorter, preferably 10 nm or shorter so that a short-channel effect can be prevented. When such a thin oxide semiconductor layer is used, the overetching of the oxide semiconductor layer is not preferable because the resistance of the source region and the drain region is increased and defects of transistor characteristics occur as described above.

However, as in one embodiment of the present invention, addition of dopant to an oxide semiconductor layer is performed in the state where a gate insulating film is left so as not to expose the oxide semiconductor; thus, the overetching of the oxide semiconductor layer can be prevented and excessive damage to the oxide semiconductor layer can be reduced. In addition, the interface between the oxide semiconductor layer and the gate insulating film is kept clean. Therefore, the characteristics and reliability of the transistor can be improved.

This embodiment can be implemented in appropriate combination with any of the above embodiments.

(Embodiment 7)

An oxide semiconductor preferably contains at least indium (In) or zinc (Zn). In particular, both In and Zn are preferably contained.

As a stabilizer for reducing variation in electric characteristics of a transistor including the oxide semiconductor, it is preferable that one or more selected from gallium (Ga), tin (Sn), hafnium (Hf), aluminum (Al), or lanthanoid be contained.

As lanthanoid, lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

Examples of unary metal oxides include indium oxides, tin oxides, and zinc oxides.

Examples of binary metal oxides include In—Zn-based oxides, Sn—Zn-based oxides, Al—Zn-based oxides, Zn—Mg-based oxides, Sn—Mg-based oxides, In—Mg-based oxides, and In—Ga-based oxides.

Examples of ternary metal oxides include In—Ga—Zn-based oxides (also referred to as IGZO), In—Sn—Zn-based oxides, Sn—Ga—Zn-based oxides, In—Al—Zn-based oxides, In—Hf—Zn-based oxides, In—La—Zn-based oxides, In—Ce—Zn-based oxides, In—Pr—Zn-based oxides, In—Nd—Zn-based oxides, In—Sm—Zn-based oxides, In—Eu—Zn-based oxides, In—Gd—Zn-based oxides, In—Tb—Zn-based oxides, In—Dy—Zn-based oxides, In—Ho—Zn-based oxides, In—Er—Zn-based oxides, In—Tm—Zn-based oxides, In—Yb—Zn-based oxides, In—Lu—Zn-based oxides, Al—Ga—Zn-based oxides, and Sn—Al—Zn-based oxides.

Examples of quaternary metal oxides include In—Sn—Ga—Zn-based oxides, In—Hf—Ga—Zn-based oxides, In—Al—Ga—Zn-based oxides, In—Sn—Al—Zn-based oxides, In—Sn—Hf—Zn-based oxides, and In—Hf—Al—Zn-based oxides.

Here an In—Ga—Zn-based oxide, for example, refers to an oxide mainly containing In, Ga, and Zn and there is no particular limitation on the ratio of In, Ga, and Zn. An In—Ga—Zn-based oxide may contain another metal element in addition to In, Ga, and Zn.

For example, an In—Ga—Zn-based oxide with an atomic ratio of In:Ga:Zn=1:1:1 (=$1/3$:$1/3$:$1/3$) or In:Ga:Zn=2:2:1 (=$2/5$:$2/5$:$1/5$), or any of oxides whose composition is in the neighborhood of the above compositions can be used.

Alternatively, an In—Sn—Zn-based oxide with an atomic ratio of In:Sn:Zn=1:1:1 (=$1/3$:$1/3$:$1/3$), In:Sn:Zn=2:1:3 (=$1/3$:$1/6$:$1/2$), or In:Sn:Zn=2:1:5 (=$1/4$:$1/8$:$5/8$), or any of oxides whose composition is in the neighborhood of the above compositions may be used.

However, the composition is not limited to those described above, and a material having an appropriate composition may be used depending on needed semiconductor characteristics (e.g., mobility, threshold voltage, and variation). In order to obtain needed semiconductor characteristics, it is preferable that the carrier concentration, the impurity concentration, the defect density, the atomic ratio of a metal element to oxygen, the interatomic distance, the density, and the like be set to appropriate values.

The oxide semiconductor may be either single crystal or non-single-crystal.

In the case where the oxide semiconductor is non-single-crystal, the oxide semiconductor may be either amorphous or polycrystalline. Further, the oxide semiconductor may have a structure including a crystalline portion in an amorphous portion. Note that it is preferable to use non-amorphous because amorphous includes many defects.

This embodiment can be implemented in appropriate combination with any of the above embodiments.

(Embodiment 8)

This embodiment describes a CAAC-OS (c-axis aligned crystalline oxide semiconductor) which has an amorphous portion and a crystalline portion having c-axis alignment.

The CAAC-OS is a novel oxide semiconductor.

The CAAC-OS has c-axis alignment and triangular or hexagonal atomic arrangement when seen from a direction of the a-b plane, a surface, or an interface.

In the CAAC-OS, metal atoms are layered or metal atoms and oxygen atoms are layered along the c-axis.

In the CAAC-OS, among crystal portions, the directions of the a-axis and the directions of the b-axis may be different from those of another crystal portion.

In a broad sense, the CAAC-OS is a non-single-crystal.

In the CAAC-OS, atoms are arranged to form a triangular, hexagonal, regular triangular, or regular hexagonal shape when seen from the direction perpendicular to the a-b plane.

The CAAC-OS is an oxide where metal atoms are arranged in a layered manner or metal atoms and oxygen atoms are arranged in a layered manner when seen from the direction perpendicular to the c-axis direction.

The CAAC-OS is not a single crystal, but this does not mean that the CAAC-OS is composed of only an amorphous component.

Although the CAAC-OS includes a crystallized portion (crystalline portion), a boundary between one crystalline portion and another crystalline portion is not clear in some cases.

The oxygen in the CAAC-OS may be partly replaced by nitrogen.

The c-axes of individual crystalline portions included in the CAAC-OS may be aligned in one direction (e.g., a direction perpendicular to a surface of a substrate over which the CAAC-OS is formed or a surface of the CAAC-OS).

Alternatively, the normals of the a-b planes of the individual crystalline portions included in the CAAC-OS may be aligned in one direction (e.g., a direction perpendicular to a surface of a substrate over which the CAAC-OS is formed or a surface of the CAAC-OS).

The CAAC-OS can be a conductor, a semiconductor, or an insulator depending on its composition or the like. The CAAC-OS transmits or does not transmit visible light depending on its composition or the like.

For example, when the CAAC-OS in a film shape is observed from a direction perpendicular to a surface of the film or a supporting substrate by an electron microscope, a triangular or hexagonal atomic arrangement is observed.

Further, when the cross section of the film is observed by an electron microscope, metal atoms are arranged in a layered manner or metal atoms and oxygen atoms (or nitrogen atoms) are arranged in a layered manner.

An example of a crystal structure of a CAAC-OS will be described with reference to FIGS. 22A to 22E, FIGS. 23A to 23C, and FIGS. 24A to 24C.

In FIGS. 22A to 22E, FIGS. 23A to 23C, and FIGS. 24A to 24C, the vertical direction corresponds to the c-axis direction and a plane perpendicular to the c-axis direction corresponds to the a-b plane.

In this embodiment, the expressions of an "upper half" and a "lower half" refer to an upper half above the a-b plane and a lower half below the a-b plane, respectively.

Figure 22A:
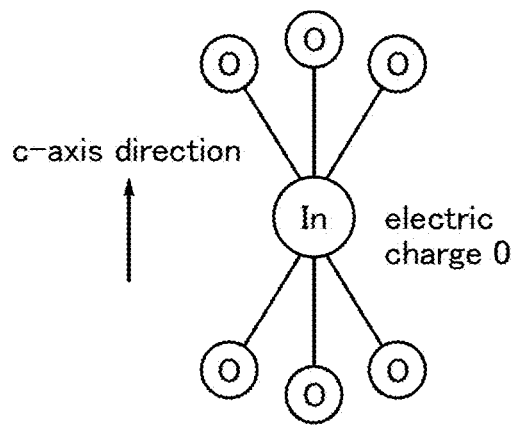
FIGS. 22A to 22E illustrate an example of an oxide semiconductor.

FIG. 22A illustrates a structure A including one hexacoordinate In atom and six tetracoordinate oxygen (hereinafter referred to as tetracoordinate O) atoms proximate to the In atom.

Here, a structure including one metal atom and oxygen atoms proximate thereto is referred to as a small group.

The structure A is actually an octahedral structure, but is illustrated as a planar structure for simplicity.

Note that in the structure A, three tetracoordinate O atoms exist in each of an upper half and a lower half. In the small group in the structure A, electric charge is 0.

Figure 22D:
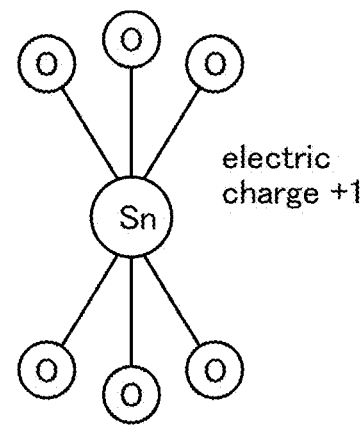
Figure 22B:
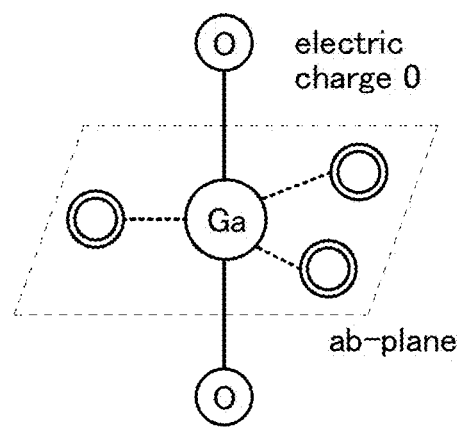

FIG. 22B illustrates a structure B including one pentacoordinate Ga atom, three tricoordinate oxygen (hereinafter referred to as tricoordinate O) atoms proximate to the Ga atom, and two tetracoordinate O atoms proximate to the Ga atom.

All the tricoordinate O atoms exist on the a-b plane. In the structure B, one tetracoordinate O atom exists in each of an upper half and a lower half.

An In atom can also have the structure B because an In atom can have five ligands. In the small group in the structure B, electric charge is 0.

Figure 22E:
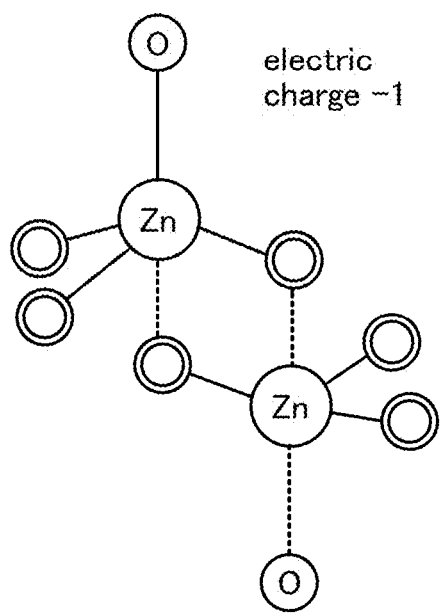
Figure 22C:
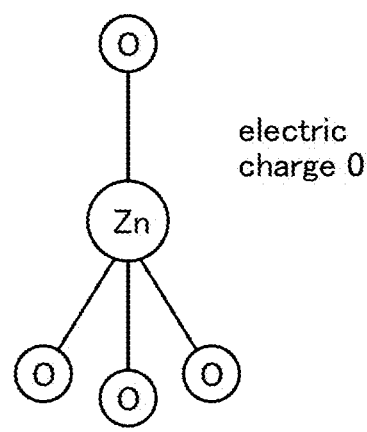

FIG. 22C illustrates a structure C including one tetracoordinate Zn atom and four tetracoordinate O atoms proximate to the Zn atom.

In the structure C, one tetracoordinate O atom exists in an upper half and three tetracoordinate O atoms exist in a lower half In the small group in the structure C, electric charge is 0.

FIG. 22D illustrates a structure D including one hexacoordinate Sn atom and six tetracoordinate O atoms proximate to the Sn atom.

In the structure D, three tetracoordinate O atoms exist in each of an upper half and a lower half.

In the small group in the structure D, electric charge is +1.

FIG. 22E illustrates a structure E including two Zn atoms.

In the structure E, one tetracoordinate O atom exists in each of an upper half and a lower half. In the small group in the structure E, electric charge is −1.

In this embodiment, a plurality of small groups form a medium group, and a plurality of medium groups form a large group (also referred to as a unit cell).

Now, a rule of bonding between the small groups will be described.

The three O atoms in the upper half with respect to the In atom each have three proximate In atoms in the downward direction, and the three O atoms in the lower half each have three proximate In atoms in the upward direction.

The one O atom in the upper half with respect to the Ga atom has one proximate Ga atom in the downward direction, and the one O atom in the lower half has one proximate Ga atom in the upward direction.

The one O atom in the upper half with respect to the Zn atom has one proximate Zn atom in the downward direction, and the three O atoms in the lower half each have three proximate Zn atoms in the upward direction.

In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms.

Since the coordination number of the tetracoordinate O atom is 4, the sum of the number of the metal atoms proximate to and below the O atom and the number of the metal atoms proximate to and above the O atom is 4.

Therefore, when the sum of the number of tetracoordinate O atoms above a metal atom and the number of tetracoordinate O atoms below another metal atom is 4, the two kinds of small groups including the metal atoms can be bonded.

This is because in the case, for example, where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction.

In addition to the above, a medium group can be formed in a different manner by combining a plurality of small groups so that the total electric charge of the layered structure is 0.

FIG. 23A illustrates a model of a medium group A included in a layered structure of an In—Sn—Zn-based material.

FIG. 23B illustrates a large group B including three medium groups.

Note that FIG. 23C illustrates an atomic arrangement in the case where the layered structure in FIG. 23B is observed from the c-axis direction.

In the medium group A, a tricoordinate O atom is omitted, only the number of tetracoordinate O atoms is shown.

For example, three tetracoordinate O atoms existing in each of an upper half and a lower half with respect to a Sn atom are denoted by circled 3.

Similarly, in the medium group A, one tetracoordinate O atom existing in each of an upper half and a lower half with respect to an In atom is denoted by circled 1.

In addition, the medium group A illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group A included in the layered structure of the In—Sn—Zn-based material, in the order starting from the top, a Sn atom proximate to three tetracoordinate O atoms in each of an upper half and a lower half is bonded to an In atom proximate to one tetracoordinate O atom in each of an upper half and a lower half.

The In atom is bonded to a Zn atom proximate to three tetracoordinate O atoms in an upper half.

The Zn atom is bonded to an In atom proximate to three tetracoordinate O atoms in each of an upper half and a lower half through one tetracoordinate O atom in a lower half with respect to the Zn atom.

That In atom is bonded to a small group that includes two Zn atoms and that is proximate to one tetracoordinate O atom in an upper half.

The small group is bonded to a Sn atom proximate to three tetracoordinate O atoms in each of an upper half and a lower half through one tetracoordinate O atom in a lower half with respect to the small group.

A plurality of such medium groups are bonded, so that a large group is formed.

Here, electric charge for one bond of a tricoordinate O atom and electric charge for one bond of a tetracoordinate O atom can be assumed to be −0.667 and −0.5, respectively.

For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Therefore, electric charge in a small group including a Sn atom is +1.

Therefore, electric charge of −1, which cancels +1, is needed to form a layered structure including a Sn atom.

As a structure having electric charge of −1, the small group including two Zn atoms as shown in the structure E can be given.

For example, with one small group including two Zn atoms, electric charge of one small group including a Sn atom can be cancelled, so that the total electric charge of the layered structure can be 0.

When the large group B is repeated, an In—Sn—Zn-based crystal ($In_2SnZn_3O_8$) can be obtained.

A layered structure of the obtained In—Sn—Zn-based crystal can be expressed as a composition formula, $In_2SnZn_2O_7(ZnO)_m$ (m is 0 or a natural number).

The variable m is preferably large because the larger the variable m, the higher the crystallinity of the In—Sn—Zn—O-based crystal.

The same applies to the case where an oxide semiconductor used is not In—Sn—Zn-based one.

For example, FIG. 9A illustrates a model of a medium group L included in a layered structure of an In—Sn—Zn-based material.

In the medium group L included in the layered structure of the In—Ga—Zn-based material, in the order starting from the top, an In atom proximate to three tetracoordinate O atoms in each of an upper half and a lower half is bonded to a Zn atom proximate to one tetracoordinate O atom in an upper half.

The Zn atom is bonded to a Ga atom proximate to one tetracoordinate O atom in each of an upper half and a lower half through three tetracoordinate O atoms in a lower half with respect to the Zn atom.

The Ga atom is bonded to an In atom proximate to three tetracoordinate O atoms in each of an upper half and a lower half through one tetracoordinate O atom in a lower half with respect to the Ga atom.

A plurality of such medium groups are bonded, so that a large group is formed.

Figure 24A:
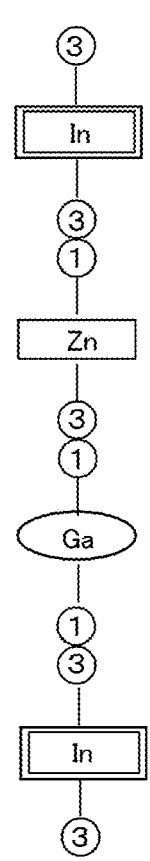
FIGS. 24A to 24C illustrate an example of an oxide semiconductor.
Figure 24B:
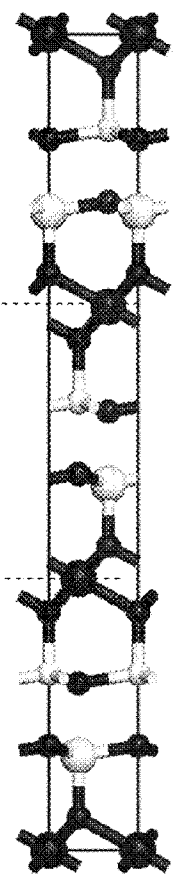

FIG. 24B illustrates a large group M including three medium groups.

Figure 24C:
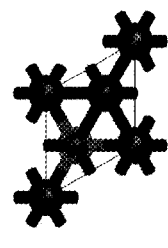

Note that FIG. 24C illustrates an atomic arrangement in the case where the layered structure in FIG. 24B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0.

As a result, the total electric charge of a medium group having a combination of such small groups is always 0.

In order to form the layered structure of the In—Ga—Zn-based material, a large group can be composed of not only the medium group L but also a medium group in which the arrangement of the In atom, the Ga atom, and the Zn atom is different from that of the medium group L.

This embodiment can be implemented in appropriate combination with any of the above embodiments.

The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility is expressed by Formula 1.

$$\mu = \mu_0 \exp\left(-\frac{E}{kT}\right) \quad \text{[Formula 1]}$$

E represents the height of the potential barrier, k represents the Boltzmann constant, and T represents the absolute temperature.

When the potential barrier is assumed to be attributed to a defect, the height of the potential barrier is expressed by Formula 2 according to the Levinson model.

$$E = \frac{e^2 N^2}{8\varepsilon n} = \frac{e^3 N^2 t}{8\varepsilon C_{ox} V_g} \quad \text{[Formula 2]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region is expressed by Formula 3.

$$I_d = \frac{W\mu V_g V_d C_{ox}}{L} \exp\left(-\frac{E}{kT}\right) \quad \text{[Formula 3]}$$

Here, L represents the channel length and W represents the channel width, and L and W are each 10 μm.

In addition, $V_d$ represents the drain voltage.

When dividing both sides of Formula 3 by $V_g$ and then taking logarithms of both sides, Formula 4 can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad \text{[Formula 4]}$$

The right side of Formula 3 is a function of $V_g$.

From Formula 4, it is found that average defect density N can be obtained from the slope of a line in which ln ($I_d/V_g$) is the ordinate and $1/V_g$ is the abscissa.

That is, average defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1 \times 10^{12}/\text{cm}^2$.

On the basis of average defect density obtained in this manner, or the like, $\mu_0$ can be calculated to be 120 cm²/Vs.

The measured mobility of an In—Sn—Zn oxide including defects is approximately 35 cm²/Vs.

However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating film affects the transport property of the transistor. In other words, the mobility $\mu_1$ at a position that is distance x away from the interface between the channel and the gate insulating film is expressed by Formula 5.

$$\frac{1}{\mu_1} = \frac{1}{\mu_0} + \frac{D}{B}\exp\left(-\frac{x}{G}\right) \quad \text{[Formula 5]}$$

D represents the electric field in the gate direction, and B and G are constants. B and G can be obtained from actual measurement results, and according to the above measurement results, B is 4.75×10⁷ cm/s and G is 10 nm (the depth to which the influence of interface scattering reaches).

When D is increased (i.e., when the gate voltage is increased), the second term of the right side of Formula 5 is increased, so that the mobility $\mu_1$ is decreased.

Figure 25:
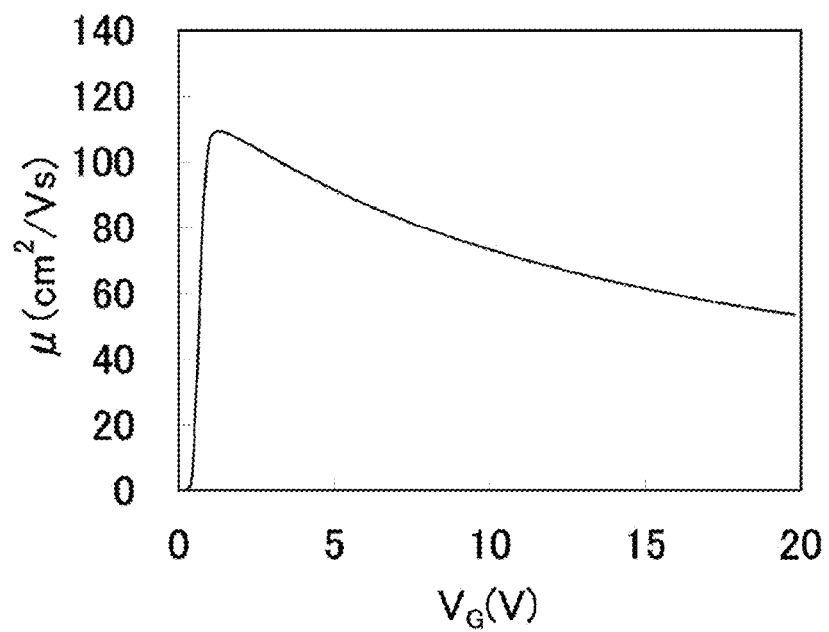
FIG. 25 shows a relation between gate voltage and field-effect mobility.

Calculation results of the mobility $\mu_2$ of a transistor whose channel includes an ideal oxide semiconductor without a defect inside the semiconductor are shown in FIG. 25.

Note that for the calculation, software, Sentaurus Device manufactured by Synopsys, Inc. was used.

For the calculation, the band gap, the electron affinity, the relative permittivity, and the thickness of the oxide semiconductor were assumed to be 2.8 eV, 4.7 eV, 15, and 15 nm, respectively.

These values were obtained by measuring a thin film that was formed by sputtering.

Further, the work functions of a gate, a source, and a drain were assumed to be 5.5 eV, 4.6 eV, and 4.6 eV, respectively.

The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown by the calculation result E, the mobility has a peak of more than 100 cm²/Vs at a gate voltage that is a little over 1 V and is decreased as the gate voltage becomes higher because the influence of interface scattering is increased.

Note that in order to reduce interface scattering, it is preferable that a surface of the semiconductor layer be flat at the atomic level (atomic layer flatness).

Characteristics of minute transistors which are manufactured using an oxide semiconductor having such a mobility were calculated.

Note that in the oxide semiconductor layer included in the transistor used for the calculation, a channel formation region is provided between a pair of n-type semiconductor regions.

The calculation was performed under the condition that the each resistivity of the pair of n-type semiconductor regions is $2 \times 10^{-3}$ Ωcm.

The calculation was performed under the condition that the channel length is 33 nm and the channel width is 40 nm.

A sidewall is formed on the side surface of the gate electrode.

The calculation was performed under the condition that part of the semiconductor region which overlaps with the sidewall is an offset region.

For the calculation, software, Sentaurus Device manufactured by Synopsys, Inc. was used.

Figure 26A:
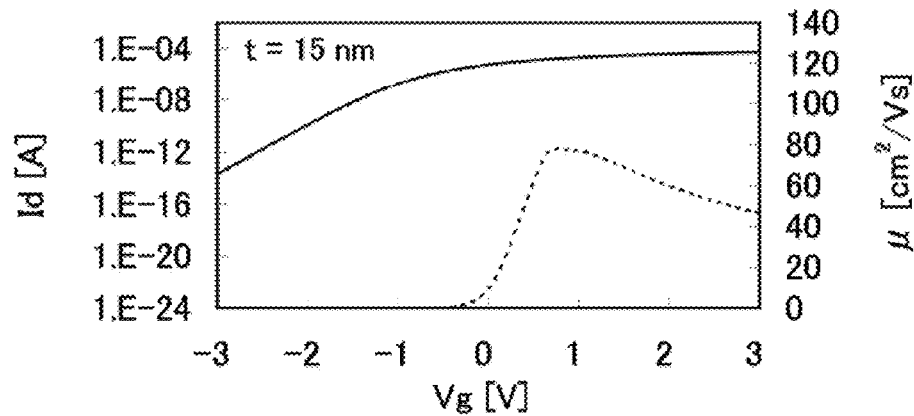
FIGS. 26A to 26C each show a relation between gate voltage and drain current.
Figure 26B:
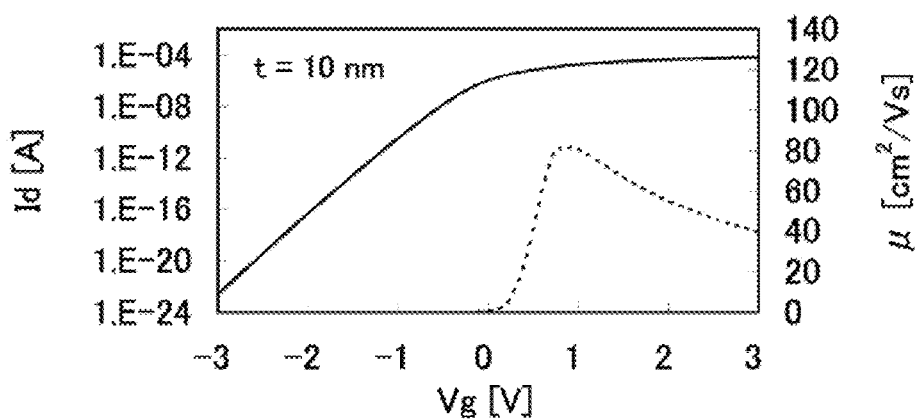
Figure 26C:
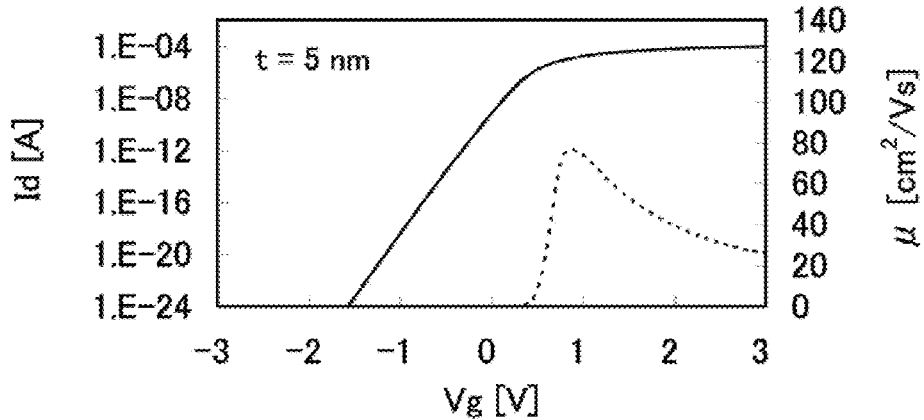

FIGS. 26A to 26C are calculation results of the gate voltage ($V_g$: a potential difference between the gate and the source) dependence of the drain current ($I_d$, solid line) and the mobility (u, dotted line) of the transistor.

The drain current $I_d$ is obtained by calculation under the condition that the drain voltage (a potential difference between the drain and the source) is +1 V and the mobility μ is obtained by calculation under the condition that the drain voltage is +0.1 V.

FIG. 26A shows the calculation result under the condition that the thickness of the gate insulating film is 15 nm.

FIG. 26B shows the calculation result under the condition that the thickness of the gate insulating film is 10 nm.

FIG. 26C shows the calculation result under the condition that the thickness of the gate insulating film is 5 nm.

As the gate insulating film is thinner, the drain current $I_d$ (off-state current) particularly in an off state is significantly decreased.

In contrast, there is no noticeable change in the peak value of the mobility μ and the drain current $I_d$ (on-state current) in an on state.

Figure 27A:
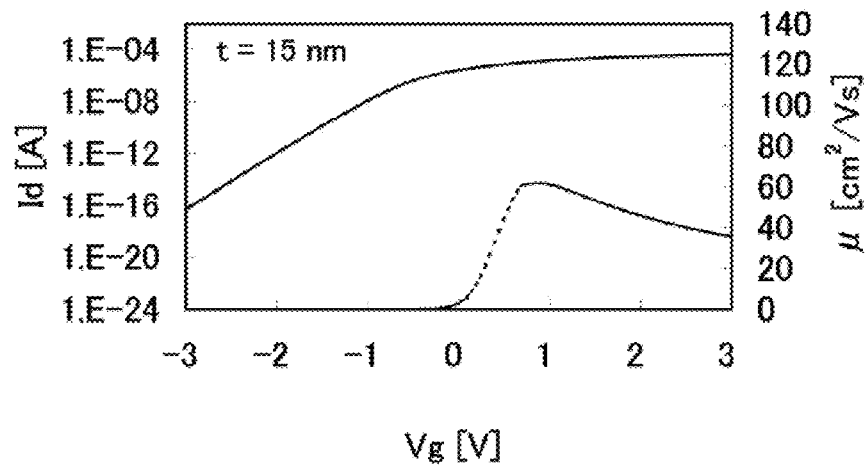
FIGS. 27A to 27C each show a relation between gate voltage and drain current.
Figure 27B:
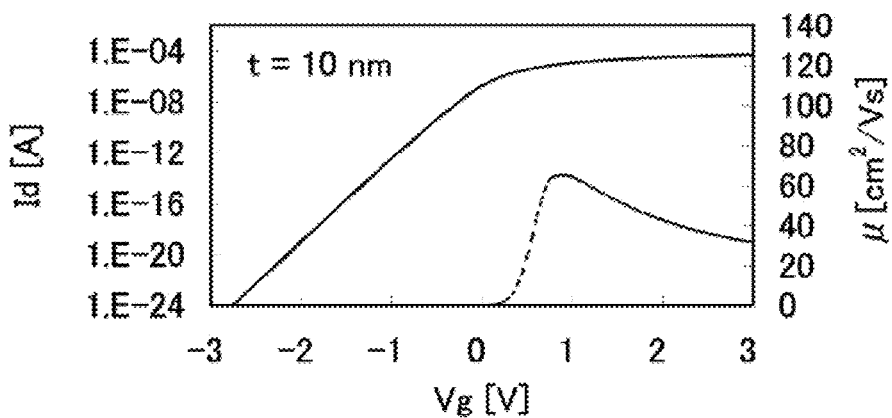
Figure 27C:
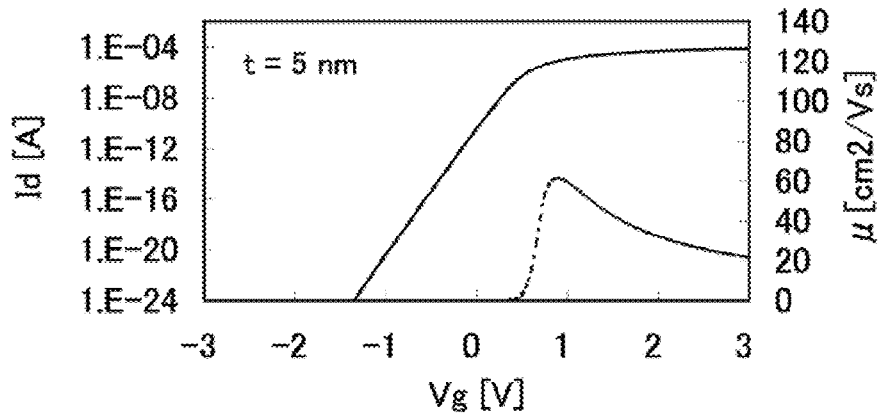

FIGS. 27A to 27C show the gate voltage $V_g$ dependence of the drain current $I_d$ (solid line) and the mobility μ (dot line) in the case where the offset length (sidewall length) $L_{off}$ is 5 nm.

The drain current $I_d$ is obtained by calculation under the condition that the drain voltage is +1 V and the mobility μ is obtained by calculation under the condition that the drain voltage is +0.1 V.

FIG. 27A shows the calculation result under the condition that the thickness of the gate insulating film is 15 nm.

FIG. 27B shows the calculation result under the condition that the thickness of the gate insulating film is 10 nm.

FIG. 27C shows the calculation result under the condition that the thickness of the gate insulating film is 5 nm.

Figure 28A:
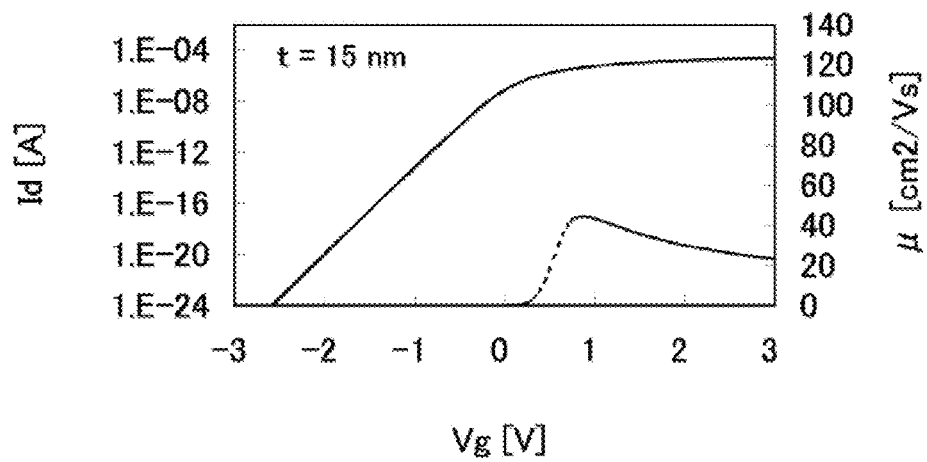
FIGS. 28A to 28C each show a relation between gate voltage and drain current.
Figure 28B:
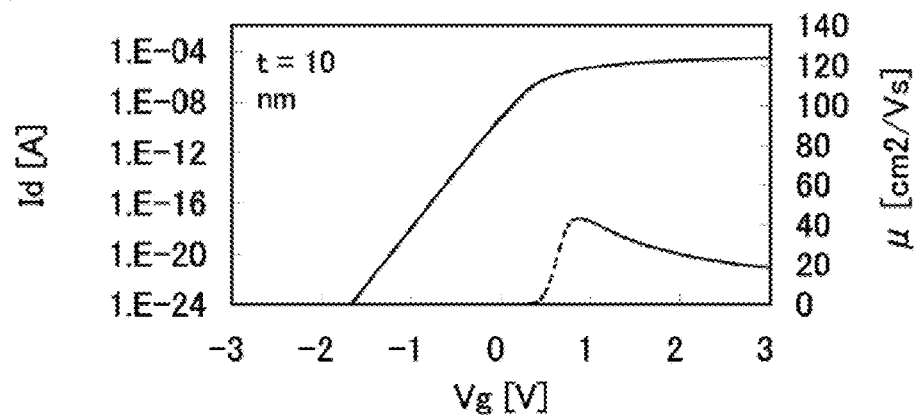
Figure 28C:
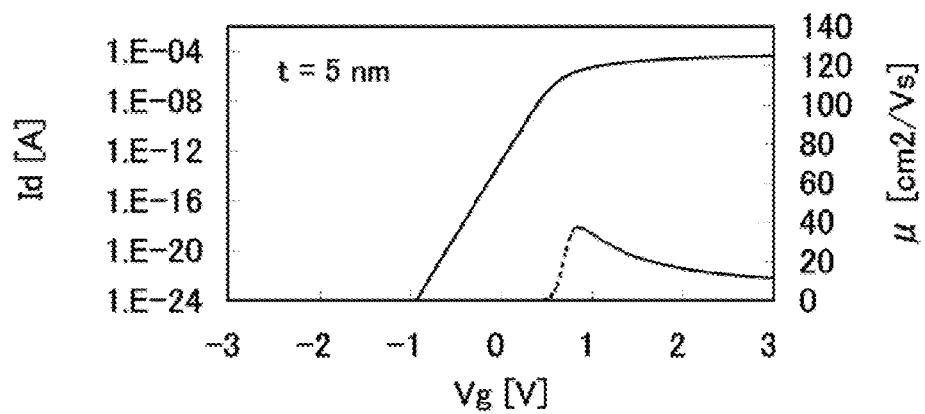

FIGS. 28A to 28C show the gate voltage dependence of the drain current $I_d$ (solid line) and the mobility μ (dot line) in the case where the offset length (sidewall length) $L_{off}$ is 15 nm.

The drain current $I_d$ is obtained by calculation under the condition that the drain voltage is +1 V and the mobility μ is obtained by calculation under the condition that the drain voltage is +0.1 V.

FIG. 28A shows the calculation result under the condition that the thickness of the gate insulating film is 15 nm.

FIG. 28B shows the calculation result under the condition that the thickness of the gate insulating film is 10 nm.

FIG. 28C shows the calculation result under the condition that the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 26A to 26C, approximately 60 cm²/Vs in FIGS. 27A to 27C, and 40 cm²/Vs in FIGS. 28A to 28C; thus, the peak of the mobility μ is decreased as the offset length $L_{off}$ is increased.

Further, the same applies to the off-state current.

The on-state current is also decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V.

This embodiment can be implemented in appropriate combination with any of the above embodiments.

Embodiment 10

A transistor including an oxide semiconductor containing In, Sn, and Zn can have favorable characteristics by deposition of the oxide semiconductor while heating a substrate or by heat treatment after deposition of an oxide semiconductor film.

Note that each of In, Sn, and Zn is preferably included in a composition at 5 atomic % or more.

By intentionally heating the substrate after the deposition of the oxide semiconductor film containing In, Sn, and Zn, the field-effect mobility of the transistor can be improved.

Further, the threshold voltage of an n-channel transistor can be shifted in the positive direction.

The threshold voltage of the n-channel transistor is shifted in the positive direction, so that the absolute value of a voltage for maintaining the off state of the n-channel transistor can be reduced; thus, low power consumption can be achieved.

In addition, when the threshold voltage of the n-channel transistor is shifted in the positive direction to 0 V or more, a normally-off transistor can be obtained.

The characteristics of a transistor including an oxide semiconductor containing In, Sn, and Zn will be described below.

(Common Conditions of Sample A to Sample C)

An oxide semiconductor layer was formed over a substrate to have a thickness of 15 nm under the following conditions: a target having a composition ratio of In:Sn:Zn=1:1:1 is used; the gas flow rate is $Ar/O_2$=6/9 sccm; the deposition pressure is 0.4 Pa; and the deposition power is 100 W.

Next, the oxide semiconductor layer was etched in an island shape.

Then, a tungsten layer was deposited over the oxide semiconductor layer to have a thickness of 50 nm. The tungsten layer was etched, so that a source electrode and a drain electrode were formed.

After that, a silicon oxynitride (SiON) film was formed as a gate insulating film to have a thickness of 100 nm by plasma CVD using a silane ($SiH_4$) gas and dinitrogen monoxide ($N_2O$) gas.

Then, a gate electrode was formed in the following manner: a tantalum nitride layer was formed to have a thickness of 15 nm; a tungsten layer was formed to have a thickness of 135 nm; and these were etched.

After that, a silicon oxynitride (SiON) film with a thickness of 300 nm and a polyimide film with a thickness of 1.5 µm were formed as an interlayer insulating film by plasma CVD.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

In this manner, a semiconductor device including a transistor was formed.

(Sample A)

In Sample A, heating was not intentionally performed to the substrate during the deposition of the oxide semiconductor layer.

Further in Sample A, heat treatment was not performed in a period after the oxide semiconductor layer was deposited before the oxide semiconductor layer was etched.

(Sample B)

In Sample B, the oxide semiconductor layer was deposited while the substrate was heated at 200° C.

Further in Sample B, heat treatment was not performed in a period after the oxide semiconductor layer was deposited before the oxide semiconductor layer was etched.

The oxide semiconductor layer was deposited while the substrate was heated in order to remove hydrogen serving as a donor in the oxide semiconductor layer.

(Sample C)

In Sample C, the oxide semiconductor layer was deposited while the substrate was heated at 200° C.

Further in Sample C, heat treatment in a nitrogen atmosphere was performed at 650° C. for one hour and then heat treatment in an oxygen atmosphere was performed at 650° C. for one hour after the oxide semiconductor layer was deposited before the oxide semiconductor layer was etched.

The heat treatment was performed in a nitrogen atmosphere at 650° C. for one hour in order to remove hydrogen serving as a donor in the oxide semiconductor layer.

With the heat treatment for removing hydrogen serving as a donor in the oxide semiconductor layer, oxygen is also removed to form oxygen vacancy serving as a carrier in the oxide semiconductor layer.

Thus, the heat treatment in an oxygen atmosphere at 650° C. for one hour was performed for reduction in oxygen vacancy.

(Characteristics of Transistors in Sample A to Sample C)

Figure 29A:
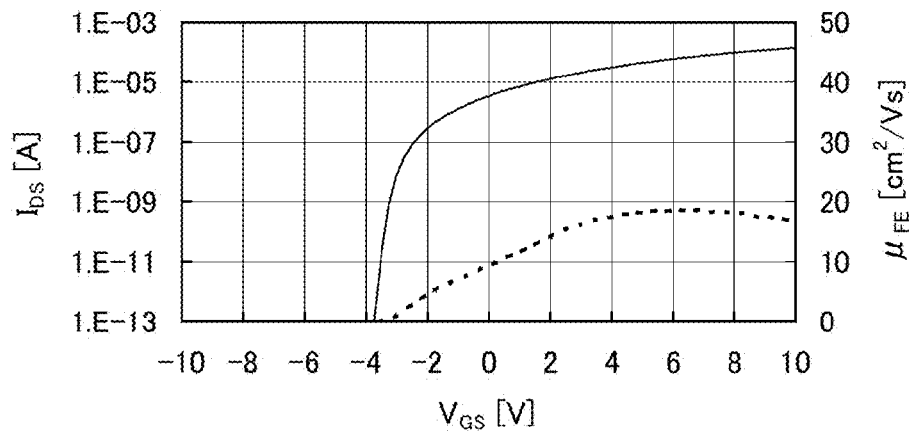
FIGS. 29A to 29C each show the characteristics of a transistor.

FIG. 29A shows initial characteristics of a transistor in Sample A.

Figure 29B:
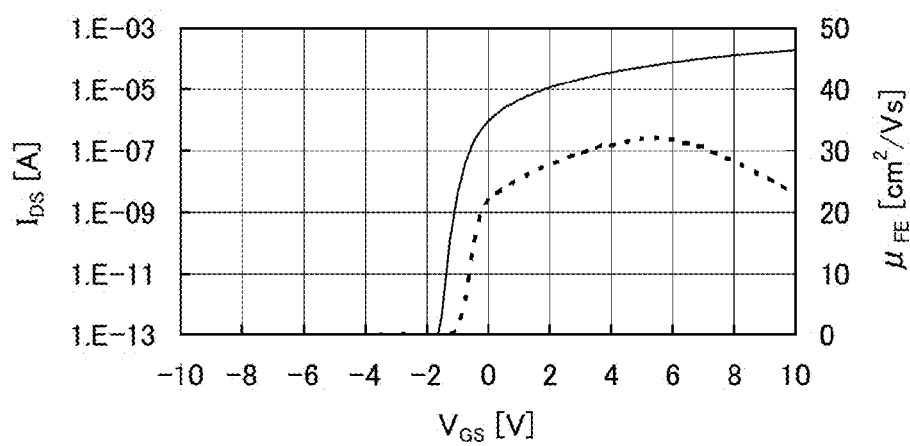

FIG. 29B shows initial characteristics of a transistor in Sample B.

Figure 29C:
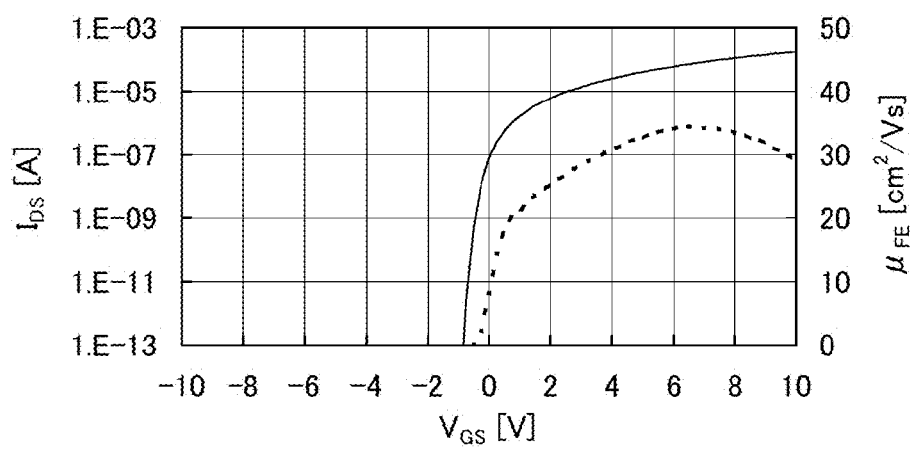

FIG. 29C shows initial characteristics of a transistor in Sample C.

The field-effect mobility of the transistor in Sample A was 18.8 $cm^2$/Vsec.

The field-effect mobility of the transistor in Sample B was 32.2 $cm^2$/Vsec.

The field-effect mobility of the transistor in Sample C was 34.5 $cm^2$/Vsec.

According to observations of cross sections of oxide semiconductor layers, which were formed by deposition methods similar to respective those of Sample A to Sample C, with a transmission electron microscope (TEM), crystallinity was observed in samples formed by the deposition methods similar to respective those of Sample B and Sample C whose substrates have been heated during deposition.

Surprisingly, the sample whose substrate has been heated during deposition, had a non-crystalline portion and a crystalline portion was aligned in the c-axis direction.

In a normal polycrystal, the crystalline portion is not aligned. Therefore, the sample whose substrate has been heated during deposition, has a novel crystal structure.

Comparison of FIG. 29A to FIG. 29C leads to understanding that heat treatment performed to the substrate during or after deposition can remove an hydrogen element serving as a donor, so that the threshold voltage of the n-channel transistor can be shifted in the positive direction.

That is, the threshold voltage of Sample B in which heating was performed to the substrate during deposition is shifted in the positive direction more than the threshold voltage of Sample A in which heating was not performed to the substrate during deposition.

In addition, comparing Sample B and Sample C, substrates of which were heated during deposition, it is found that the threshold voltage of Sample C in which heat treatment was performed after deposition is shifted in the positive direction more than the threshold voltage of Sample B in which heat treatment was not performed after deposition.

Furthermore, the higher the temperature of heat treatment is, the more the light element such as a hydrogen element tends to be removed; thus, hydrogen is more likely to be removed as the temperature of heat treatment is higher.

It was therefore found that the threshold voltage can be shifted more in the positive direction by further increasing of the temperature of heat treatment.

(Results of the Gate BT Stress Test of Sample B and Sample C)

The gate BT stress test was performed on Sample B (without heat treatment after deposition) and Sample C (with heat treatment after deposition).

First, $V_{gs}$-$I_{ds}$ characteristics of the transistors were measured at a substrate temperature of 25° C. and $V_{ds}$ of 10 V to measure characteristics of the transistors before heat treatment and high positive voltage application.

Then, the substrate temperature was set to 150° C. and $V_{ds}$ was set to 0.1 V.

After that, 20 V of $V_{gs}$ was applied to the gate insulating film and the condition was kept for one hour.

Next, $V_{gs}$ was set to 0 V.

Then, $V_{gs}$-$I_{ds}$ characteristics of the transistors were measured at a substrate temperature of 25° C. and $V_{ds}$ of 10 V to measure characteristics of the transistors after heat treatment and high positive voltage application.

Comparing characteristics of transistors before and after heat treatment and high positive voltage application in the above manner is called a positive BT test.

In a similar manner, $V_{gs}$-$I_{ds}$ characteristics of the transistors were measured at a substrate temperature of 25° C. and $V_{ds}$ of 10 V to measure characteristics of the transistors before heat treatment and high negative voltage application.

Then, the substrate temperature was set to 150° C. and $V_{ds}$ was set to 0.1 V.

After that, −20 V of $V_{gs}$ was applied to the gate insulating film and the condition was kept for one hour.

Next, $V_{gs}$ was set to 0 V.

Then, $V_{gs}$-$I_{ds}$ characteristics of the transistors were measured at a substrate temperature of 25° C. and $V_{ds}$ of 10 V to measure characteristics of the transistors after heat treatment and high negative voltage application.

Comparing characteristics of transistors before and after heat treatment and high negative voltage application in the above manner is called a negative BT test.

Figure 30A:
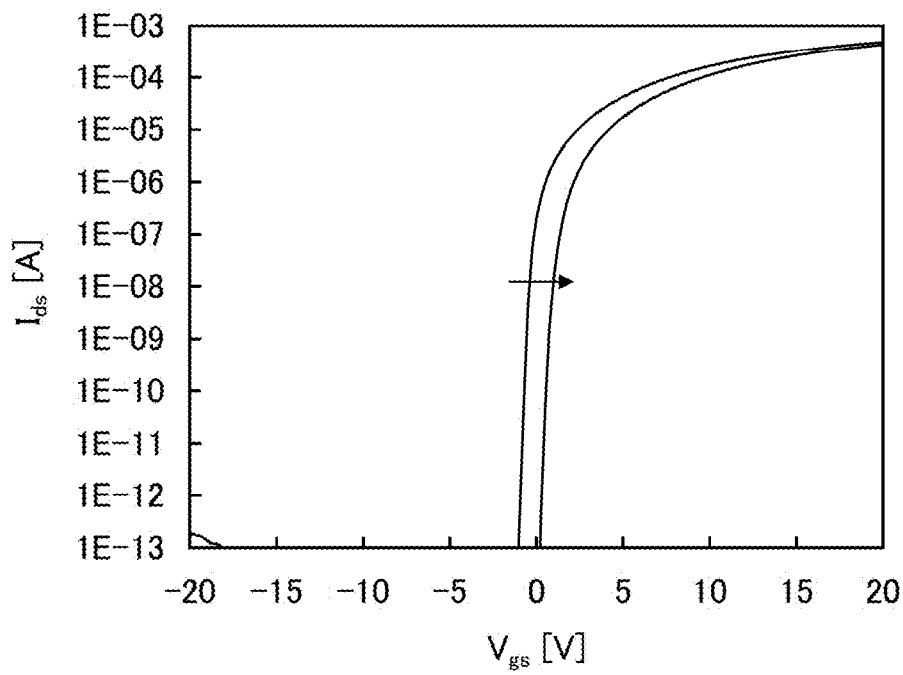
FIGS. 30A and 30B each show the characteristics of a transistor.
Figure 30B:
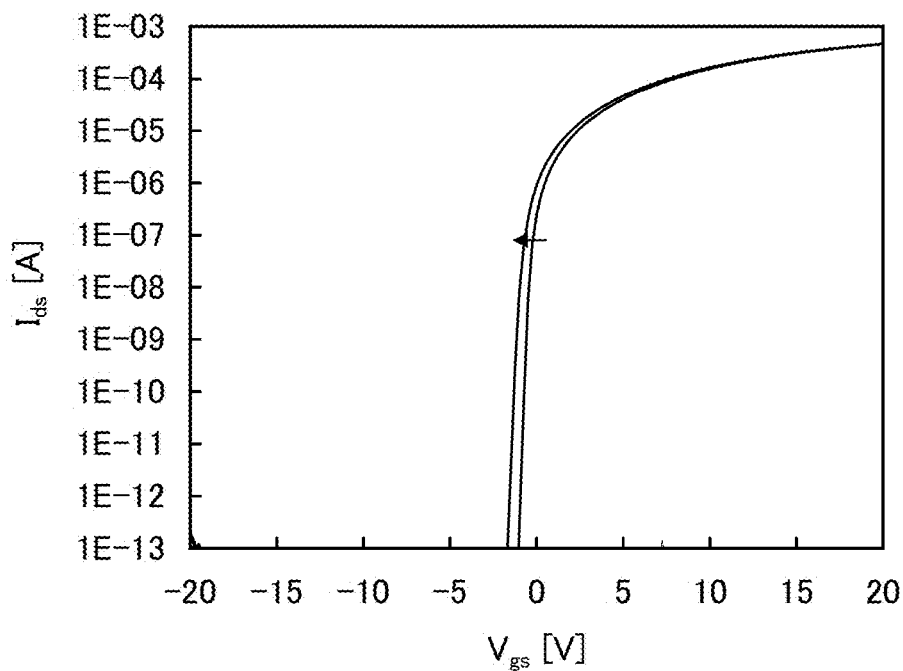

FIG. 30A shows a result of the positive BT test of Sample B and FIG. 30B shows a result of the negative BT test of Sample B.

Figure 31A:
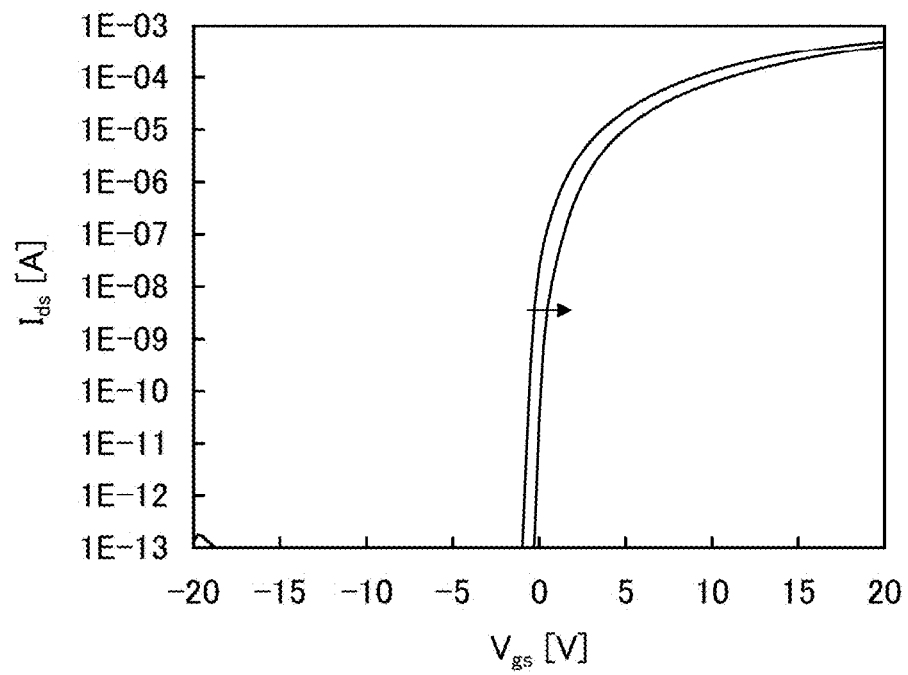
FIGS. 31A and 31B each show the characteristics of a transistor.
Figure 31B:
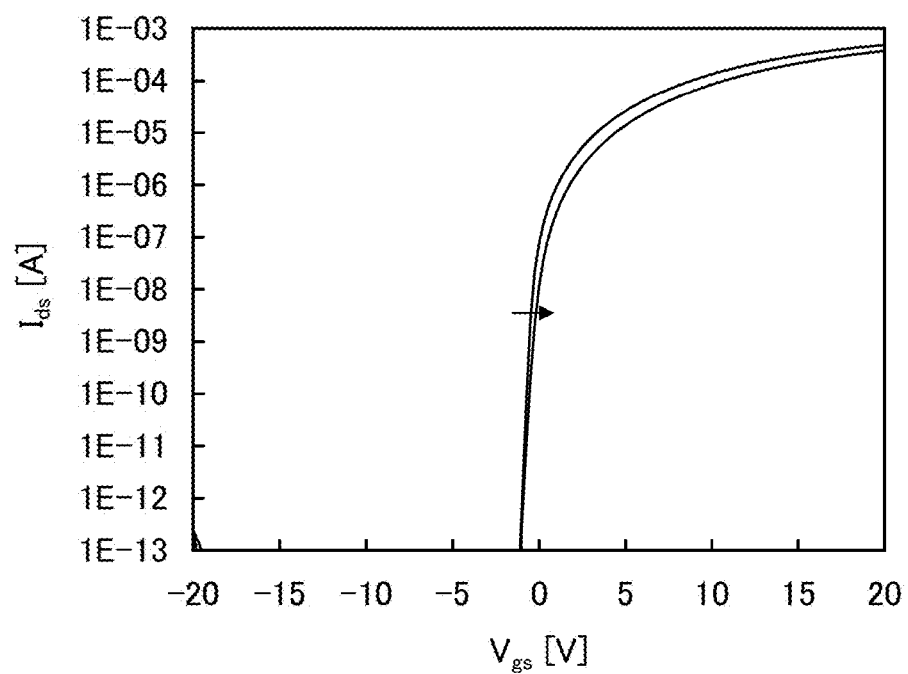

FIG. 31A shows a result of the positive BT test of Sample C and FIG. 31B shows a result of the negative BT test of Sample C.

Although the positive BT test and the negative BT test are tests used to determine the deterioration level of a transistor, with reference to FIG. 30A and FIG. 31A, it is found that the threshold voltage can be shifted in the positive direction by performing at least the positive BT test.

In FIG. 30A, in particular, it is found that a transistor becomes a normally-off transistor by being subjected to the positive BT test.

Therefore, it is revealed that the shift of the threshold voltage in the positive direction can be increased and a normally-off transistor can be formed by performing the positive BT test in addition to the heat treatment at the time of manufacturing the transistor.

Figure 32:
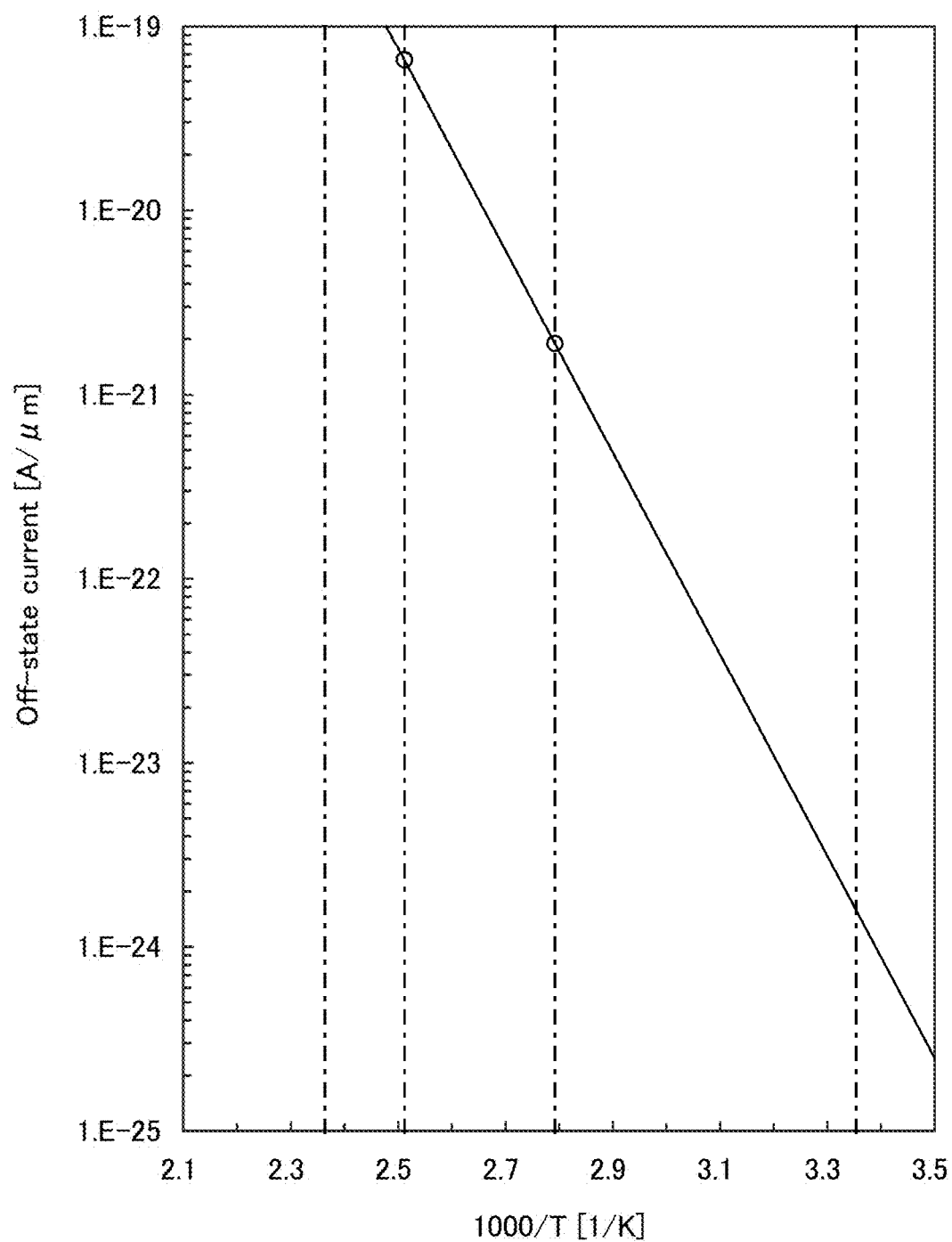
FIG. 32 shows the temperature dependency of off-state current of a transistor.

FIG. 32 shows a relation between the off-state current of a transistor in Sample A and the inverse of substrate temperature (absolute temperature) at measurement.

Here, the abscissa represents a value (1000/T) obtained by multiplying an inverse of substrate temperature at measurement by 1000.

Note that FIG. 32 illustrates the amount of current in the case where the channel width is 1 pan.

The off-state current was lower than or equal to $1 \times 10^{-19}$ A when the substrate temperature was 125° C. (1000/T is about 2.51).

Further, the off-state current was lower than or equal to $1 \times 10^{-20}$ A when the substrate temperature was 85° C. (1000/T is about 2.79).

That is, it is found that the off-state current is extremely low compared to a transistor including a silicon semiconductor.

Note that as the temperature is lower, the off-state current is decreased; thus, it is clear that the off-state current at room temperature is further lower.

This embodiment can be implemented in appropriate combination with any of the above embodiments.
(Embodiment 11)

This embodiment describes one embodiment of a structure of a memory circuit.

Figure 17:
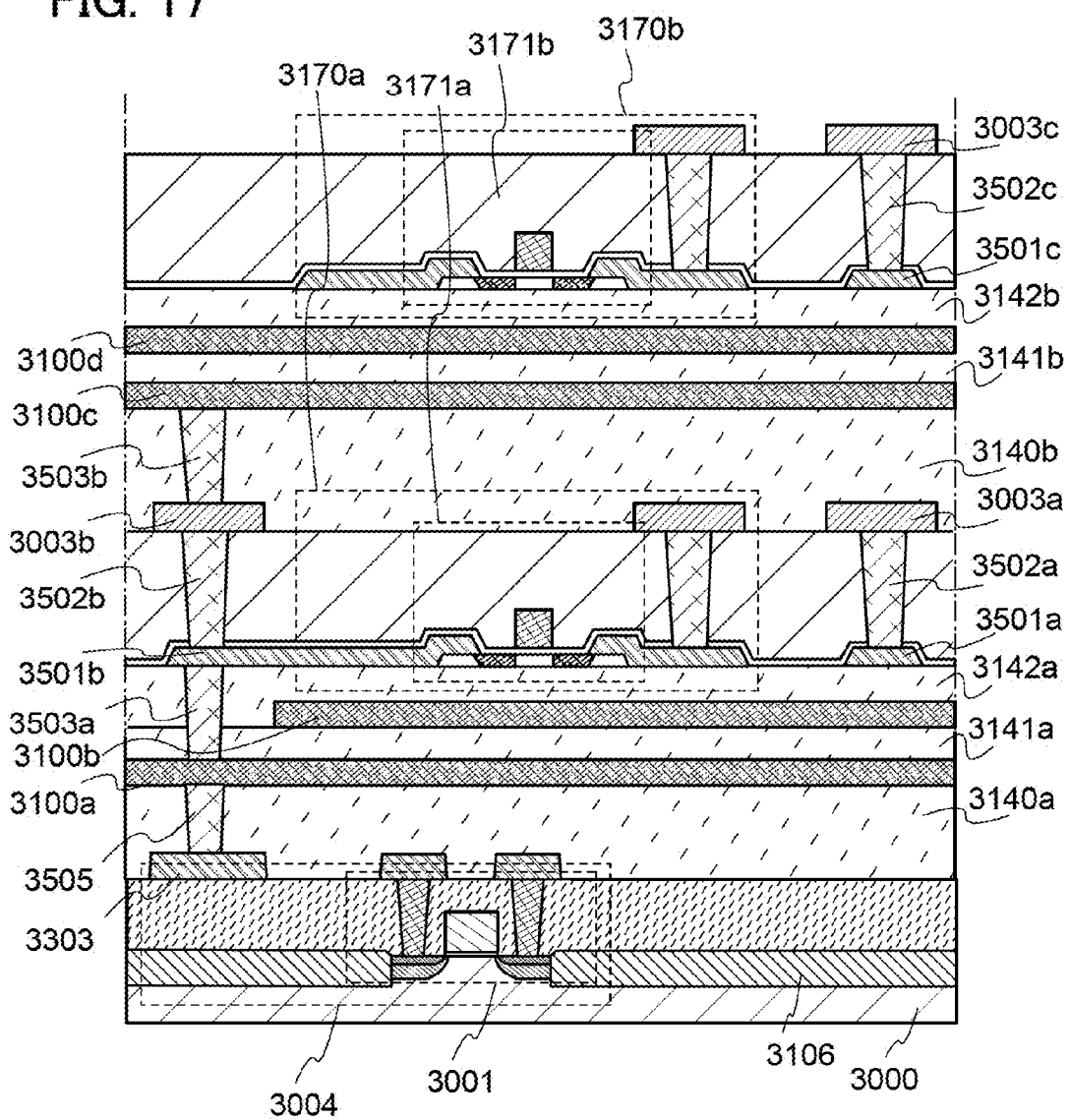
FIG. 17 is a cross-sectional view of the memory circuit.
Figure 18:
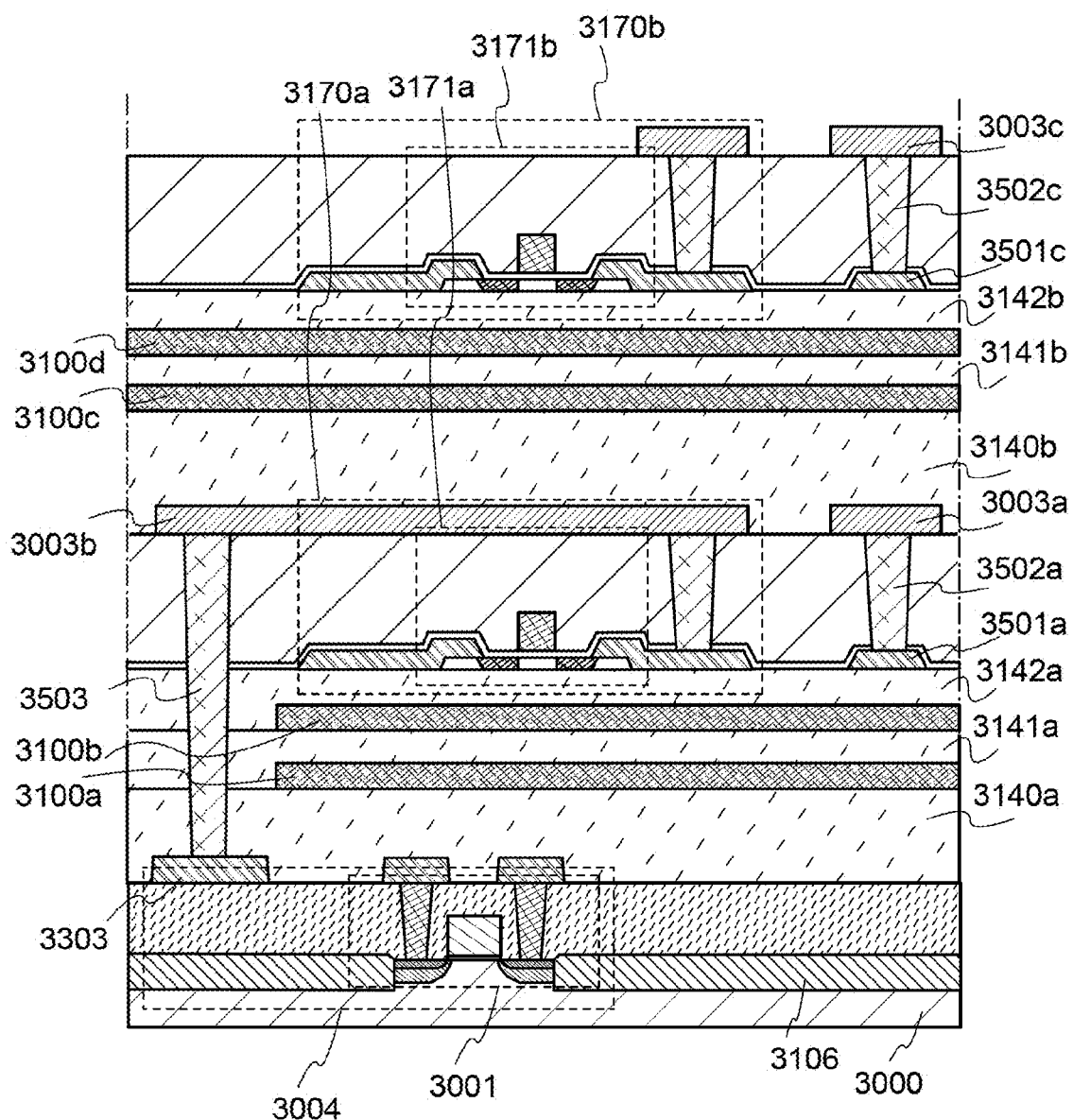
FIG. 18 is a cross-sectional view of the memory circuit.

FIG. 17 and FIG. 18 are each a cross-sectional view of a memory circuit. In each of the memory circuits illustrated in FIG. 17 and FIG. 18, a plurality of memory elements in a plurality of layers are formed in the upper portion, and a logic circuit 3004 is formed in the lower portion. As examples of the plurality of memory elements, a memory element 3170a and a memory element 3170b are illustrated. The memory element 3170a and the memory element 3170b can have the same configuration as, for example, that of the volatile memory section 101 or the nonvolatile memory section 102 in the above embodiments.

Note that a transistor 3171a in the memory element 3170a is illustrated as a representative. A transistor 3171b in the memory element 3170b is illustrated as a representative. The transistor 3171a and the transistor 3171b have a channel formation region in an oxide semiconductor layer. These transistors whose channel formation region is formed in an oxide semiconductor layer have the same structure as those of the transistors whose channel formation region is formed in an oxide semiconductor layer according to the above embodiments; thus, their description will not be repeated.

An electrode 3501a which is formed in the same layer as a source electrode and a drain electrode of the transistor 3171a is electrically connected to an electrode 3003a through an electrode 3502a. An electrode 3501c which is formed in the same layer as a source electrode and a drain electrode of the transistor 3171b is electrically connected to an electrode 3003c through an electrode 3502c.

The logic circuit 3004 includes a transistor 3001 in which a semiconductor material other than an oxide semiconductor is used as a channel formation region. The transistor 3001 can be obtained in such a manner that an element isolation insulating film 3106 is provided over a substrate 3000 including a semiconductor material (e.g., silicon) and a region which is to be a channel formation region is formed in a region surrounded by the element isolation insulating film 3106. Note that the transistor 3001 may be a transistor in which a channel formation region is formed in a semiconductor film such as a silicon film formed on an insulating surface or a silicon film in an SOI substrate. A known structure can be employed for the structure of the transistor 3001; thus, the description thereof is omitted here.

A wiring 3100a and a wiring 3100b are formed between layers in which the transistor 3171a is formed and layers in which the transistor 3001 is formed. An insulating film 3140a is provided between the wiring 3100a and the layers in which the transistor 3001 is formed, an insulating film 3141a is provided between the wiring 3100a and the wiring 3100b, and an insulating film 3142a is provided between the wiring 3100b and the layers in which the transistor 3171a is formed.

Similarly, a wiring 3100c and a wiring 3100d are formed between the layers in which the transistor 3171b is formed and the layers in which the transistor 3171a is formed. An insulating film 3140b is provided between the wiring 3100c and the layers in which the transistor 3171a is formed, an insulating film 3141b is provided between the wiring 3100c and the wiring 3100d, and an insulating film 3142b is provided between the wiring 3100d and the layers in which the transistor 3171b is formed.

The insulating film 3140a, the insulating film 3141a, the insulating film 3142a, the insulating film 3140b, the insulating film 3141b, and the insulating film 3142b function as interlayer insulating films, and their surfaces are planarized.

Through the wiring 3100a, the wiring 3100b, the wiring 3100c, and the wiring 3100d, electrical connection between the memory elements, electrical connection between the logic circuit 3004 and the memory element, and the like can be established.

An electrode 3303 included in the logic circuit 3004 can be electrically connected to a circuit provided in the upper portion.

For example, as illustrated in FIG. 17, the electrode 3303 can be electrically connected to the wiring 3100a through an electrode 3505. The wiring 3100a can be electrically connected to an electrode 3501b through an electrode 3503a. In this manner, the wiring 3100a and the electrode 3303 can be electrically connected to the source or the drain of the transistor 3171a. The electrode 3501b can be electrically connected to an electrode 3003b through an electrode 3502b. The electrode 3003b can be electrically connected to the wiring 3100c through an electrode 3503b.

FIG. 17 illustrates an example in which the electrode 3303 and the transistor 3171a are electrically connected to each other through the wiring 3100a; however, there is no limitation thereto. The electrode 3303 and the transistor 3171a may be electrically connected to each other through the wiring 3100b, or may be electrically connected to each other through both the wiring 3100a and the wiring 3100b. Further, as illustrated in FIG. 18, the electrode 3303 and the transistor 3171a may be electrically connected to each other through neither the wiring 3100a nor the wiring 3100b. In FIG. 18, the electrode 3303 is electrically connected to the electrode 3003b through an electrode 3503. The electrode 3003b is electrically connected to the source or the drain of the transistor 3171a. In this manner, electrical connection between the electrode 3303 and the transistor 3171a can be established.

Note that FIG. 17 and FIG. 18 illustrate an example in which the two memory elements (the memory element 3170a and the memory element 3170b) are stacked; however, the number of stacked memory elements is not limited to two.

FIG. 17 and FIG. 18 illustrate an example where two wiring layers, i.e., a wiring layer in which the wiring 3100a is formed and a wiring layer in which the wiring 3100b is formed are provided between the layers in which the transistor 3171a is formed and the layers in which the transistor 3001 is formed; however, the structure is not limited thereto. One wiring layer may be provided or three or more wiring layers may be provided between the layers in which the transistor 3171a is formed and the layers in which the transistor 3001 is formed.

FIG. 17 and FIG. 18 illustrate an example where two wiring layers, i.e., a wiring layer in which the wiring 3100c is formed and a wiring layer in which the wiring 3100d is formed are provided between the layers in which the transistor 3171b is formed and the layers in which the transistor 3171a is formed; however, the structure is not limited thereto. One wiring layer may be provided or three or more wiring layers may be provided between the layers in which the transistor 3171b is formed and the layers in which the transistor 3171a is formed.

This embodiment can be implemented in appropriate combination with any of the above embodiments.

EXAMPLE 1

With the use of a signal processing unit according to one embodiment of the present invention, an electronic device with low power consumption can be provided. In particular, in the case of a portable electronic device which has difficulty in continuously receiving power, when a signal processing unit with low power consumption according to one embodiment of the present invention is added as a component of the device, an advantage in increasing the continuous operation time can be obtained. Further, by the use of a transistor with low off-state current, redundant circuit design which is needed to cover a failure caused by large off-state current is unnecessary; therefore, the integration degree of the signal processing unit can be increased, and a signal processing unit having higher functionality can be formed.

The signal processing unit according to one embodiment of the present invention can be used for display devices, personal computers, or image reproducing devices provided with recording media (typically, devices which reproduce the content of recording media such as digital versatile discs (DVDs) and have displays for displaying the reproduced images). In addition, as an electronic device which can employ the signal processing unit according to one embodiment of the present invention, mobile phones, portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case where a signal processing unit according to one embodiment of the present invention is applied to electronic devices such as a mobile phone, a smartphone, and an e-book reader will be described.

Figure 19:
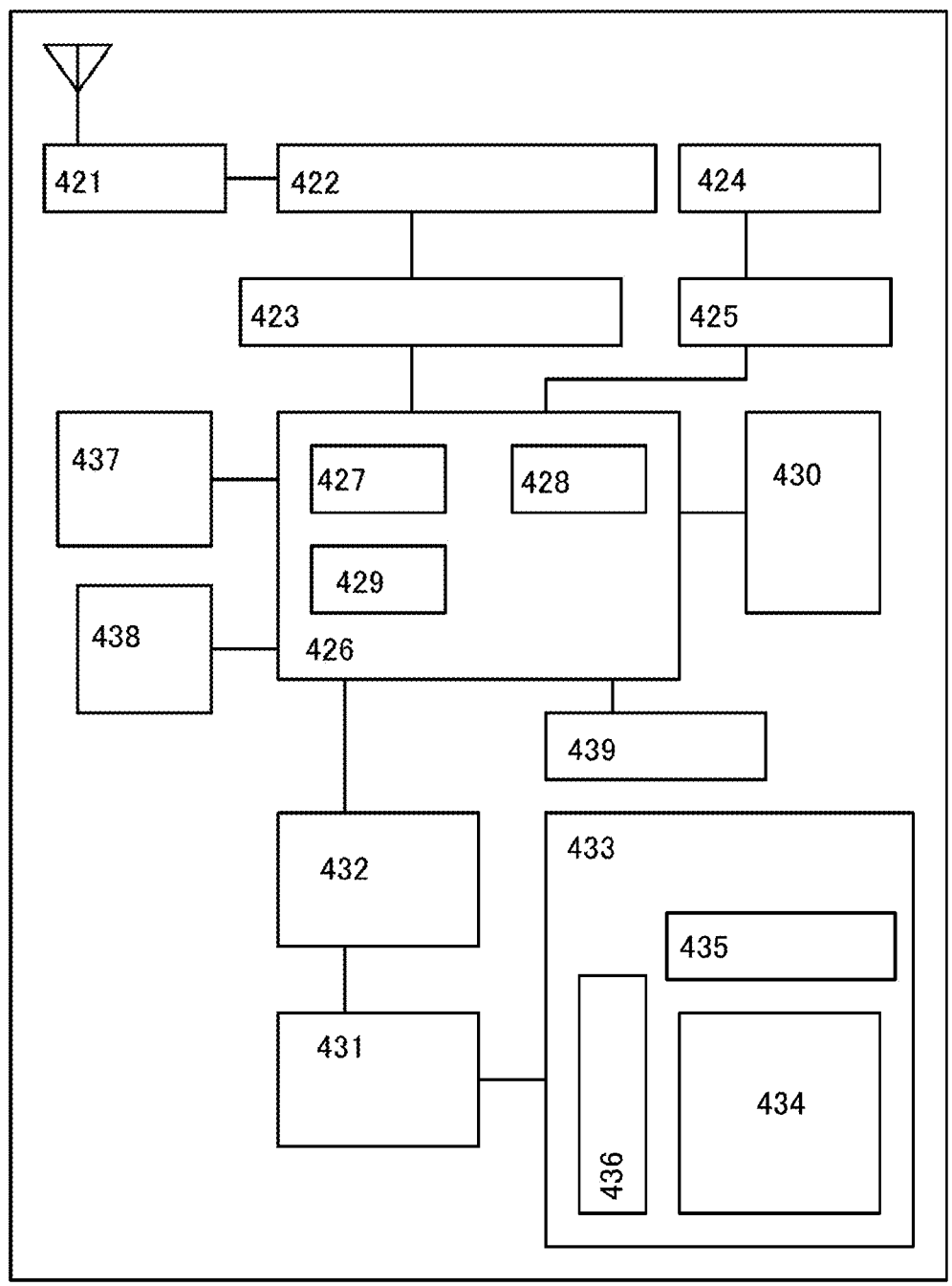
FIG. 19 is a block diagram of a portable electronic device.

FIG. 19 is a block diagram of a portable electronic device. The portable electronic device illustrated in FIG. 19 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. By using the signal processing unit according to the above embodiments in the CPU 427, power consumption can be reduced. An SRAM or a DRM is generally used in the memory circuit 432; however, the memory circuit according to the above embodiments is used in the memory circuit 432, so that power consumption can be reduced.

Figure 20:
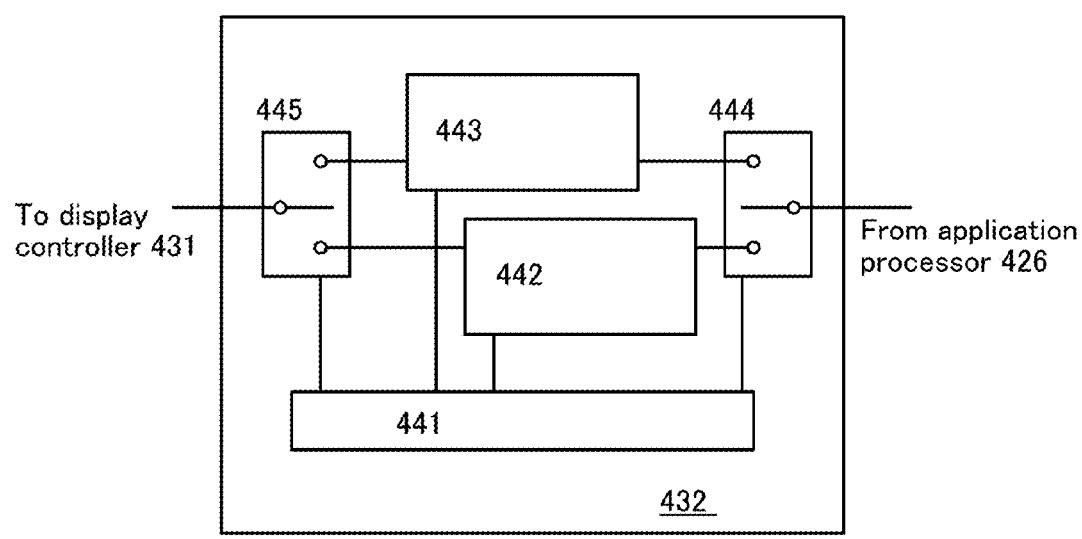
FIG. 20 is a block diagram of a memory circuit.

FIG. 20 is a block diagram illustrating the configuration of the memory circuit 432. The memory circuit 432 includes a memory circuit 442, a memory circuit 443, a switch 444, a switch 445, and a memory controller 441.

First, image data is received by the portable electronic device or is formed by the application processor 426. This image data is stored in the memory circuit 442 through the switch 445. Then, image data output through the switch 444 is sent to the display 433 through the display controller 431. The display 433 displays an image using the image data.

If a displayed image is not changed as in the case of a still image, image data read from the memory circuit 442 continues to be sent to the display controller 431 through the switch 445 at a frequency of approximately 30 Hz to 60 Hz in general. When operation for rewriting an image displayed on a screen is performed by a user, new image data is formed by the application processor 426 and is stored in the memory circuit 443 through the switch 444. While storing of this new image data in the memory circuit 443 is performed, image data is periodically read from the memory circuit 442 through the switch 445.

When the storing of new image data in the memory circuit 443 is completed, from the following frame period, the new image data stored in the memory circuit 443 is read and sent to the display 433 through the switch 445 and the display controller 431. The display 433 displays an image using the sent new image data.

Reading of this image data continues until the following new data is stored in the memory circuit 442. In this manner, writing and reading of image data are performed to/from the memory circuit 442 and the memory circuit 443 alternately, and an image is displayed by the display 433.

The memory circuit 442 and the memory circuit 443 are not necessarily different memory circuits; a memory region included in one memory circuit may be divided to be used by the memory circuit 442 and the memory circuit 443. The memory circuit according to the above embodiments is employed for these memory circuits, so that power consumption can be reduced.

Figure 21:
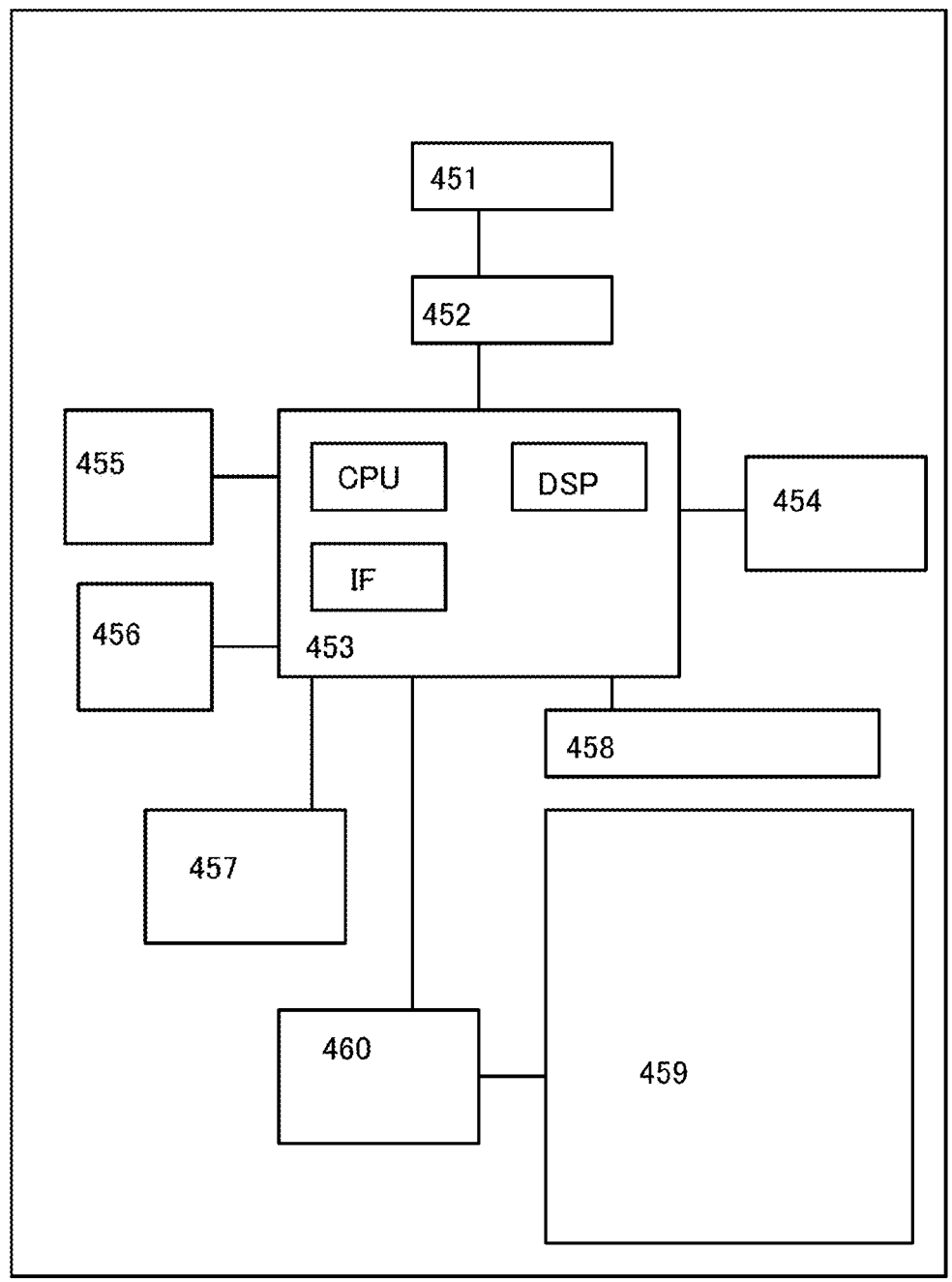
FIG. 21 is a block diagram of an e-book reader.

FIG. 21 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The signal processing unit according to the above embodiments is employed for the microprocessor 453, so that power consumption can be reduced. Further, the memory circuit according to the above embodiments is employed for the memory circuit 457, so that power consumption can be reduced.

For example, in the case where a user uses a highlighting function of changing a display color, drawing an underline, using a bold font, changing the type of letter, or the like in a specific portion in e-book data so that the specific portion is in clear contrast to the other portions, e-book data of the portion specified by the user in the e-book data needs to be stored. The memory circuit 457 has a function of storing such e-book data temporarily. Note that in the case where such e-book data is held for a long time, it may be copied to the flash memory 454.

This example can be implemented in appropriate combination with any of the above embodiments.

This application is based on Japanese Patent Application serial No. 2011-015595 filed with Japan Patent Office on Jan. 27, 2011, and Japanese Patent Application serial No. 2011-108902 filed with Japan Patent Office on May 14, 2011, the entire contents of which are hereby incorporated by reference.

What is claimed is:

1. A semiconductor device comprising:
a first memory section;
a second memory section; and
a selector circuit capable of selecting a first signal or a second signal and output the selected signal to the first memory section, wherein the second signal is a signal output from the second memory section;
wherein the second memory section comprises:
a booster circuit comprising a first transistor that comprises an oxide semiconductor layer comprising a channel formation region, and
wherein the second memory section is capable of holding a signal output from the first memory section in a node where one of a source and a drain of the first transistor is connected, when an operation of the first memory section is stopped.

2. The semiconductor device according to claim 1, further comprising:
a second transistor whose gate is electrically connected to the node.

3. The semiconductor device according to claim 2, wherein the first transistor is stacked over the second transistor with an insulating layer interposed therebetween.

4. The semiconductor device according to claim 1, further comprising:
a capacitor electrically connected to the node.

5. The semiconductor device according to claim 1, wherein the booster circuit is capable of increasing voltage to be applied to a gate of the first transistor.

6. A semiconductor device comprising:
a first memory section; and
a second memory section;
wherein the second memory section comprises:
a booster circuit comprising a first transistor that comprises an oxide semiconductor layer comprising a channel formation region,
wherein the second memory section is capable of holding a signal output from the first memory section in a node where one of a source and a drain of the first transistor is connected, when an operation of the first memory section is stopped, and
wherein the oxide semiconductor layer comprises a crystalline portion in which c-axes are aligned in a direction substantially perpendicular to a surface of the oxide semiconductor layer, the crystalline portion being a non-single-crystal.

7. The semiconductor device according to claim 6, further comprising:
a second transistor whose gate is electrically connected to the node.

8. The semiconductor device according to claim 6, further comprising:
a capacitor electrically connected to the node.

9. The semiconductor device according to claim 6, wherein the booster circuit is capable of increasing voltage to be applied to a gate of the first transistor.

10. The semiconductor device according to claim 6, further comprising:
a selector circuit capable of selecting a first signal or a second signal and output the selected signal to the first memory section, wherein the second signal is a signal output from the second memory section.

11. The semiconductor device according to claim 7, wherein the first transistor is stacked over the second transistor with an insulating layer interposed therebetween.

12. A semiconductor device comprising:
a first memory section;
a second memory section; and
a selector circuit capable of selecting a first signal or a second signal and output the selected signal to the first memory section, wherein the second signal is a signal output from the second memory section;
wherein the second memory section comprises:
a booster circuit comprising a first transistor that comprises an oxide semiconductor layer comprising a channel formation region, and
wherein the second memory section is capable of holding a signal output from the first memory section in a node where one of a source and a drain of the first transistor is connected, when an operation of the first memory section is stopped, and
wherein the oxide semiconductor layer has crystallinity.

13. The semiconductor device according to claim 12, further comprising:
a second transistor whose gate is electrically connected to the node.

14. The semiconductor device according to claim 13, wherein the first transistor is stacked over the second transistor with an insulating layer interposed therebetween.

15. The semiconductor device according to claim 12, further comprising:
a capacitor electrically connected to the node.

16. The semiconductor device according to claim 12, wherein the booster circuit is capable of increasing voltage to be applied to a gate of the first transistor.

* * * * *

UNITED STATES PATENT AND TRADEMARK OFFICE
CERTIFICATE OF CORRECTION

PATENT NO. : 9,202,567 B2
APPLICATION NO. : 14/318841
DATED : December 1, 2015
INVENTOR(S) : Takuro Ohmaru It is certified that error appears in the above-identified patent and that said Letters Patent is hereby corrected as shown below:

Specification

Column 1, Line 18; after "off" insert --.--.

Column 9, Line 46; replace "In:Zn:O==X:Y:Z." with --In:Zn:O = X:Y:Z.--.

Column 12, Line 52; after "off" insert --.--.

Column 19, Line 9; replace "hathium" with --hafnium--.

Column 19, Line 11; replace "hathium" with --hafnium--.

Column 19, Line 12; replace "hathium" with --hafnium--.

Column 40, Line 57; replace "0)" with --O--.

Column 41, Line 15; after "half" insert --.--.

Column 44, Line 10; replace "☐" with --☐--.

Column 45, Line 53; replace "(u" with --(µ--.

Column 49, line 48; replace "pan" with --µm--.

Signed and Sealed this
Twelfth Day of April, 2016

Michelle K. Lee
*Director of the United States Patent and Trademark Office*